US012166019B2

(12) United States Patent
Iwakawa et al.

(10) Patent No.: US 12,166,019 B2
(45) Date of Patent: Dec. 10, 2024

(54) SELF LIGHT EMITTING APPARATUS, LIQUID CRYSTAL DISPLAY APPARATUS, AND MANUFACTURING METHOD FOR SELF LIGHT EMITTING APPARATUS

(71) Applicant: Mitsubishi Electric Corporation, Tokyo (JP)

(72) Inventors: Manabu Iwakawa, Tokyo (JP); Kazumasa Katayama, Tokyo (JP); Hidetada Tokioka, Tokyo (JP); Takanori Okumura, Tokyo (JP); Masami Hayashi, Tokyo (JP); Shinsaku Yamaguchi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 177 days.

(21) Appl. No.: 18/009,746

(22) PCT Filed: Jun. 23, 2020

(86) PCT No.: PCT/JP2020/024575
§ 371 (c)(1),
(2) Date: Dec. 12, 2022

(87) PCT Pub. No.: WO2021/260787
PCT Pub. Date: Dec. 30, 2021

(65) Prior Publication Data
US 2023/0246005 A1 Aug. 3, 2023

(51) Int. Cl.
H01L 25/00 (2006.01)
G02F 1/13357 (2006.01)
H01L 25/075 (2006.01)

(52) U.S. Cl.
CPC .... *H01L 25/0753* (2013.01); *G02F 1/133603* (2013.01)

(58) Field of Classification Search
CPC .................. H01L 25/0753; G02F 1/133603
See application file for complete search history.

(56) References Cited

U.S. PATENT DOCUMENTS

2016/0050409 A1\* 2/2016 Park .................. H04N 13/383
348/54
2017/0307937 A1 10/2017 Matsuura
(Continued)

FOREIGN PATENT DOCUMENTS

| JP | 8-137413 A | 5/1996 |
| JP | 2002-82635 A | 3/2002 |

(Continued)

OTHER PUBLICATIONS

International Search Report and Written Opinion mailed on Sep. 24, 2020, received for PCT Application PCT/JP2020/024575, filed on Jun. 23, 2020, 12 pages including English Translation.
(Continued)

*Primary Examiner* — Gerald J Sufleta, II
(74) *Attorney, Agent, or Firm* — XSENSUS LLP

(57) ABSTRACT

The present disclosure has an object to hinder reduction of a yield due to a failure in an LED element or a mounting failure in a self light emitting apparatus. In a self light emitting apparatus, each pixel includes one basic cell and at least one redundant cell as a subpixel. The redundant cell includes an LED element that emits light of a color the same as at least one LED element out of LED elements included in the basic cell. A plurality of subpixels included in each pixel are configured as a subpixel group being an assembly that includes a plurality of LED elements being integrated. An array pitch of the subpixels in the subpixel group is smaller than an array pitch of the subpixels in adjacent ones of a plurality of subpixel groups.

18 Claims, 45 Drawing Sheets

(56) References Cited

U.S. PATENT DOCUMENTS

| | | | |
|---|---|---|---|
| 2018/0175268 A1 | 6/2018 | Moon et al. | |
| 2018/0211940 A1 | 7/2018 | Henry et al. | |
| 2019/0103516 A1 | 4/2019 | Moosburger et al. | |
| 2020/0091382 A1 | 3/2020 | Brick et al. | |
| 2021/0057483 A1* | 2/2021 | Ikeda | H01L 27/156 |
| 2022/0375906 A1* | 11/2022 | Kim | G09G 3/32 |
| 2022/0415977 A1* | 12/2022 | Lee | H01L 25/167 |
| 2023/0101630 A1* | 3/2023 | Jentzsch | H01S 5/4031 |
| | | | 372/50.124 |

FOREIGN PATENT DOCUMENTS

| | | |
|---|---|---|
| JP | 2010-139945 A | 6/2010 |
| JP | 2016-81906 A | 5/2016 |
| JP | 2017-524985 A | 8/2017 |
| JP | 2018-101785 A | 6/2018 |
| JP | 2018-197781 A | 12/2018 |
| JP | 2019-512878 A | 5/2019 |
| WO | 2016/016461 A1 | 2/2016 |

OTHER PUBLICATIONS

Biwa et al., "Technologies for the Crystal LED Display System", SID 2019 Digest, pp. 121-124.

Notice of Reasons for Refusal mailed on Mar. 2, 2021, received for JP Application 2020-567629, 15 pages including English Translation.

* cited by examiner

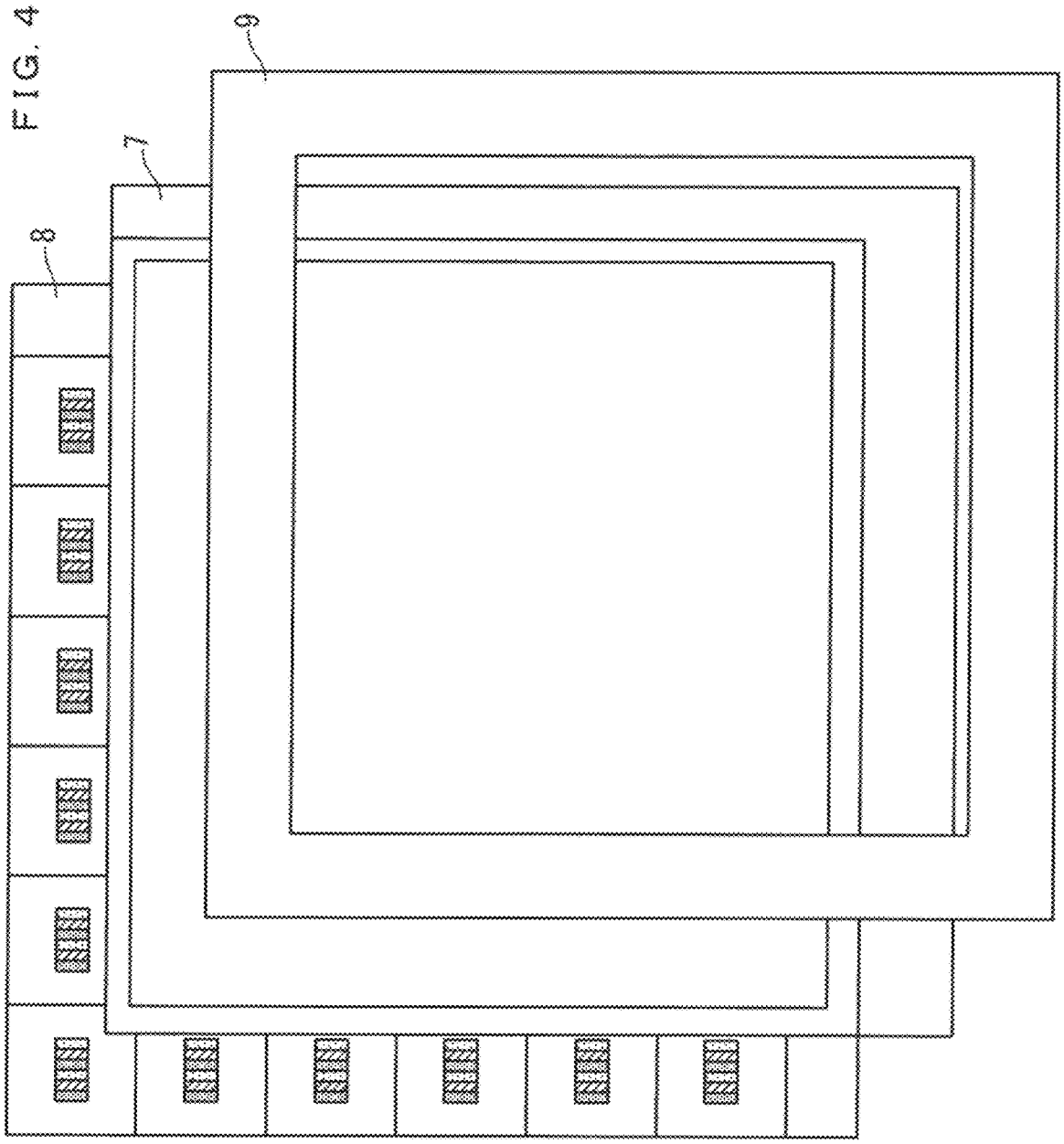

SELF LIGHT EMITTING APPARATUS, LIQUID CRYSTAL DISPLAY APPARATUS, AND MANUFACTURING METHOD FOR SELF LIGHT EMITTING APPARATUS

CROSS-REFERENCE TO RELATED APPLICATION

The present application is based on PCT filing PCT/JP2020/024575, filed Jun. 23, 2020, the entire contents of which are incorporated herein by reference.

TECHNICAL FIELD

The present disclosure relates to a self light emitting apparatus using a self light emitting element.

BACKGROUND ART

In recent years, display apparatuses including a thin and flat display panel employing the principle of liquid crystals, electroluminescence (EL), or the like have been widely used. A liquid crystal display apparatus (liquid crystal display (LCD)) representing such a display apparatus is thin and light, and is thus mounted in a conveyance such as an automobile and an aircraft, and is used as a speedometer, a display apparatus for a navigation system, or a display apparatus that displays, for occupants, entertainment videos recorded in a video medium such as a Digital Versatile Disc (DVD) or a Blu-ray Disc. Further, an LCD or an organic electroluminescent display (OLED) is also widely used for general purposes, such as a mobile terminal represented by a smartphone or a television.

In general, the LCD includes a liquid crystal panel, a backlight unit, a circuit that supplies various electric signals to the liquid crystal panel, a power supply, and a case. In the liquid crystal panel, liquid crystals are retained between a pair of substrates, which is obtained by attaching an array substrate including pixel electrodes and a color filter substrate including common electrodes to each other. The case houses the liquid crystal panel, the backlight unit, the circuit, and the power supply.

The OLED includes an OLED panel, a circuit that supplies various electric signals to the OLED panel, a power supply, and a case. In the OLED panel, an organic EL layer is held between a cathode and an anode, and this configuration is further held between glass sheets, plastic substrates, sealing films, or the like. The organic EL layer includes an electron injection layer, an electron transport layer, a light emitting layer, an electron hole transport layer, an electron hole injection layer, and the like. The case houses the OLED panel, the circuit, and the power supply.

In the LCD and the OLED, an active area being a region for displaying an image or a video and a non-active area being a frame region outside the active area are provided. In the active area, a plurality of pixels are provided, and thin film transistors serving as switching elements, pixel electrodes, wires, and the like are disposed as well. The pixels each include a plurality of subpixels for representing colors such as red, green, blue, yellow, and white. In the non-active area, a seal that seals liquid crystals between substrates, a seal that inhibits water from entering the organic EL layer, a leading wire connected to the thin film transistor and the like, a driver integrated circuit (IC), a terminal connected to an external drive circuit, and the like are disposed.

As described above, the LCD and the OLED display an image or a video using mostly similar configurations, but their general operation principles are different. The LCD displays an image or a video in the following manner: a voltage optionally controlled by the thin film transistor is applied between the pixel electrode and the common electrode to change a molecule alignment direction of liquid crystals, so as to control transmittance when light of the backlight passes through the liquid crystals. The OLED displays an image or a video in the following manner: a current optionally controlled by the thin film transistor is applied between the cathode and the anode to change luminance. The OLED employs the following principle: electrons injected through the cathode and electron holes injected through the anode are combined in the light emitting layer via the electron transport layer and the electron hole transport layer to excite light emitting materials of the light emitting layer, and light is emitted when the light emitting materials return back to the ground state from the excited state.

The LCD has a certain level of environmental worthiness and thus has been used for being mounted in a vehicle as well, but has problems in low video performance due to a low operation speed of liquid crystal molecules, and low contrast caused by a black display image being brightened by the backlight constantly turned on, for example.

The OLED has high display quality with its high contrast, but has problems in susceptibility to deterioration and hence a short life due to instability of organic materials as the OLED uses organic materials, unsuitability for high-luminance display, and low environmental worthiness for high temperatures, humidity, or the like, for example.

In view of this, in order to solve these problems of the LCD and the OLED, such displays (μLED displays) have been developed and made into products that a large number of micro light emitting diode (μ light emitting diode (LED)) chips, being minute self light emitting elements, are arrayed on a backplane, on which thin film transistors, wires, and the like are formed.

A study has been conducted to use the μLEDs as the backlight of the LCD. By arraying the μLEDs on a back surface of the LCD in a lattice manner and controlling a light emitting region and brightness of the μLEDs in accordance with a display image of the LCD, display quality of the LCD, which has a problem in its low contrast, is enhanced. In other words, by performing control so that the μLEDs of the backlight corresponding to a dark image part of the display image of the LCD are turned off or have low luminance, or conversely, so that the μLEDs of the backlight corresponding to a bright image part of the display image of the LCD have high luminance, high contrast can be achieved, and display quality is thus enhanced. Such a backlight is generally referred to as a local dimming backlight.

Non-Patent Document 1 describes a μLED display that achieves high contrast by setting μLED elements that reflect external light to minute sizes and thereby securing an area ratio of 99% or higher of a region where such μLEDs are not disposed and that does not reflect external light. The μLED display has a long enough life and environmental worthiness as the μLED display uses inorganic materials, and is expected to be a next-generation display apparatus to solve the problems of the LCD and the OLED.

In addition, Patent Document 1 discloses a technology of complementing a defective pixel by collecting a part of emitted light of neighboring pixels of the defective pixel with a light guide plate and causing the light to be emitted from a position of the light guide plate corresponding to the defective pixel.

PRIOR ART DOCUMENTS

Patent Documents
Patent Document 1: Japanese Patent Application Laid-Open No. 2018-197781
Non-Patent Documents
Non-Patent Document 1: Goshi Biwa, Masato Doi, Atushi Yasuda, Hisashi Kadota, "Technologies for the Crystal LED Display System", SID 2019 Digest, pp. 121-124, (2019).

SUMMARY

Problem to be Solved by the Invention

In order to achieve a self light emitting apparatus using the μLEDs, a large number of LED elements need to be arrayed. Accordingly, a high yield is required for the LED elements per se and mounting of the LED elements, which leads to an increase in manufacturing costs. For example, 24 million or more LED elements need to be arrayed for a self light emitting apparatus of 4 k resolution, and thus in order to achieve a μLED light emitting apparatus of 4 k resolution without pixel defects, a yield including the LED elements per se and mounting of the LED elements needs to exceed 99.999996%.

The technology according to the present disclosure is made in order to solve the problems described above, and has an object to provide a self light emitting apparatus that hinders reduction of a yield due to a failure in an LED element or a mounting failure.

Means to Solve the Problem

A self light emitting apparatus according to the present disclosure includes a backplane, and a plurality of target regions arrayed on the backplane. Each of the plurality of the target regions includes a cell including a self light emitting element being at least one in number. The cell includes a basic cell, and a redundant cell being at least one in number. The basic cell includes the self light emitting element being at least one in number. The redundant cell includes the self light emitting element that emits light of a color same as the self light emitting element being at least one in number out of the self light emitting element included in the basic cell. The basic cell and the redundant cell included in each of the plurality of the target regions or adjacent ones of the plurality of the target regions are configured as an assembly including a plurality of the self light emitting elements being integrated. An array pitch of the cell in the assembly is smaller than the army pitch between the cell of the assembly and the cell of an adjacent one of a plurality of the assemblies.

Effects of the Invention

Therefore, according to the self light emitting apparatus of the present disclosure, reduction of a yield due to a failure in an LED element is hindered. These and other objects, features, aspects and advantages of the present disclosure will become more apparent from the following detailed description of the present disclosure when taken in conjunction with the accompanying drawings.

BRIEF DESCRIPTION OF DRAWINGS

FIG. 45 is a schematic plan view illustrating a configuration of a liquid crystal display apparatus according to the fourth embodiment.

DESCRIPTION OF EMBODIMENTS

With reference to the drawings, a self light emitting apparatus according to each embodiment will be described below. Each of the drawings referred to in this specification is a schematic drawing for conceptually describing a function or a structure. Each embodiment described below is an example of a disclosed technology in this specification, and is not to limit the disclosed technology. Unless otherwise noted, a basic configuration of the self light emitting apparatus is common in all the embodiments. Further, the same or corresponding configurations among the embodiments are denoted by the same reference signs.

A. First Embodiment

<A-1. Configuration>

Figure 1:
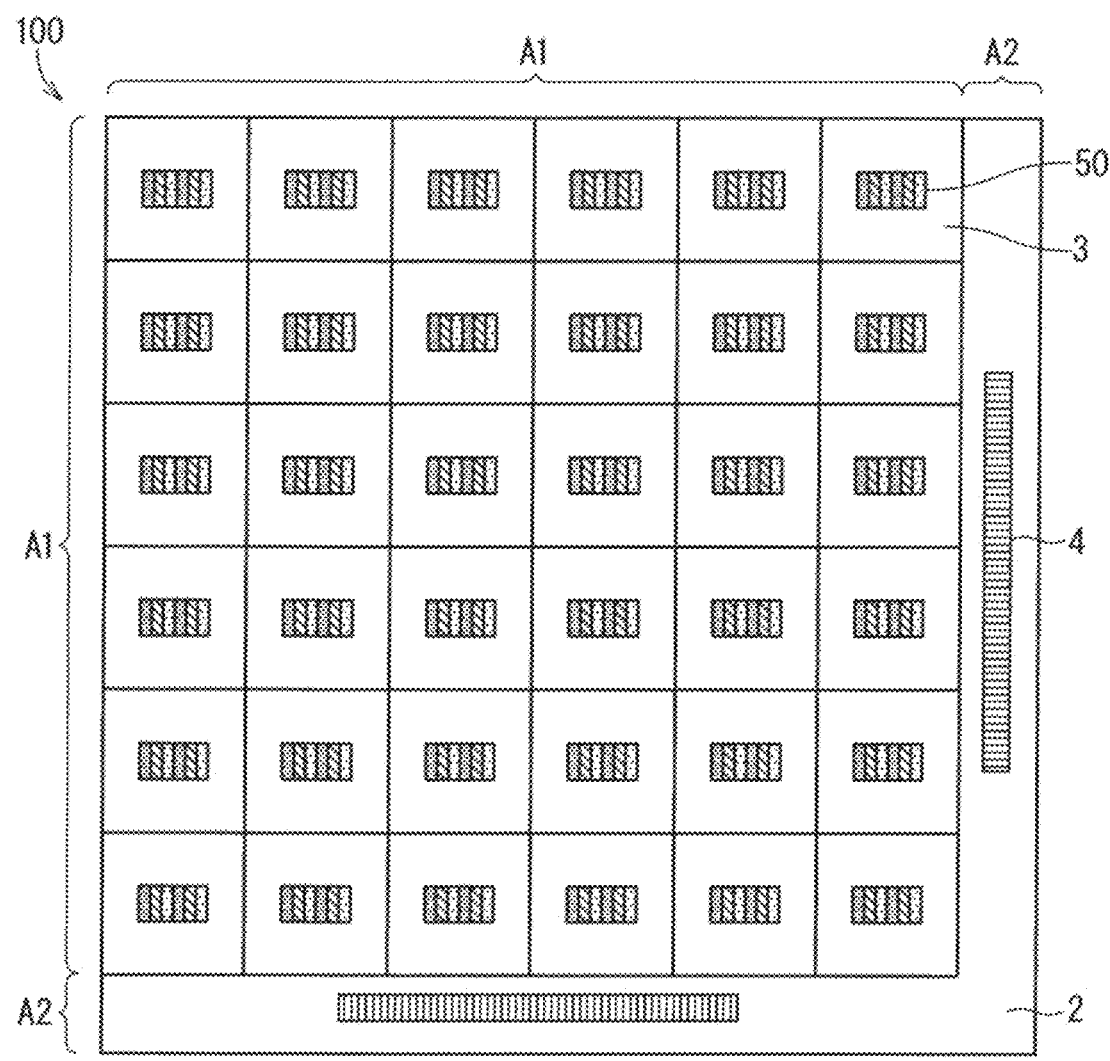
FIG. 1 is a schematic plan view illustrating a configuration of a self light emitting apparatus according to the first embodiment.

FIG. 1 is a schematic plan view illustrating a configuration of a self light emitting apparatus 100 according to the first embodiment. The self light emitting apparatus 100 includes a backplane 2, a plurality of pixels 3 (display pixels), and a driver integrated circuit (IC) 4. As illustrated in FIG. 1, the plurality of pixels 3 correspond to target regions arrayed in a horizontal direction (right-and-left direction in the drawing sheet of FIG. 1) and a vertical direction (up-and-down direction in the drawing sheet of FIG. 1) on the backplane 2. A region in which the plurality of pixels 3 are arrayed is referred to as an active area A1. In the active area A1, in addition to the plurality of pixels 3, metal thin film wires, electrodes, and switching elements are disposed, but illustration of these is omitted in FIG. 1. On the backplane 2, a non-active area A2 being a frame region is provided to surround the active area A1. In the non-active area A2, the driver IC 4 and a terminal part (not illustrated) are disposed. In the following, description will be given on the assumption that the self light emitting apparatus 100 is used as a μLED display, with the target regions corresponding to the pixels 3. However, when the self light emitting apparatus 100 is used as a backlight, the target regions correspond to a light emitting section of the backlight dividing the active area.

Figure 2:
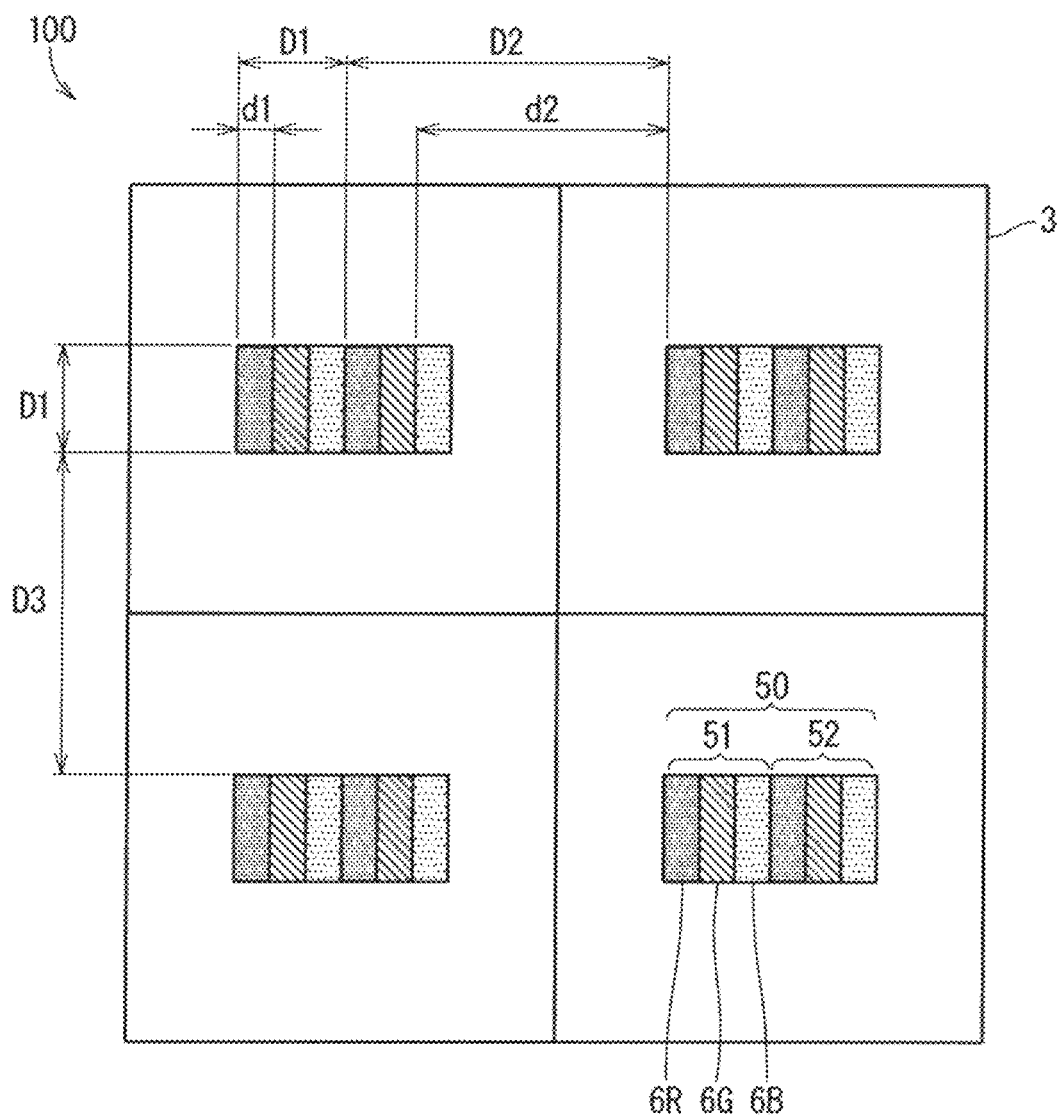
FIG. 2 is an enlarged schematic plan view of a pixel part of the self light emitting apparatus according to the first embodiment.

FIG. 2 is an enlarged schematic plan view of four pixels 3 of the self light emitting apparatus 100. Each pixel 3 includes subpixels 51 and 52 as a plurality of cells including at least one self light emitting element. In the example of FIG. 2, the subpixels 51 and 52 are arrayed in the horizontal direction. Each of the subpixels 51 and 52 includes a red LED element 6R, a green LED element 6G, and a blue LED element 6B.

The LED elements 6R, 6G, and 6B are disposed from left to right in the horizontal direction in each of the subpixels 51 and 52 in this order. The suffix at the end of a reference sign of each LED element represents a color of light emitted by the LED element. Note that, in the following description, when the LED element is referred to without particularly specifying the color of the light emitted, the LED element is also referred to as "LED element 6".

The subpixel 51 functions as a basic cell constituting a minimum unit of color information of the self light emitting apparatus 100, and the subpixel 52 functions as a redundant cell. In this manner, while one pixel 3 includes one subpixel 5 in a general self light emitting apparatus, one pixel 3 includes two subpixels 51 and 52 in the self light emitting apparatus 100.

The subpixels 51 and 52 constitute a subpixel group 50 as an integrated assembly. In other words, the two subpixels 51 and 52 in the subpixel group 50 are not structurally divided.

Further, the three LED elements 6R, 6G, and 6B in each of the subpixels 51 and 52 are not structurally divided either and are integrated. Thus, the six LED elements 6 included in the subpixel group 50 are not structurally divided and are integrated. The six LED elements 6 are integrated and assembled into one chip, using a semiconductor process. Each subpixel group 50 is formed into one chip by integrating and assembling the six LED elements 6 formed on a substrate such as a sapphire substrate, and performing singulation, with the six LED elements 6 being one unit.

A horizontal and vertical array pitch D1 of the plurality of subpixels 51 and 52 in one subpixel group 50 is smaller than each of horizontal and vertical array pitches D2 and D3 of the subpixels 51 and 52 across adjacent subpixel groups 50. Note that, in the present embodiment, as illustrated in FIG. 2, the subpixels 51 and 52 are not arrayed in the vertical direction, and thus a distance between an upper end surface and a lower end surface of the subpixel 51, that is, a vertical dimension thereof, is defined as the vertical array pitch D1 of the subpixel in the subpixel group 50. Similarly, a horizontal array pitch d1 of the LED element 6 in one subpixel group 50 is smaller than a horizontal array pitch d2 of the LED elements 6 across adjacent subpixel groups 50. With this, the subpixel 52 functions as a redundant cell for the subpixel 51.

As described above, the subpixel 51 includes the LED elements 6R, 6G, and 6B. However, the subpixel 51 is not limited to such a configuration, and may include a single LED element that emits white light as will be described in modifications to be described later, or may include four LED elements obtained by adding an LED element that emits white light to the LED elements 6R, 6G, and 6B.

The subpixel 52 typically has the same configuration as that of the subpixel 51. However, the subpixel 52 need not necessarily include the LED elements 6R, 6G, and 6B, and may include at least any one LED element out of four LED elements including the LED elements 6R, 6G, and 6B and an LED element that emits white light.

Although not illustrated, each LED element 6 is electrically connected to a switching element via an electrode, and the switching element is connected to the driver IC 4 via a metal thin film wire. As the switching element, for example, a thin film transistor (TFT) is used. The switching element, the metal thin film wire, and the electrode are disposed inside the pixel 3. In the present embodiment, for one pixel 3, two subpixels 51 and 52 are disposed as the subpixel group 50. Thus, the switching element, the metal thin film wire, and the electrode are disposed for each LED element 6 of the subpixels 51 and 52.

<A-2. Manufacturing Method>

Figure 3:
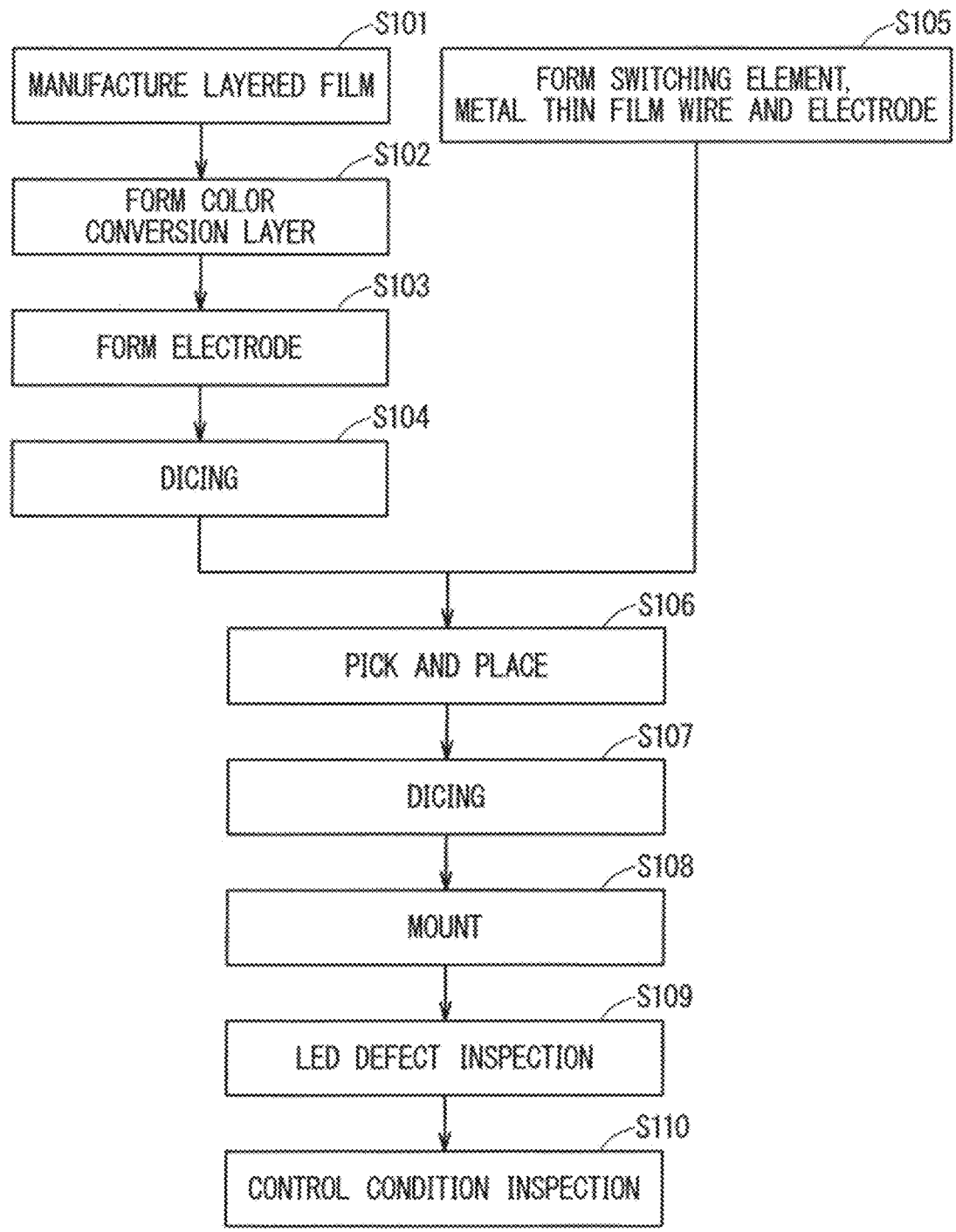
FIG. 3 is a flowchart illustrating a manufacturing process and an inspection process for the self light emitting apparatus according to the first embodiment.

FIG. 3 is a flowchart illustrating a manufacturing process and an inspection process for the self light emitting apparatus 100 according to the first embodiment. The manufacturing process and the inspection process of the self light emitting apparatus 100 will be described below in accordance with the flow of FIG. 3.

First, on a substrate, a buffer layer, an n-type semiconductor layer, a light emitting layer, and a p-type semiconductor layer are manufactured as layered films (Step S101). As the substrate, for example, a sapphire substrate is used. Next, phosphors, quantum dots, or the like are formed on the layered films as a color conversion layer (Step S102). Then, electrodes are formed on the n-type semiconductor layer and the p-type semiconductor layer.

(Step S103). Then, the substrate is diced into desired sizes (Step S104), and the LED elements 6 are thus formed. In FIG. 1 and FIG. 2, the LED elements 6R, 6G, and 6B having a rectangular shape are illustrated. However, the LED elements 6 need not necessarily have such a shape, and may have another shape such as a square shape. Further, in FIG. 1 and FIG. 2, the LED elements 6R, 6G, and 6B are arrayed without gaps therebetween in the subpixel group 50. However, gaps generated due to the dicing of Step S104 may be present.

In parallel with the formation of the LED elements 6, the backplane 2 is prepared. Specifically, on the backplane 2, metal thin film wires, switching elements, and electrodes are formed (Step S105). As the backplane 2, for example, a glass substrate, a glass epoxy substrate, or the like is used.

Next, the LED elements 6 are disposed on the backplane 2 using pick and place (Step S106). Note that the LED elements 6 may be disposed thereon using another method, such as laser lift-off, elastic stamp, static electricity, or magnetism.

Next, the backplane 2 is diced into desired sizes (Step S107). Then, the electrode of each LED element 6 is electrically connected to the switching element, and the switching element is connected to the driver IC 4 with the metal thin film wire. In this manner, the LED elements are mounted on the backplane 2 (Step S108). Through the above process, the manufacturing process of the self light emitting apparatus 100 completes.

The self light emitting apparatus 100 includes the subpixel 52 in addition to the subpixel 51, and thus has a large number of LED elements 6. However, disposing the LED elements 6 for each subpixel group 50 combining the subpixel 51 and the subpixel 52 in Step S106 can preclude increase of takt time due to increase of the number of LED elements 6.

Next, the inspection process of the self light emitting apparatus 100 will be described. First, a defect in the LED elements is inspected (Step S109). Next, a driving method of the self light emitting apparatus 100 is adjusted depending on whether or not there is a defect in the LED elements (Step S110).

In Step S110, even if there is a defect in the LED elements 6, such a driving method may be employed that one pixel is constantly turned on for each subpixel 5, or such a driving method may be employed that the item is considered fine if no pixel defect occurs while all of the subpixels 5 are constantly turned on regardless of occurrence of a defect in the LED elements 6. In addition, in each of the two types of driving methods, such a driving method may further be employed that luminance of the pixel 3 is adjusted so as to enhance in-plane uniformity of the light emitting apparatus.

When there is a pixel defect, after the defect inspection process (Step S109), the wire may be cut off so that the defective pixel cannot be used. Alternatively, information of the defective pixel may be stored in a storage medium such as a memory, and based on the information, it may be arranged that the defective pixel be not driven under control of a signal, such as a driving signal or a video signal, that is transmitted from the driver IC to the switching element.

Alternatively, all of the pixels may be driven regardless of whether or not there is a defective pixel. In that case, whether in-plane uniformity is secured to a certain degree or greater may be confirmed in an in-plane uniformity inspection process, and the signal transmitted from the driver IC may be controlled in order to adjust luminance of the pixel so that the in-plane uniformity is secured to the certain degree or greater, that is, so that a luminance difference between the pixels is reduced. In other words, based on a luminance difference between adjacent target regions, luminance of output light of the self light emitting elements in each pixel 3 is determined so that the luminance difference is reduced. In that case, control information related to luminance adjustment of the pixel may be stored in a storage medium such as a memory, and based on the information, the signal transmitted from the driver IC that adjusts the luminance of the pixel may be controlled. The in-plane uniformity inspection process and the driving control of adjusting luminance of the pixel can also be applied to a case in which a defective pixel is not used.

<A-3. Activation Method of Pixel>

Each LED element 6 in the pixel 3 is electrically connected to the switching element via the electrode, and the switching element is connected to the driver IC 4 via the metal thin film wire. A terminal is electrically connected to an external control substrate via a flexible substrate or the like. The terminal receives a signal such as a driving signal or a video signal that is supplied to the switching element from the control substrate via the flexible substrate or the like. The driver IC 4 transmits the signal such as the driving signal or the video signal. The metal thin film wire supplies the transmitted signal to the switching element. The switching element activates the LED element 6 electrically connected to the switching element in accordance with the supplied signal. In this manner, light emitted from the plurality of subpixel groups 50 respectively included in the plurality of pixels 3 is controlled in accordance with the signal such as the driving signal or the video signal. In this manner, an image and a video are displayed in the active area with light emitted from each subpixel group 50 disposed in the pixel 3 being one unit, which realizes use as the self light emitting display apparatus.

Here, the LED elements 6 may be activated using an activation method different from the activation method described above. For example, one switching element may activate three LED elements 6R, 6G, and 6B. Alternatively, a switching element other than the thin film transistor may activate three LED elements 6R, 60, and 6B. For example, a pixel driver IC may activate each LED element 6. When the pixel driver IC activates each of the subpixels 51 and 52, in general, one pixel driver IC activates each of the subpixels 51 and 52.

<A-4. Effects>

As described above, the self light emitting apparatus 100 according to the first embodiment includes the backplane 2, and the pixels 3 being a plurality of target regions arrayed on the backplane 2. Each pixel 3 includes the basic cell and the redundant cell as the subpixels 51 and 52, respectively. The subpixel 51 being the basic cell includes the LED elements 6R, 6G, and 6B. The subpixel 52 being the redundant cell includes the LED element that emits light of a color the same as at least one LED element out of the LED elements 6R, 6G, and 6B included in the basic cell. The plurality of subpixels 51 and 52 included in each pixel 3 or adjacent ones of the plurality of pixels 3 are configured as the subpixel group 50 being an assembly that includes a plurality of LED elements being integrated. The array pitch D1 of the subpixels 51 and 52 in the subpixel group 50 is smaller than each of the array pitches D2 and D3 between the subpixels 51 and 52 of the subpixel group 50 and the subpixels 51 and 52 of the plurality of subpixel groups 50 being adjacent to the subpixel group 50.

Therefore, in the self light emitting apparatus 100, even if a defect occurs in the LED elements 6R, 60, and 6B constituting the basic cell, a pixel defect does not occur as long as a defect does not occur in the LED elements 6R, 6G, and 6B constituting the redundant cell. Owing to such a configuration, in the self light emitting apparatus 100, reduction of a yield can be hindered.

<A-5. Modifications>

Modifications regarding disposition of the LED elements 6 will be described below.

<A-5-1. First Modification>

Figure 4:
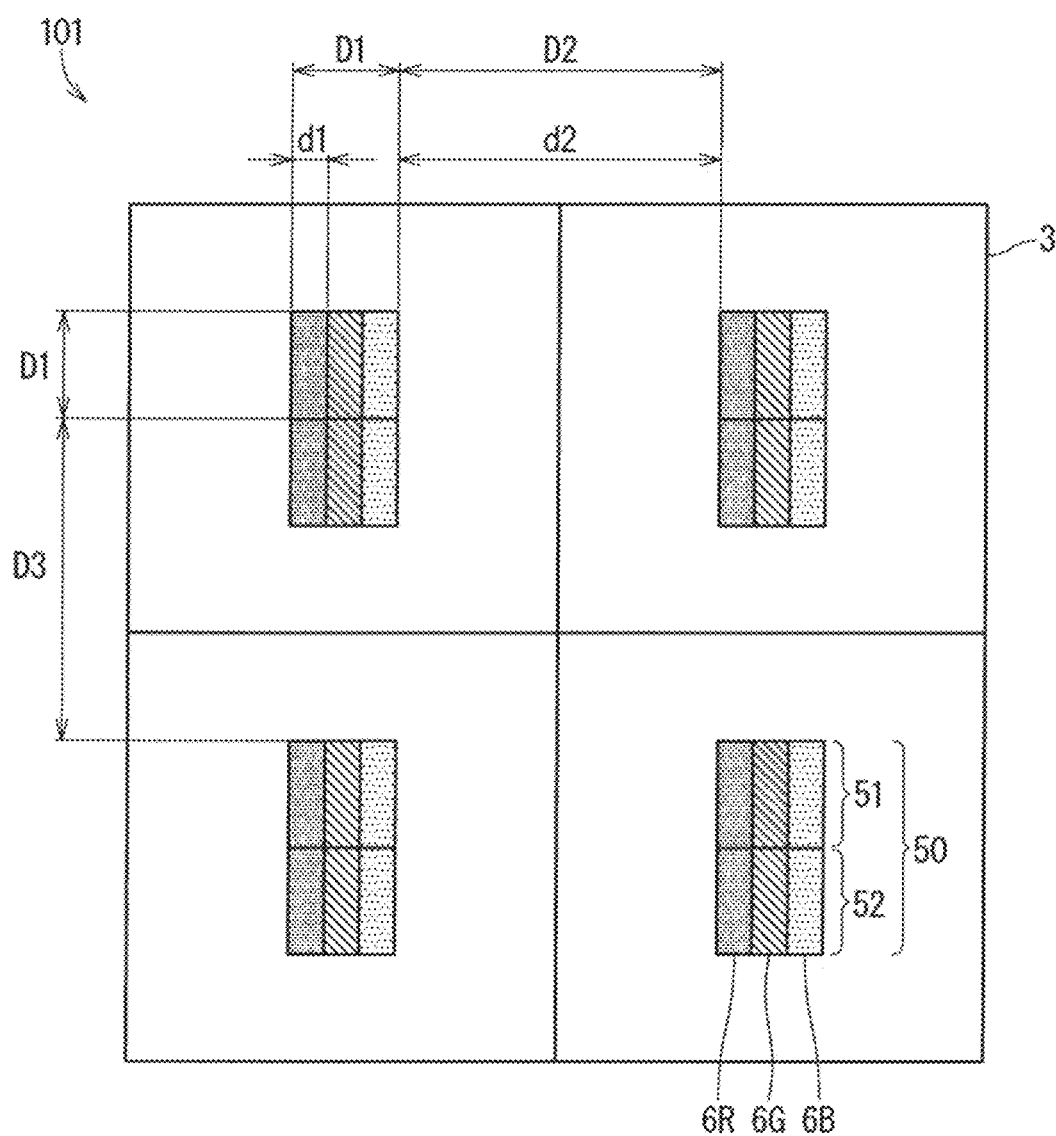
FIG. 4 is an enlarged schematic plan view of the pixel part of the self light emitting apparatus according to a first modification of the first embodiment.

FIG. 4 is an enlarged schematic plan view of four pixels 3 of a self light emitting apparatus 101 according to a first modification of the first embodiment. The self light emitting apparatus 101 is different from the self light emitting apparatus 100 according to the first embodiment only in that the subpixels 51 and 52 are arrayed in the vertical direction. Note that, in the self light emitting apparatus 101, the subpixels 51 and 52 are not arrayed in the horizontal direction, and thus the horizontal array pitch D1 of the subpixel in the subpixel group 50 is defined as a horizontal dimension of the subpixel 51.

In the self light emitting apparatus 101 in which the subpixels 51 and 52 are arrayed in the vertical direction as well, the subpixel 52 functions as a redundant cell, and thus similarly to the self light emitting apparatus 101, an effect of hindering reduction of a yield can be achieved.

<A-5-2. Second Modification>

Figure 5:
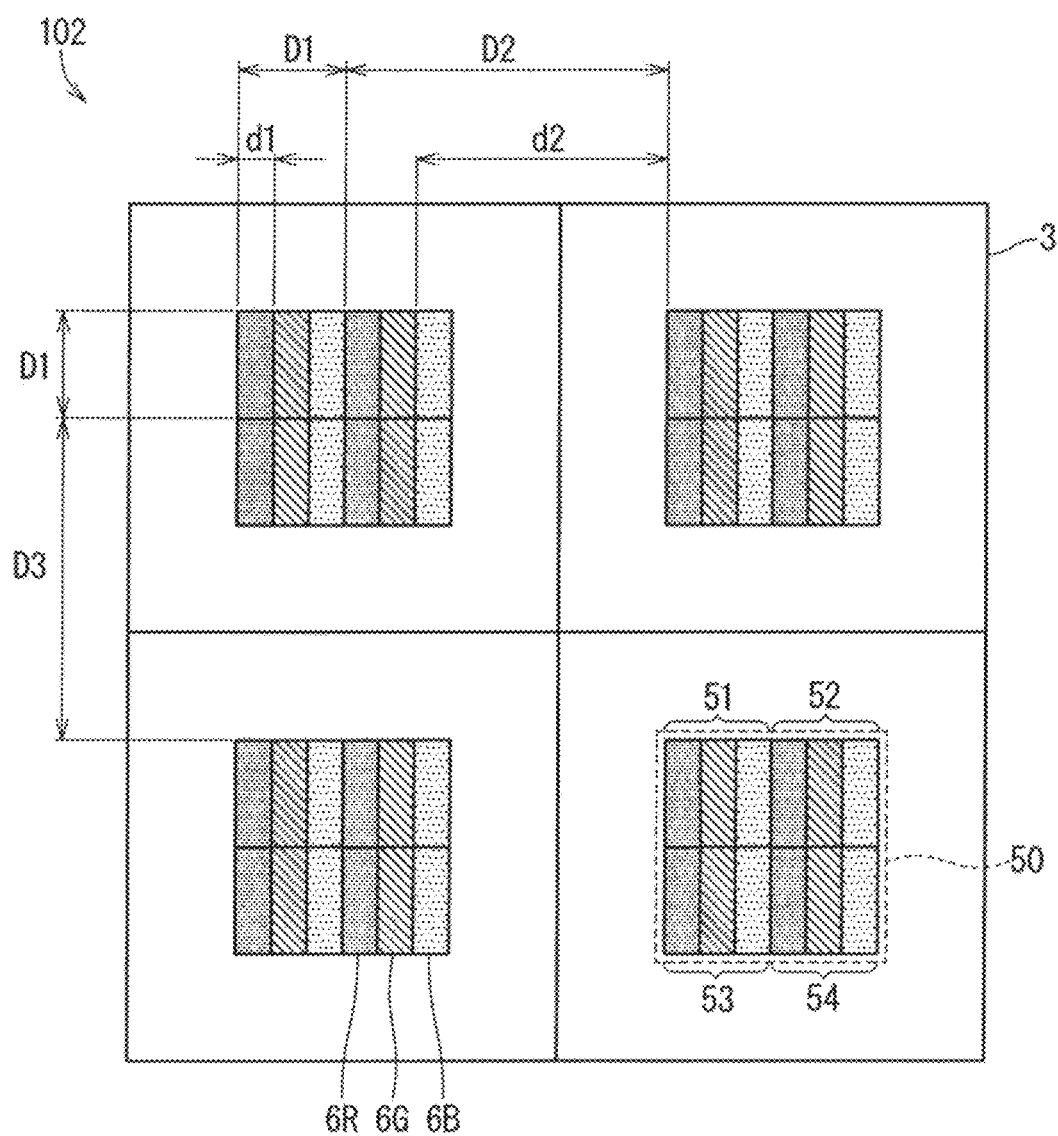
FIG. 5 is an enlarged schematic plan view of the pixel part of the self light emitting apparatus according to a second modification of the first embodiment.

FIG. 5 is an enlarged schematic plan view of four pixels 3 of a self light emitting apparatus 102 according to a second modification of the first embodiment. The self light emitting apparatus 102 is different from the self light emitting apparatus 100 according to the first embodiment only in that four subpixels 51 to 54 are arrayed in two rows and two columns in each pixel 3. In other words, each pixel 3 of the self light emitting apparatus 102 includes subpixels 53 and 54 in addition to the subpixels 51 and 52. The subpixels 51 to 54 all have the same configuration. The subpixels 51 and 52 are arrayed in the horizontal direction, the subpixels 51 and 53 are arrayed in the vertical direction, and the subpixels 52 and 54 are arrayed in the vertical direction. The subpixels 51 to 54 constitute the subpixel group 50.

In the self light emitting apparatuses 100 and 101, only the subpixel 52 functions as a redundant cell, and thus if a failure occurs in the LED elements of both of the subpixels 51 and 52, a pixel defect occurs. However, in the self light emitting apparatus 102, the subpixel group 50 includes four subpixels 51 to 54, and three subpixels 52 to 54 each function as a redundant cell. Accordingly, even if a failure occurs in the LED elements in a maximum of three subpixels out of the four subpixels 51 to 54, a pixel defect does not occur. In this manner, according to the self light emitting apparatus 102, an effect of further hindering reduction of a yield can be achieved.

<A-5-3. Third Modification>

Figure 6:
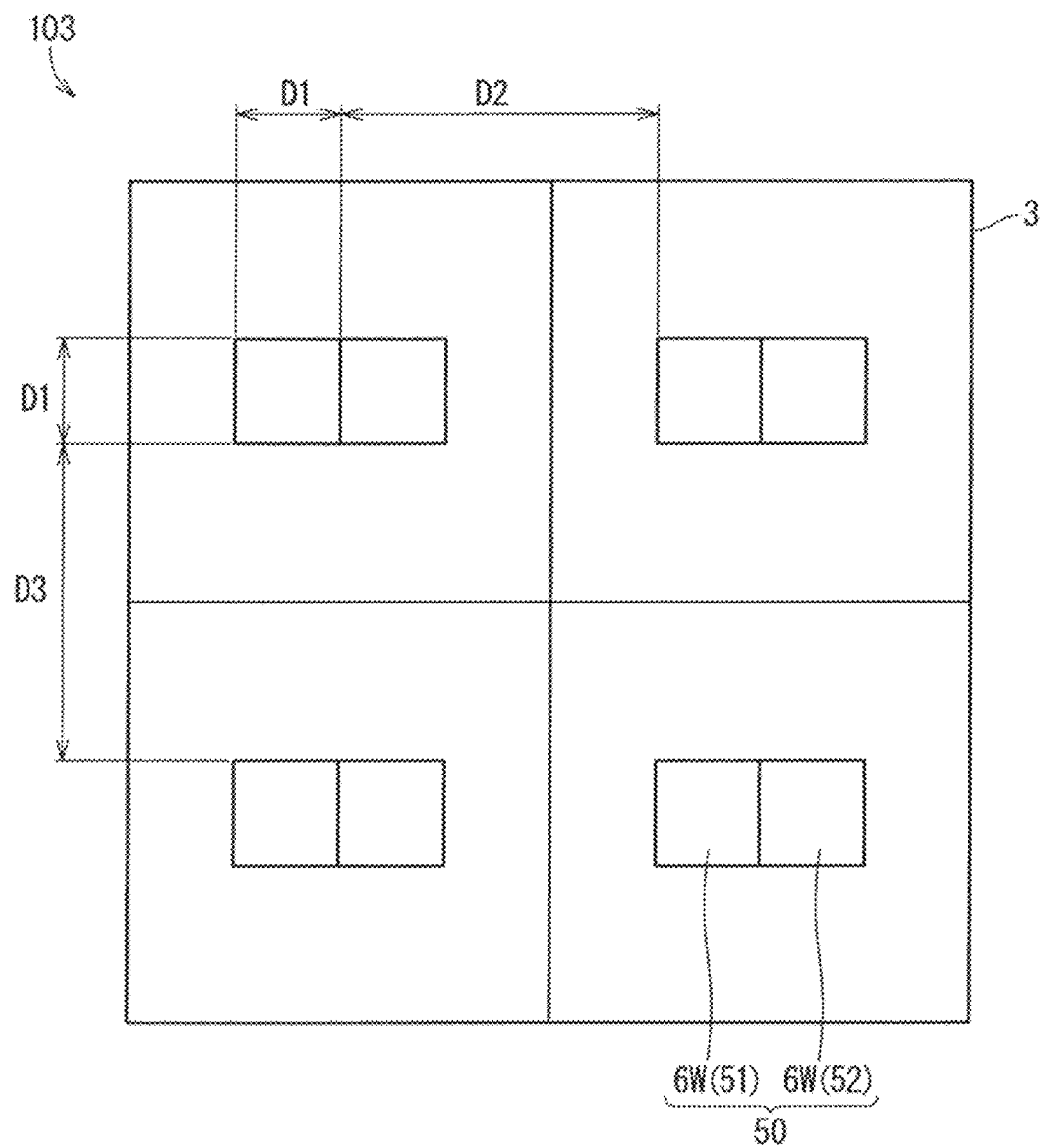
FIG. 6 is an enlarged schematic plan view of the pixel part of the self light emitting apparatus according to a third modification of the first embodiment.

FIG. 6 is an enlarged schematic plan view of four pixels 3 of a self light emitting apparatus 103 according to a third modification of the first embodiment. The self light emitting apparatus 103 is different from the self light emitting apparatus 100 according to the first embodiment only in that each of the subpixels 51 and 52 includes a white LED element, that is, one LED element 6W that emits white light. In the self light emitting apparatus 103, two LED elements 6W arrayed in the horizontal direction constitute the subpixel group 50.

According to the self light emitting apparatus 103, when a full color display is not needed, quantity of light can be adjusted for each pixel 3. For example, by using the self light emitting apparatus 103 as a backlight of a liquid crystal display apparatus and adjusting the quantity of light for each pixel 3 depending on a display image of the liquid crystal display apparatus, the contrast ratio of the liquid crystal display apparatus can be enhanced.

<A-5-4. Fourth Modification>

Figure 7:
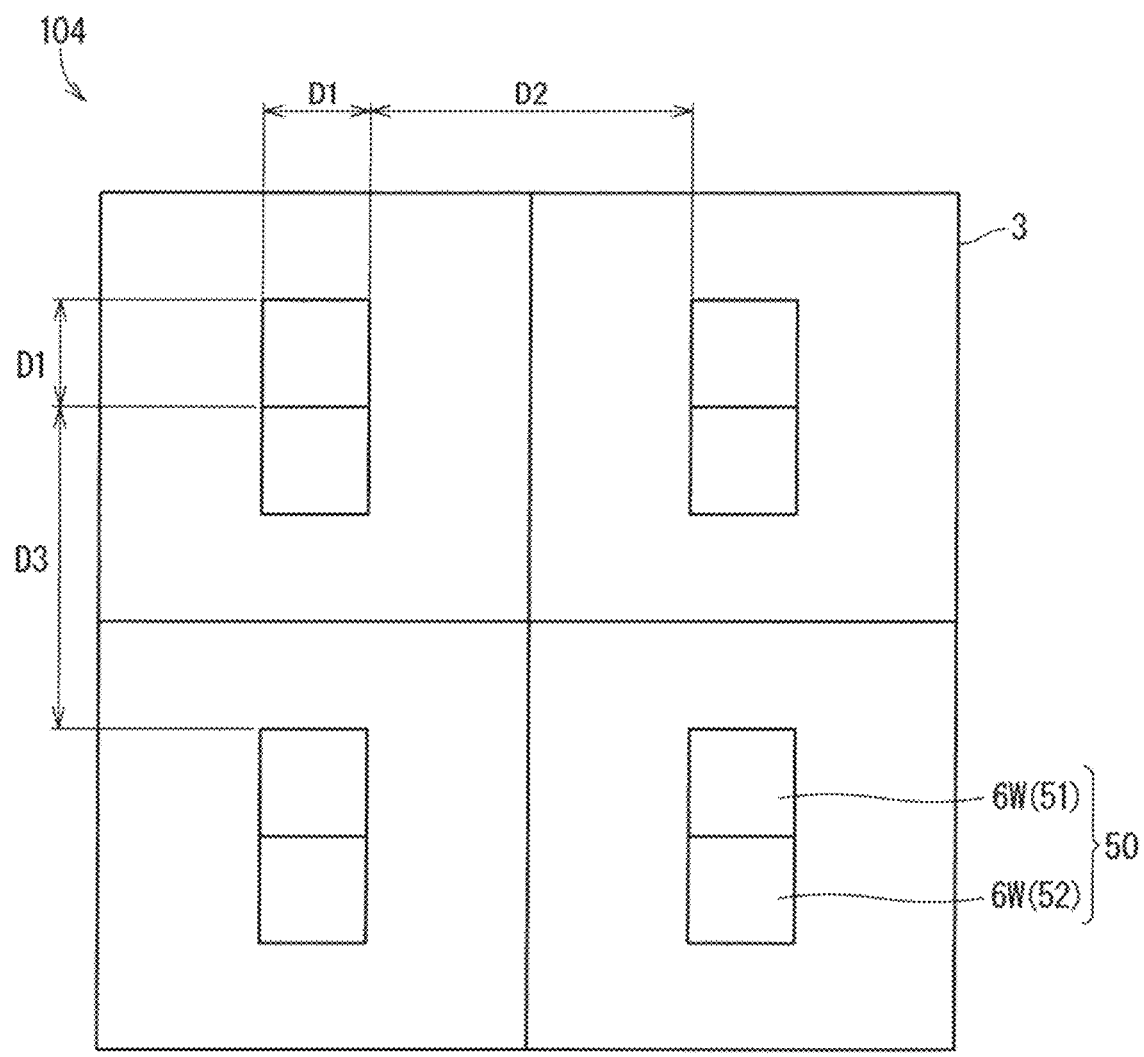
FIG. 7 is an enlarged schematic plan view of the pixel part of the self light emitting apparatus according to a fourth modification of the first embodiment.

FIG. 7 is an enlarged schematic plan view of four pixels 3 of a self light emitting apparatus 104 according to a fourth modification of the first embodiment. The self light emitting apparatus 104 is different from the self light emitting apparatus 101 according to the first modification of the first embodiment only in that each of the subpixels 51 and 52 includes a white LED element, that is, one LED element 6 W that emits white light. In the self light emitting apparatus 104, two LED elements 6 W arrayed in the vertical direction constitute the subpixel group 50.

According to the self light emitting apparatus 104, when a full color display is not needed, quantity of light can be adjusted for each pixel 3. For example, by using the self light emitting apparatus 104 as a backlight of a liquid crystal display apparatus and adjusting the quantity of light for each pixel 3 depending on a display image of the liquid crystal display apparatus, the contrast ratio of the liquid crystal display apparatus can be enhanced.

<A-5-5. Fifth Modification>

Figure 8:
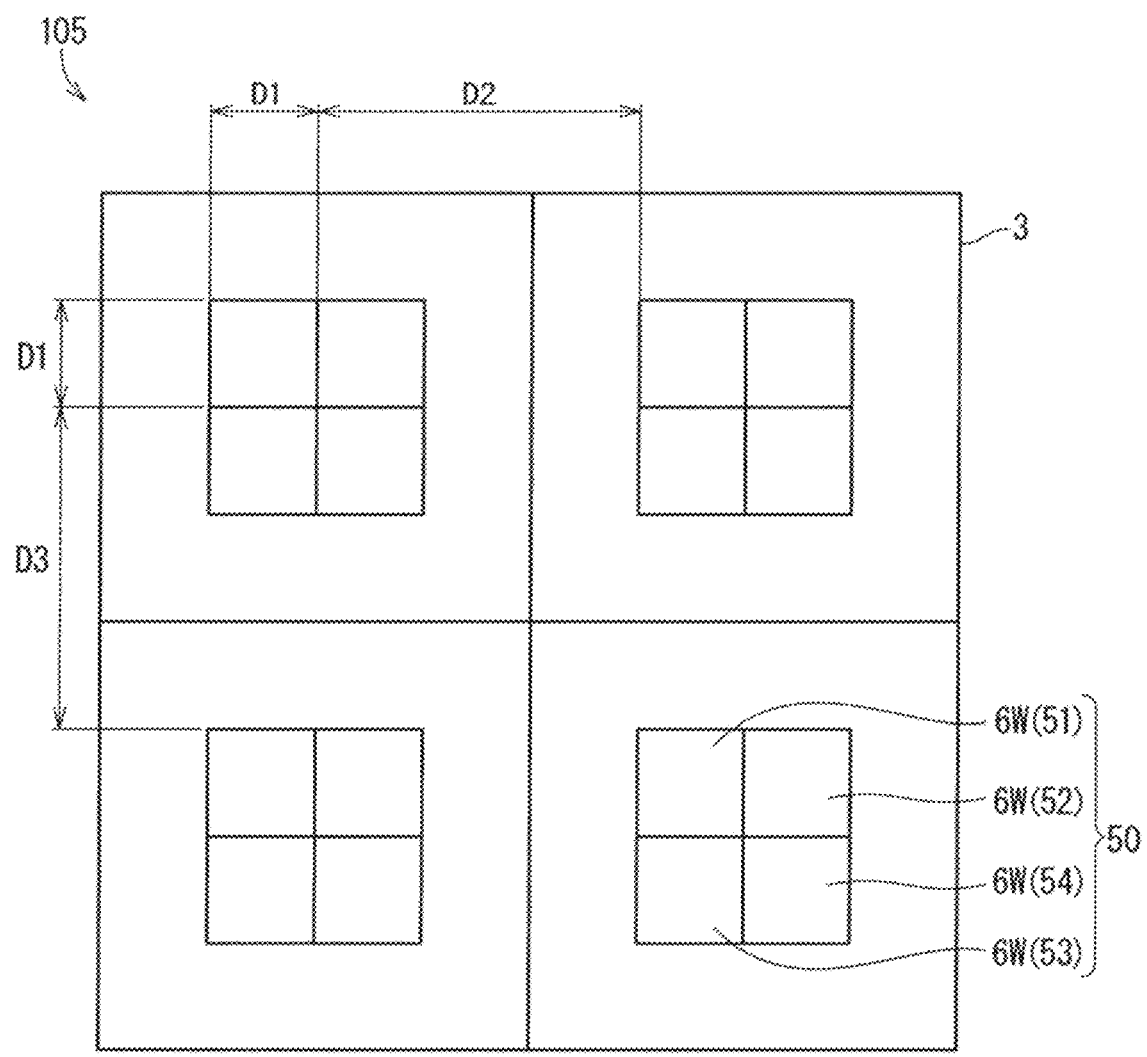
FIG. 8 is an enlarged schematic plan view of the pixel part of the self light emitting apparatus according to a fifth modification of the first embodiment.

FIG. 8 is an enlarged schematic plan view of four pixels 3 of a self light emitting apparatus 105 according to a fifth modification of the first embodiment. The self light emitting apparatus 105 is different from the self light emitting apparatus 102 according to the second modification of the first embodiment only in that each of the subpixels 51, 52, 53, and 54 includes a white LED element, that is, one LED element 6W that emits white light.

According to the self light emitting apparatus 105, three subpixels 52 to 54 each function as a redundant cell, and thus similarly to the second modification of the first embodiment, an effect of further hindering reduction of a yield can be achieved. Further, according to the self light emitting apparatus 105, the subpixels 51 to 54 include the LED elements 6W, and thus similarly to the third and fourth modifications of the first embodiment, quantity of light can be adjusted for each pixel 3, and an effect of enhancing the contrast ratio of the liquid crystal display apparatus can be achieved.

<A-5-6. Sixth Modification>

Figure 9:
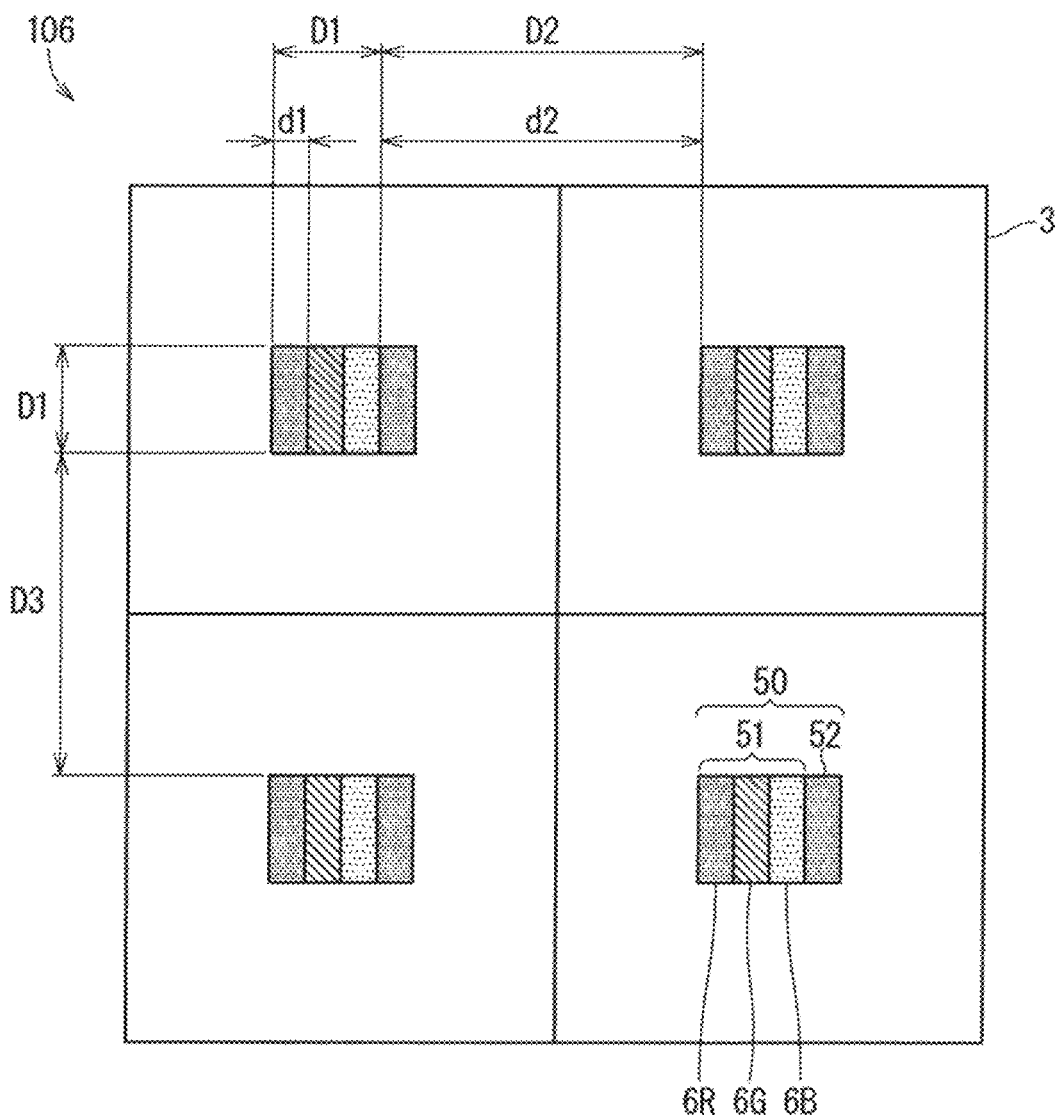
FIG. 9 is an enlarged schematic plan view of the pixel part of the self light emitting apparatus according to a sixth modification of the first embodiment.

FIG. 9 is an enlarged schematic plan view of four pixels 3 of a self light emitting apparatus 106 according to a sixth modification of the first embodiment. The self light emitting apparatus 106 is different from the self light emitting apparatus 100 according to the first embodiment only in that the subpixel 52 includes one LED element 6R. In the present modification, the subpixel 52 includes the LED element 6R. However, the subpixel 52 may include the LED element 6G or the LED element 6B.

In the self light emitting apparatus 106, the subpixel 52 includes an LED element that emits light of the same color as any one LED element out of the LED elements 6R, 6G, and 6B included in the subpixel 51, and thus the configuration thereof is simplified as compared to the self light emitting apparatus 100 according to the first embodiment whose subpixel 52 includes the LED elements 6R, 6G, and 6B.

Further, according to the self light emitting apparatus 106, for example, when the subpixel 52 includes the LED element 6R, even if a failure occurs in the LED element 6R of the subpixel 51, a pixel defect does not occur as long as a defect does not occur in the LED element 6R of the subpixel 52. Accordingly, reduction of a yield of the self light emitting apparatus 106 can be hindered to a certain degree. For example, by employing an LED element of a specific color that is liable to cause a failure as the subpixel 52, reduction of a yield of the self light emitting apparatus 106 can be efficiently hindered.

<A-5-7. Seventh Modification>

Figure 10:
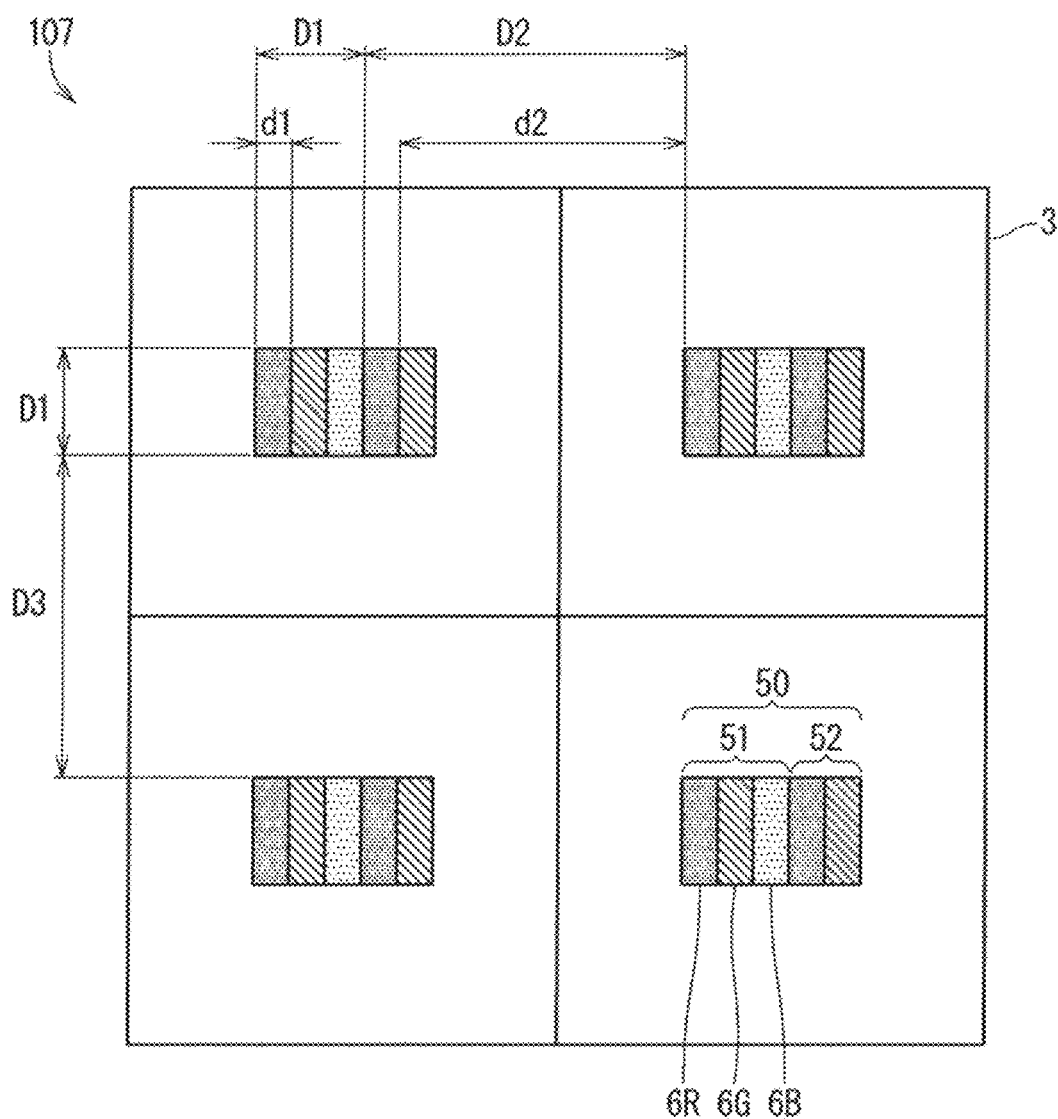
FIG. 10 is an enlarged schematic plan view of the pixel part of the self light emitting apparatus according to a seventh modification of the first embodiment.

FIG. 10 is an enlarged schematic plan view of four pixels 3 of a self light emitting apparatus 107 according to a seventh modification of the first embodiment. The self light emitting apparatus 107 is different from the self light emitting apparatus 100 according to the first embodiment only in that the subpixel 52 includes the LED element 6R and the LED element 6G.

In the self light emitting apparatus 107, the subpixel 52 includes the LED elements 6R and 6G, and thus the configuration thereof is simplified as compared to the self light emitting apparatus 100 according to the first embodiment whose subpixel 52 includes the LED elements 6R, 6G, and 6B. Further, according to the self light emitting apparatus 107, even if a failure occurs in the LED elements 6R and 6G of the subpixel 51, a pixel defect does not occur as long as a defect does not occur in the same colors of the LED elements 6R and 6G in the subpixel 52. Accordingly, reduction of a yield of the self light emitting apparatus 107 can be hindered to a certain degree. In the present modification, the subpixel 52 includes the LED elements 6R and 6G. However, the subpixel 52 may include a combination of any two LED elements out of the LED elements 6R, 6G, and 6B. For example, by employing an LED element of a specific color that is liable to cause a failure as the subpixel 52, reduction of a yield of the self light emitting apparatus 107 can be efficiently hindered.

In the above description, when the subpixels 51 and 52 each include the LED elements 6R, 6G, and 6B, the LED elements 6R, 6G, and 6B are arrayed in the horizontal direction in each of the subpixels 51 and 52. However, the LED elements 6R, 6G, and 6B may be arrayed in the vertical direction in the subpixels 51 and 52. Further, the order of arraying the LED elements in the subpixels 51 and 52 is not limited to the order of the LED elements 6R, 6G, and 6B, and may be any order.

B. Second Embodiment

<B-1. Configuration>

Figure 11:
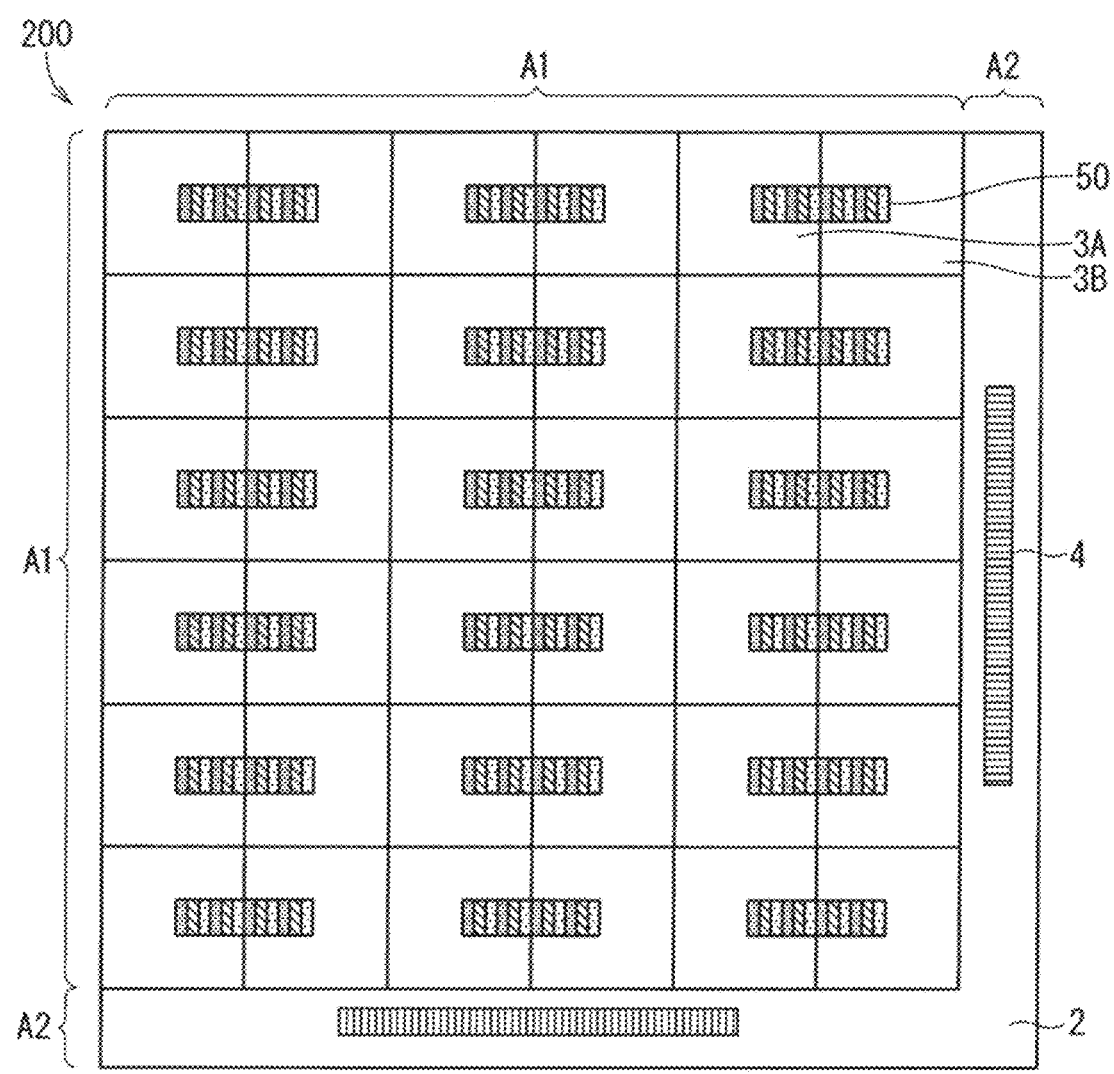
FIG. 11 is a schematic plan view illustrating a configuration of a self light emitting apparatus according to the second embodiment.

FIG. 11 is a schematic plan view illustrating a configuration of a self light emitting apparatus 200 according to the second embodiment. In the self light emitting apparatus 100 according to the first embodiment, the subpixels are disposed at the center of the pixel 3, whereas in the self light emitting apparatus 200, the subpixels are disposed at the right end or the left end of the pixel 3. In the present embodiment, for the sake of distinction, a pixel 3 in which the subpixels are disposed at the right end is referred to as a pixel 3A, and a pixel 3 in which the subpixels are disposed at the left end is referred to as a pixel 3B. In the active area A1 of the self light emitting apparatus 200, the pixel 3A and the pixel 3B are alternately arrayed in the horizontal direction and the vertical direction.

Figure 12:
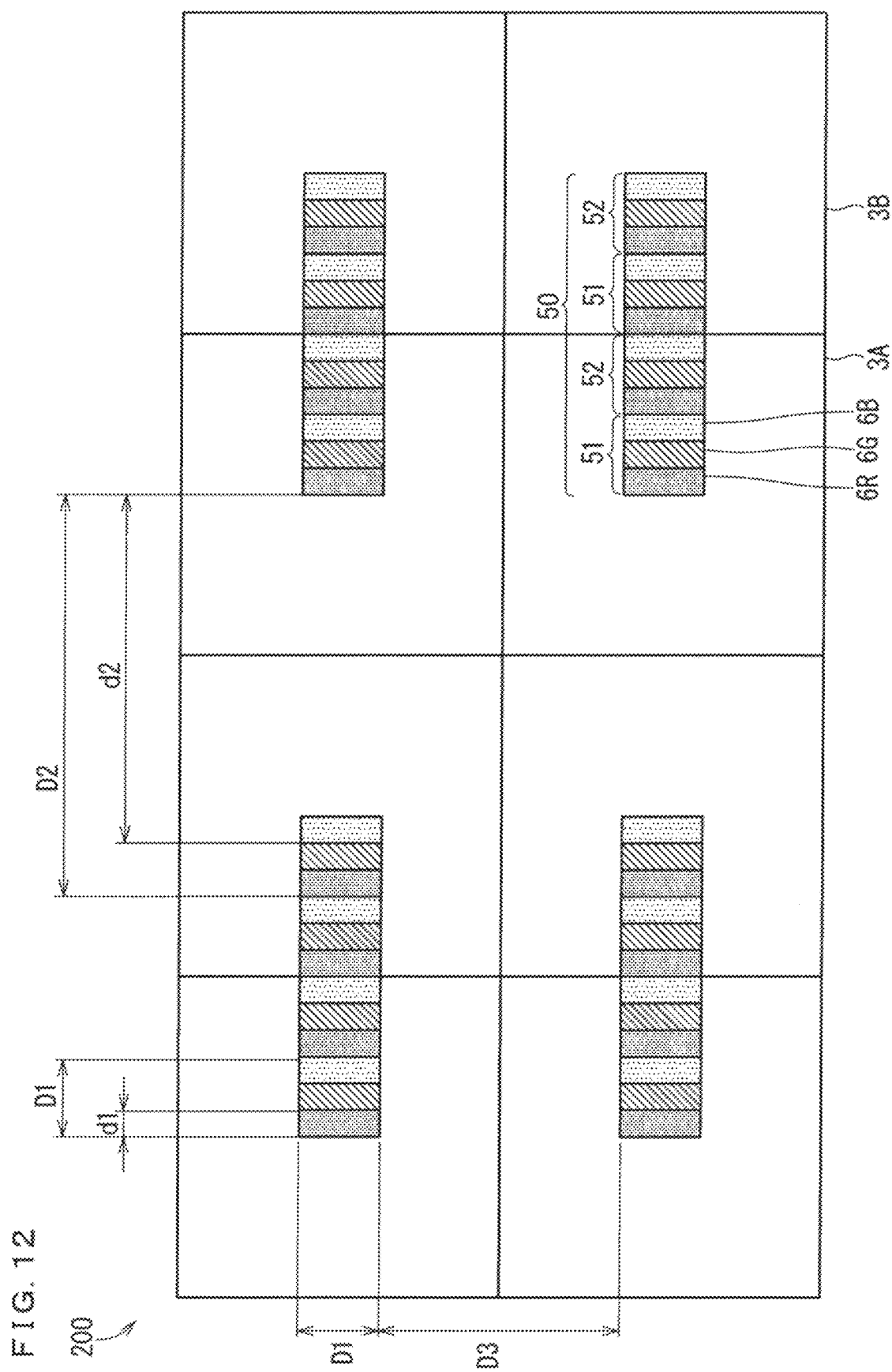
FIG. 12 is an enlarged schematic plan view of a pixel part of the self light emitting apparatus according to the second embodiment.

FIG. 12 is an enlarged schematic plan view of four pixels 3A and four pixels 3B of the self light emitting apparatus 200. The pixels 3A and 3B each include two subpixels 51 and 52 arrayed from left to right in the horizontal direction in this order. In the pixel 3A, the two subpixels 51 and 52 are disposed at the right end of the pixel 3A. Specifically, disposition is implemented such that the right end surface of the LED element 6B on the rightmost side in the subpixel 52 that is located on the right side among the subpixels 51 and 52 matches the right end surface of the pixel 3A. Further, in the pixel 3B, the two subpixels 51 and 52 are disposed at the left end of the pixel 3B. Specifically, disposition is implemented such that the left end surface of the LED element 6R on the leftmost side in the subpixel 51 that is located on the left side among the subpixels 51 and 52 matches the left end surface of the pixel 3B. In the self light emitting apparatus 200, configurations other than the disposition of the subpixels 51 and 52 are the same as those of the self light emitting apparatus 100.

Owing to such disposition of the subpixels 51 and 52, the subpixels 51 and 52 in the pixel 3A are situated adjacent to the subpixels 51 and 52 of the pixel 3B on the right side of the pixel 3A. The four subpixels 51 and 52 being adjacent to each other across the two pixels 3A and 3B constitute the subpixel group 50 as an integrated assembly. In other words, the subpixels 51 and 52 in the subpixel group 50 are not structurally divided. Further, the three LED elements 6R, 60, and 6B in each of the subpixels 51 and 52 are not structurally divided either and are integrated. Thus, the 12 LED elements 6 included in the subpixel group 50 are not structurally divided and are integrated. The 12 LED elements 6 are integrated and assembled into one chip, using a semiconductor process. Each subpixel group 50 is formed into one chip by integrating and assembling the 12 LED elements 6 formed on a substrate such as a sapphire substrate, and performing singulation, with the 12 LED elements 6 being one unit.

A horizontal and vertical array pitch D1 of the plurality of subpixels 51 and 52 in one subpixel group 50 is smaller than each of horizontal and vertical array pitches D2 and D3 of the subpixels 51 and 52 across adjacent subpixel groups 50. Note that, in the present embodiment, as illustrated in FIG. 12, the subpixels 51 and 52 are not arrayed in the vertical direction, and thus a distance between an upper end surface and a lower end surface of the subpixel 51, that is, a vertical dimension thereof, is defined as the vertical array pitch D1 of the subpixel in the subpixel group 50. Similarly, a horizontal array pitch d1 of the LED element 6 in one subpixel group 50 is smaller than a horizontal array pitch d2 of the LED elements 6 across adjacent subpixel groups 50. With this, the subpixel 52 functions as a redundant cell for the subpixel 51.

In one subpixel group 50, the subpixels 51 and 52 belonging to the pixel 3A are independently driven as one display pixel by the driver IC 4, and the subpixels 51 and 52 belonging to the pixel 3B are independently driven as one display pixel by the driver IC 4. Note that the subpixel 52 functions as a redundant cell for the subpixel 51 belonging to the same pixels 3A and 3B. In this manner, the self light emitting apparatus 200 functions as a display apparatus. For example, only the subpixel group 50 being an integrated assembly including two subpixels 51 and two subpixels 52 configures two pixels 3. Owing to the disposition of the pixels 3A and 3B illustrated in FIG. 12, a 4×2 display is configured.

<B-2. Effects>

In the self light emitting apparatus 200 according to the second embodiment, the subpixels 51 and 52 of each pixel are adjacent to the subpixels 51 and 52 of another pixel adjacent to each pixel, and are configured as an assembly integrated with the subpixels 51 and 52 of the another pixel adjacent to each pixel. Specifically, the subpixels 51 and 52 of the pixel 3A are adjacent to the subpixels 51 and 52 of the pixel 3B on the right side thereof. Therefore, the LED elements 6R, 6G, and 6B constituting the subpixels 51 and 52 of the pixel 3A and the LED elements 6R, 6G, and 6B constituting the subpixels 51 and 52 of the pixel 3B on the right side of the pixel 3A can be collectively mounted to the backplane 2 as one subpixel group 50. As a result, in the self light emitting apparatus 200, an effect of reduction of manufacturing costs is achieved because of reduction of the number of times of mounting the LED elements 6R, 6G, and 6B, in addition to the effect of hindering reduction of a yield due to a pixel defect according to the first embodiment.

<B-3. Modifications>

Modifications regarding disposition of the LED elements 6 will be described below. Each of the modifications described below exerts the effects of the second embodiment.

<B-3-1. First Modification>

Figure 13:
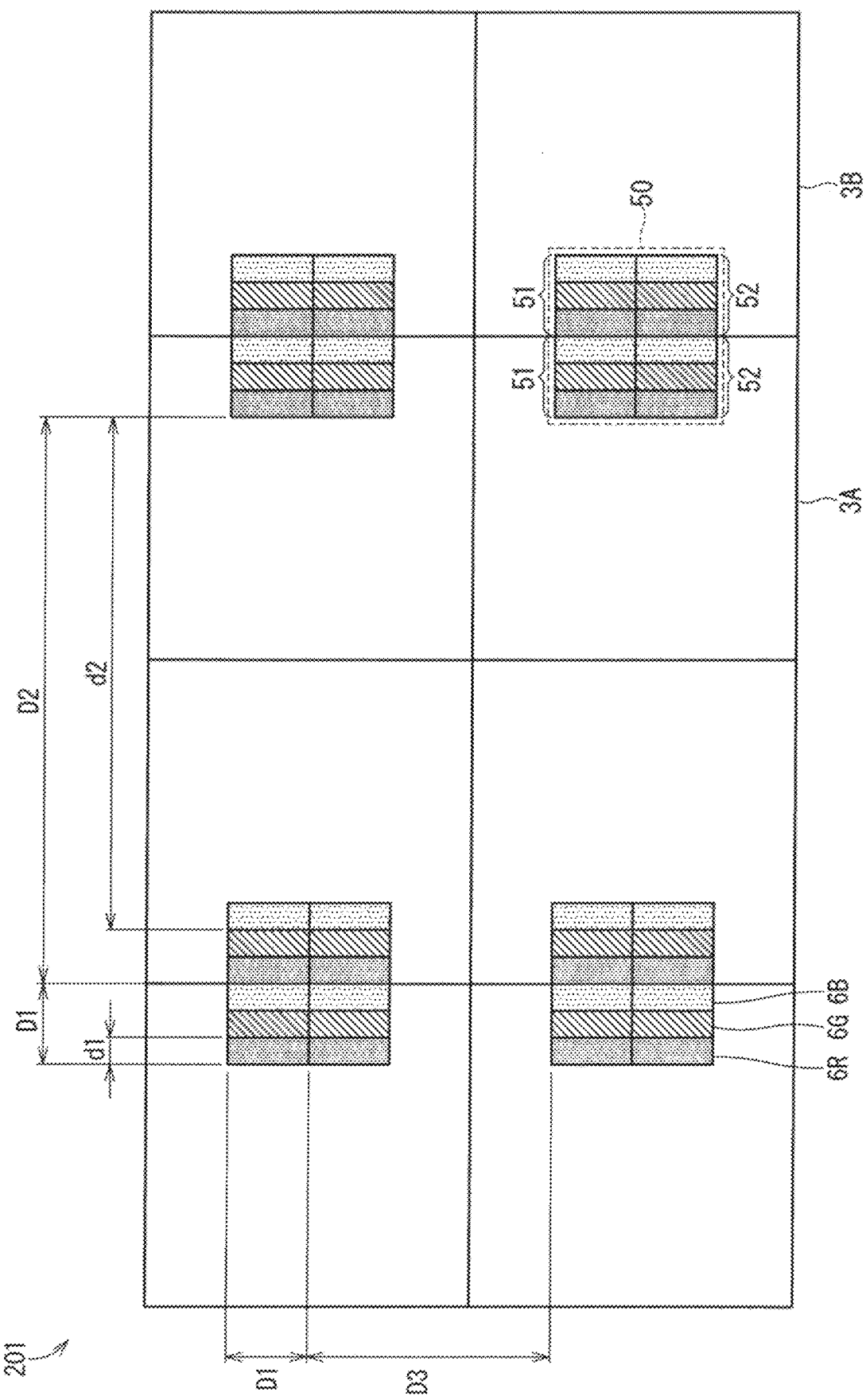
FIG. 13 is an enlarged schematic plan view of the pixel part of the self light emitting apparatus according to a first modification of the second embodiment.

FIG. 13 is an enlarged schematic plan view of four pixels 3A and four pixels 3B of a self light emitting apparatus 201 according to a first modification of the second embodiment. The self light emitting apparatus 201 is obtained by applying the first modification of the first embodiment to the second embodiment. The self light emitting apparatus 201 is different from the self light emitting apparatus 200 according to the second embodiment only in that the subpixels 51 and 52 are arrayed in the vertical direction.

Specifically, the right end surface of the LED element 6B disposed on the rightmost side in each of the subpixels 51 and 52 of the pixel 3A matches the right end surface of the pixel 3A. Further, the left end surface of the LED element 6R disposed on the leftmost side in each of the subpixels 51 and 52 of the pixel 3B matches the left end surface of the pixel 3B.

In the self light emitting apparatus 201 in which the subpixels 51 and 52 are arrayed in the vertical direction as well, similarly to the second embodiment, the LED elements 6 constituting the subpixels 51 and 52 of two pixels 3A and 3B can be collectively mounted to the backplane 2 as one subpixel group 50, and thus the number of times of mounting the LED elements 6 can be reduced.

<B-3-2. Second Modification>

Figure 14:
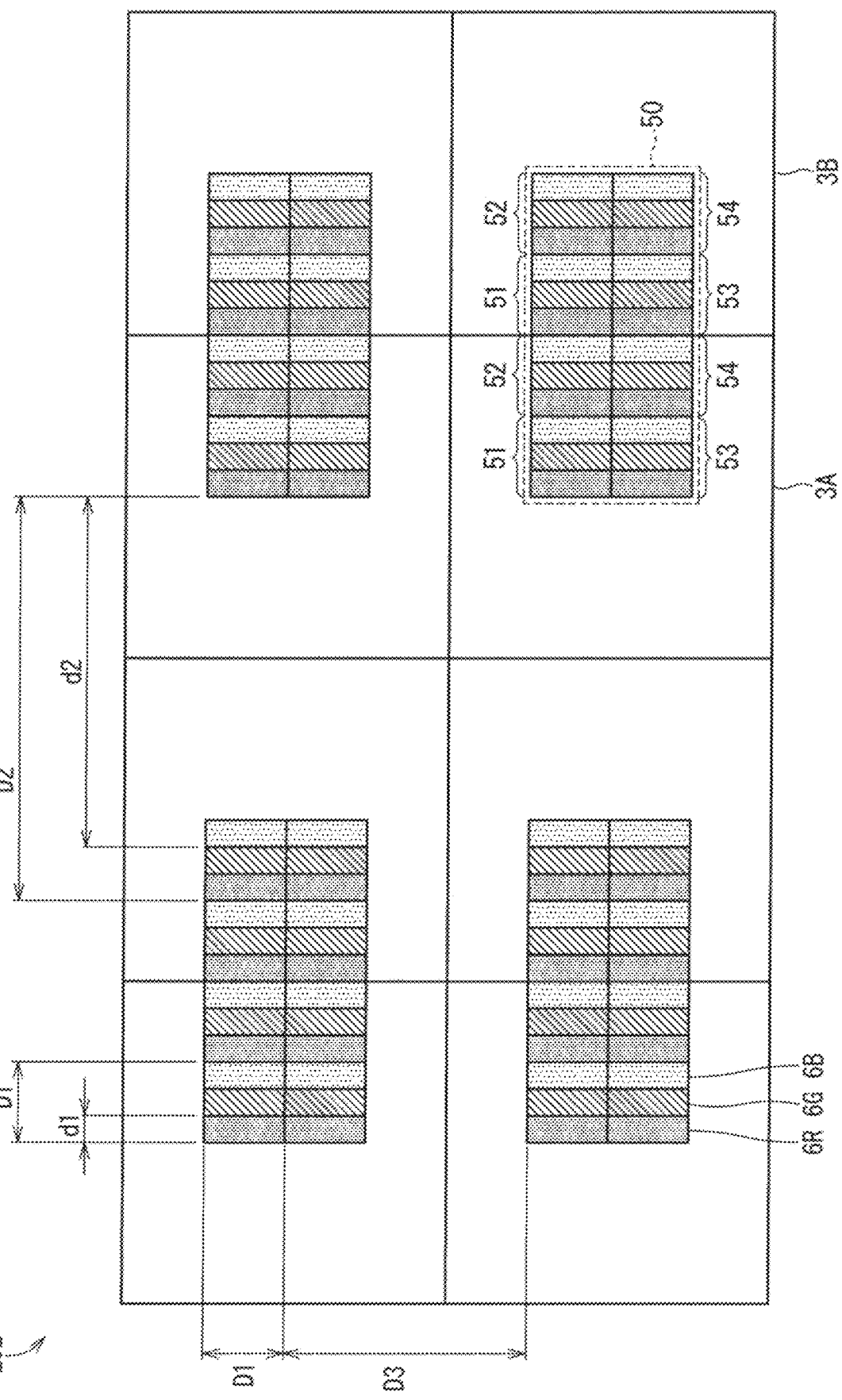
FIG. 14 is an enlarged schematic plan view of the pixel part of the self light emitting apparatus according to a second modification of the second embodiment.

FIG. 14 is an enlarged schematic plan view of four pixels 3A and four pixels 3B of a self light emitting apparatus 202 according to a second modification of the second embodiment. The self light emitting apparatus 202 is obtained by applying the second modification of the first embodiment to the second embodiment. The self light emitting apparatus 202 is different from the self light emitting apparatus 200 according to the second embodiment only in that four subpixels 51 to 54 are arrayed in two rows and two columns in each of the pixels 3A and 3B.

Specifically, the right end surface of each of the subpixels 52 and 54 of the pixel 3A matches the right end surface of the pixel 3A, and the left end surface of each of subpixels 51 and 53 of the pixel 3B matches the left end surface of the pixel 3B. In this manner, the subpixels 51 to 54 of the pixel 3A and the subpixels 51 to 54 of the pixel 3B on the right side thereof are situated adjacent to each other. These eight adjacent subpixels 51 to 54 constitute the subpixel group 50.

In the self light emitting apparatuses 200 and 201, only the subpixel 52 functions as a redundant cell, and thus if a failure occurs in the LED elements of both of the subpixels 51 and 52, a pixel defect occurs. However, in the self light emitting apparatus 202, the subpixels 52 to 54 each function as a redundant cell in each of the pixels 3A and 3B. Accordingly, even if a failure occurs in the LED elements in a maximum of three subpixels out of the four subpixels 51 to 54, a pixel defect does not occur. In this manner, according to the self light emitting apparatus 202, an effect of further hindering reduction of a yield can be achieved.

<B-3-3. Third Modification>

Figure 15:
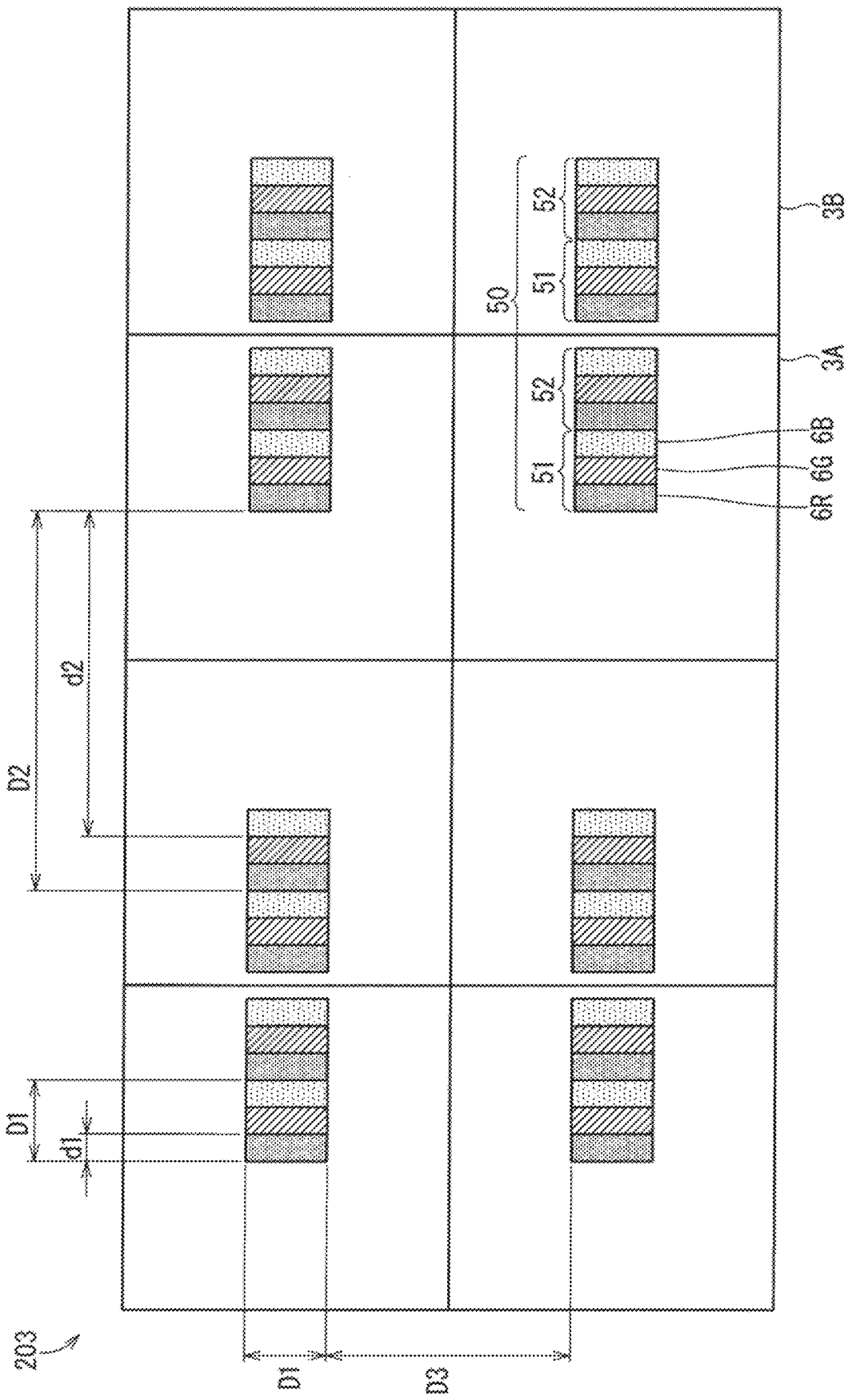
FIG. 15 is an enlarged schematic plan view of the pixel part of the self light emitting apparatus according to a third modification of the second embodiment.

FIG. 15 is an enlarged schematic plan view of four pixels 3A and four pixels 3B of a self light emitting apparatus 203 according to a third modification of the second embodiment. The self light emitting apparatus 203 is different from the self light emitting apparatus 200 according to the second embodiment only in that a gap is provided between the subpixel 52 of the pixel 3A and the subpixel 51 of the pixel 3B on the right side of the pixel 3A. In other words, the subpixels 51 and 52 of each of the pixels 3A and 3B are adjacent to the subpixels 51 and 52 of another pixel 3A or 3B adjacent to each of the pixels 3A and 3B with a gap being provided therebetween. The four subpixels 51 and 52 being adjacent to each other across the two pixels 3A and 3B with a gap being provided therebetween constitute the subpixel group 50 as an integrated assembly. In other words, the subpixels 51 and 52 in the subpixel group 50 are not structurally divided. Further, the three LED elements 6R, 6G, and 6B in each of the subpixels 51 and 52 are not structurally divided either and are integrated. Thus, the 12 LED elements 6 included in the subpixel group 50 are not structurally divided and are integrated. The 12 LED elements 6 are integrated and assembled into one chip, using a semiconductor process. Each subpixel group 50 is formed into one chip by integrating and assembling the 12 LED elements 6 formed on a substrate such as a sapphire substrate, and performing singulation, with the 12 LED elements 6 being one unit.

In the self light emitting apparatus 200 according to the second embodiment, the distance between the subpixels is small between the adjacent pixels 3A and 3B, and thus there is a fear of mixing of colors between the pixels 3A and 3B. However, in the self light emitting apparatus 203, a gap is provided between the subpixel 52 of the pixel 3A and the subpixel 51 of the pixel 3B on the right side of the pixel 3A, and therefore mixing of colors can be hindered.

<B-3-4. Fourth Modification>

Figure 16:
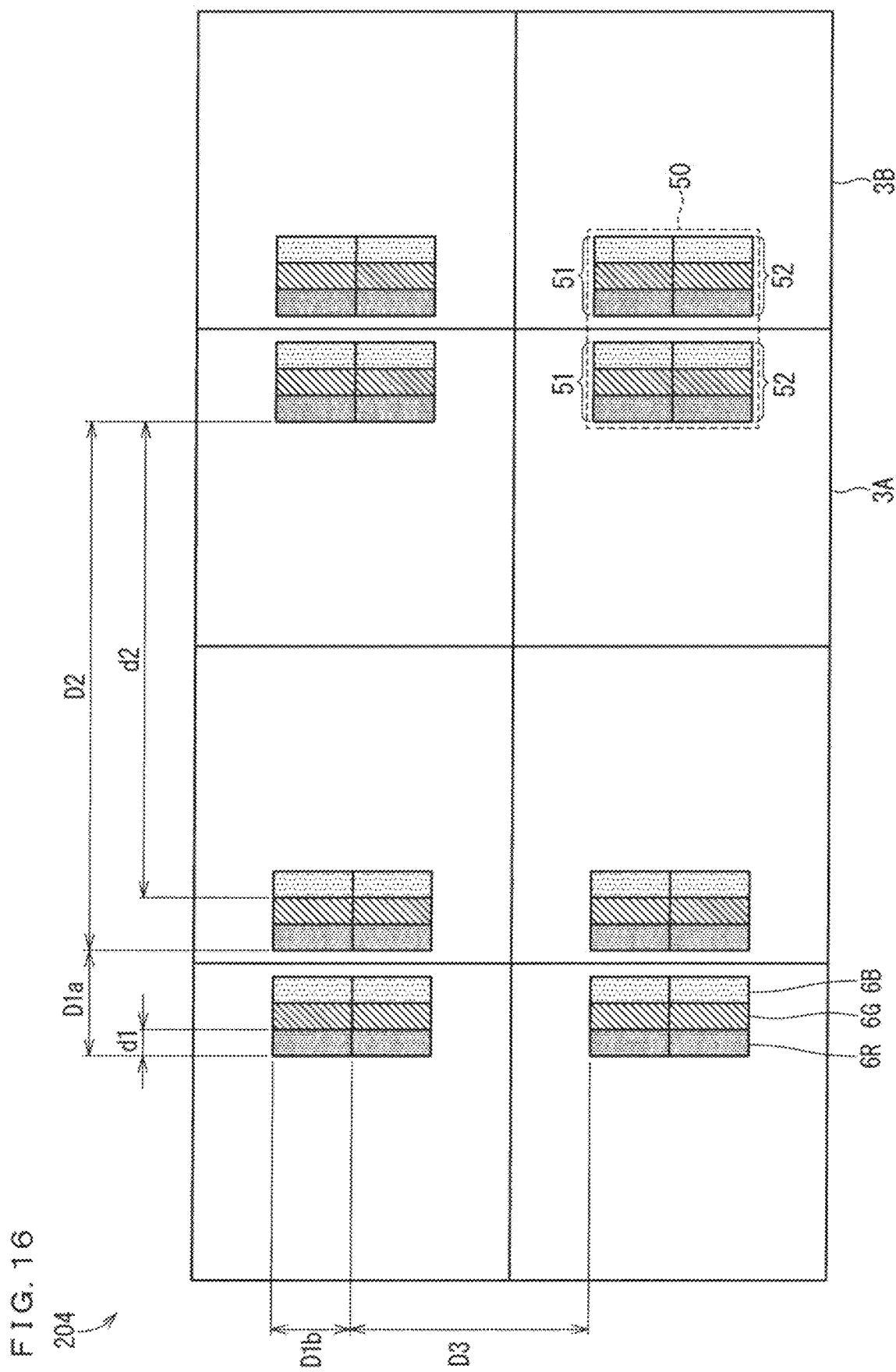
FIG. 16 is an enlarged schematic plan view of the pixel part of the self light emitting apparatus according to a fourth modification of the second embodiment.

FIG. 16 is an enlarged schematic plan view of four pixels 3A and four pixels 3B of a self light emitting apparatus 204 according to a fourth modification of the second embodiment. The self light emitting apparatus 204 is different from the self light emitting apparatus 201 according to the first modification of the second embodiment only in that a gap is provided between the subpixels 51 and 52 of the pixel 3A and the subpixels 51 and 52 of the pixel 3B on the right side of the pixel 3A.

A horizontal array pitch D1$a$ and a vertical array pitch D1$b$ of the plurality of subpixels 51 and 52 in one subpixel group 50 are smaller than horizontal and vertical array pitches D2 and D3 of the subpixels 51 and 52 across adjacent subpixel groups 50, respectively. Similarly, a horizontal array pitch d1 of the LED element 6 in one subpixel group 50 is smaller than a horizontal array pitch d2 of the LED elements 6 across adjacent subpixel groups 50. With this, the subpixel 52 functions as a redundant cell for the subpixel 51.

The four subpixels 51 and 52 being adjacent to each other across the two pixels 3A and 3B with a gap being provided therebetween constitute the subpixel group 50 as an integrated assembly. In other words, the subpixels 51 and 52 in the subpixel group 50 are not structurally divided. Further, the three LED elements 6R, 60, and 6B in each of the subpixels 51 and 52 are not structurally divided either and are integrated. Thus, the 12 LED elements 6 included in the subpixel group 50 are not structurally divided and are integrated. The 12 LED elements 6 are integrated and assembled into one chip, using a semiconductor process. Each subpixel group 50 is formed into one chip by integrating and assembling the 12 LED elements 6 formed on a substrate such as a sapphire substrate, and performing singulation, with the 12 LED elements 6 being one unit. In the self light emitting apparatus 204, a gap is provided between the subpixels 51 and 52 of the pixel 3A and the subpixels 51 and 52 of the pixel 3B on the right side of the pixel 3A, and therefore mixing of colors between the pixels 3A and 3B can be hindered, similarly to the third modification of the second embodiment.

<B-3-5. Fifth Modification>

Figure 17:
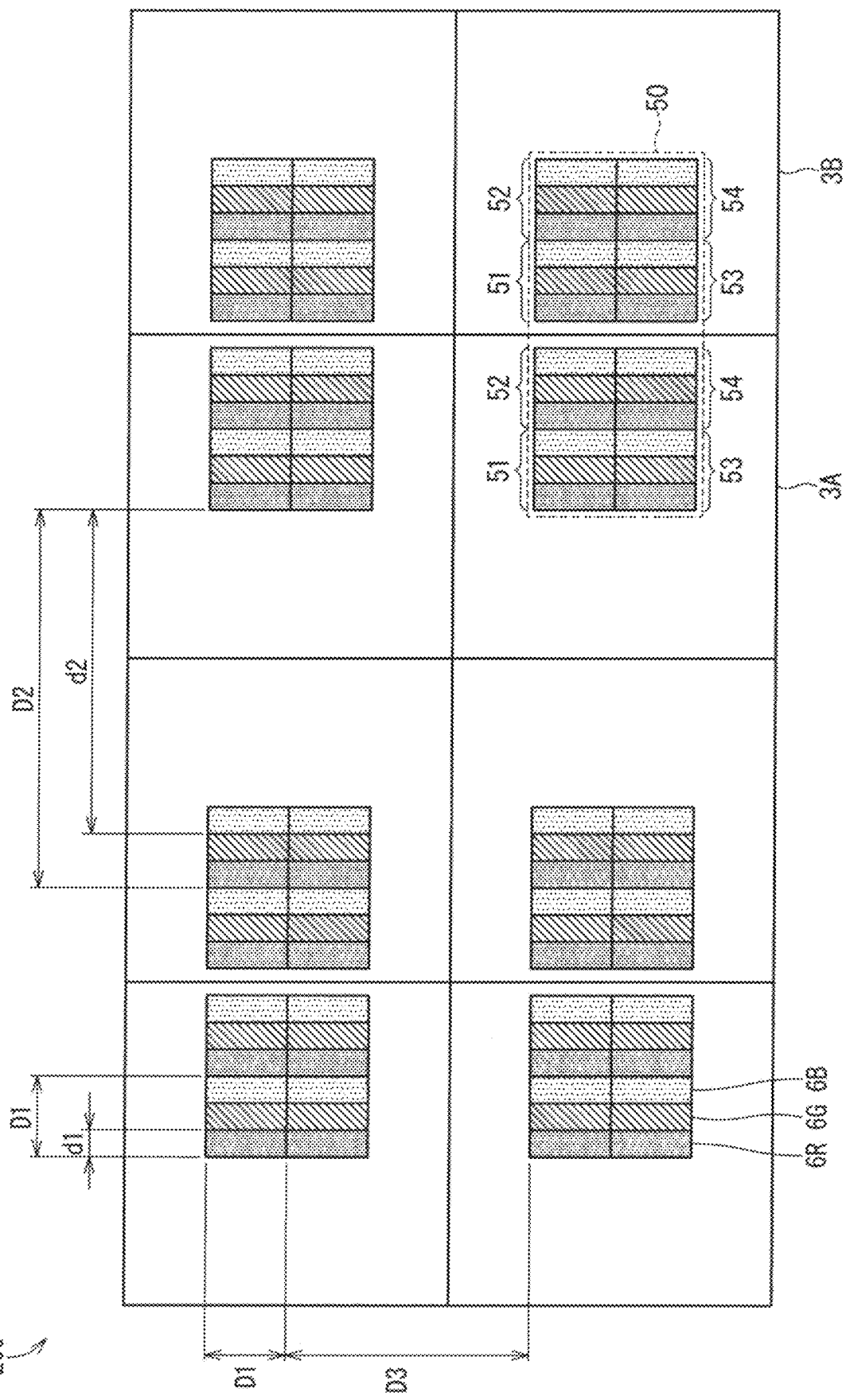
FIG. 17 is an enlarged schematic plan view of the pixel part of the self light emitting apparatus according to a fifth modification of the second embodiment.

FIG. 17 is an enlarged schematic plan view of four pixels 3A and four pixels 3B of a self light emitting apparatus 205 according to a fifth modification of the second embodiment. The self light emitting apparatus 205 is different from the self light emitting apparatus 202 according to the second modification of the second embodiment only in that a gap is provided between the subpixels 52 and 54 of the pixel 3A and the subpixels 51 and 53 of the pixel 3B on the right side of the pixel 3A. The eight subpixels 51 to 54 being adjacent to each other across the two pixels 3A and 3B with a gap being provided therebetween constitute the subpixel group 50 as an integrated assembly. In other words, the subpixels 51 to 54 in the subpixel group 50 are not structurally divided. Further, the three LED elements 6R, 6G, and 6B in each of the subpixels 51 to 54 are not structurally divided either and are integrated. Thus, the 24 LED elements 6 included in the subpixel group 50 are not structurally divided and are integrated. The 24 LED elements 6 are integrated and assembled into one chip, using a semiconductor process. Each subpixel group 50 is formed into one chip by integrating and assembling the 24 LED elements 6 formed on a substrate such as a sapphire substrate, and performing singulation, with the 24 LED elements 6 being one unit. In the self light emitting apparatus 205, a gap is provided between the subpixels 52 and 54 of the pixel 3A and the subpixels 51 and 53 of the pixel 3B on the right side of the pixel 3A, and therefore mixing of colors between the pixels 3A and 3B can be hindered, similarly to the third and fourth modifications of the second embodiment.

<B-3-6. Sixth Modification>

Figure 18:
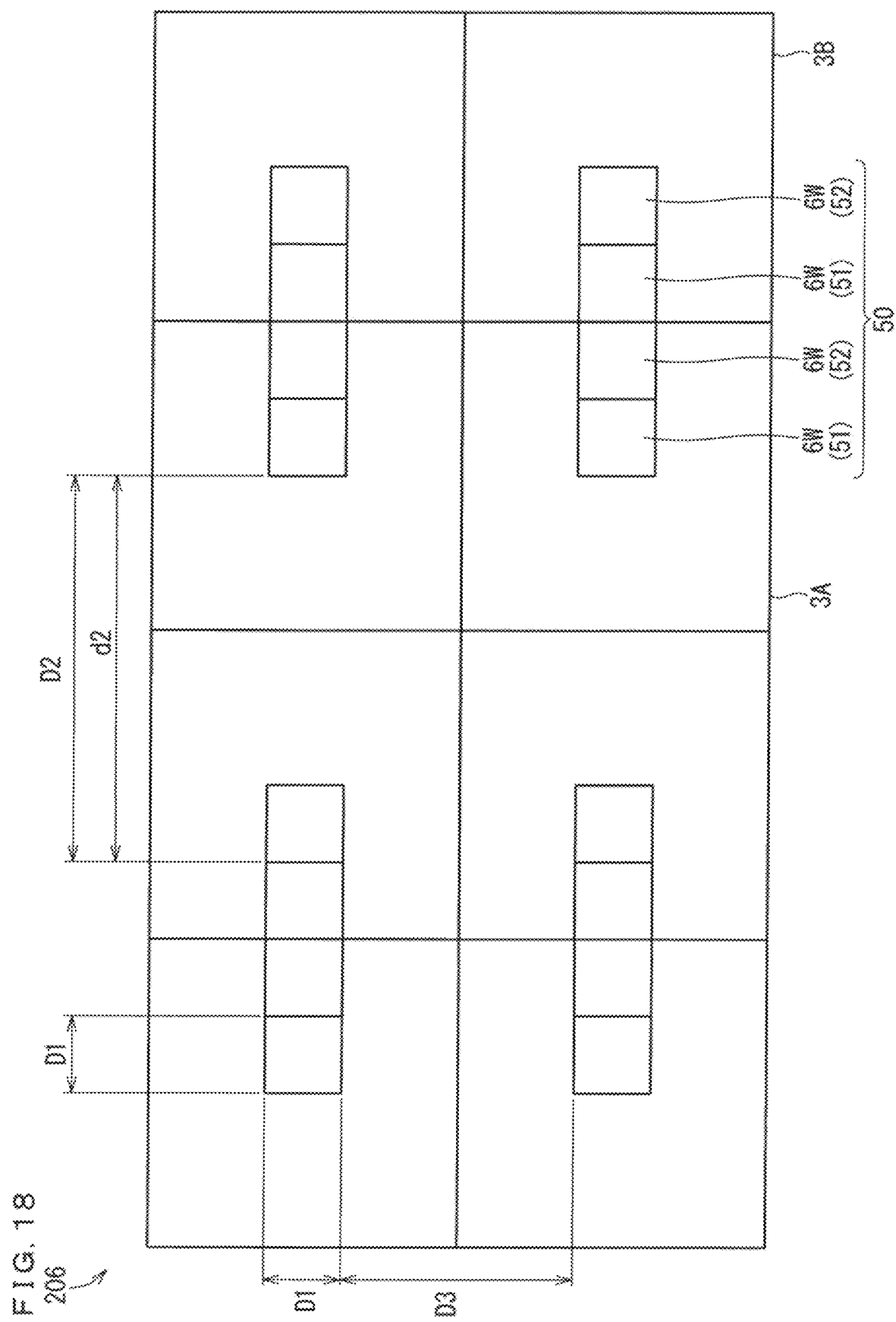
FIG. 18 is an enlarged schematic plan view of the pixel part of the self light emitting apparatus according to a sixth modification of the second embodiment.

FIG. 18 is an enlarged schematic plan view of four pixels 3A and four pixels 3B of a self light emitting apparatus 206 according to a sixth modification of the second embodiment. The self light emitting apparatus 206 is obtained by applying the third modification of the first embodiment to the second embodiment. The self light emitting apparatus 206 is different from the self light emitting apparatus 200 according to the second embodiment only in that each of the subpixels 51 and 52 includes one LED element 6W that emits white light.

According to the self light emitting apparatus 206, when a full color display is not needed, quantity of light can be adjusted for each pixel 3. For example, by using the self light emitting apparatus 206 as a backlight of a liquid crystal display apparatus and adjusting the quantity of light for each pixel 3 depending on a display image of the liquid crystal display apparatus, the contrast ratio of the liquid crystal display apparatus can be enhanced.

<B-3-7. Seventh Modification>

Figure 19:
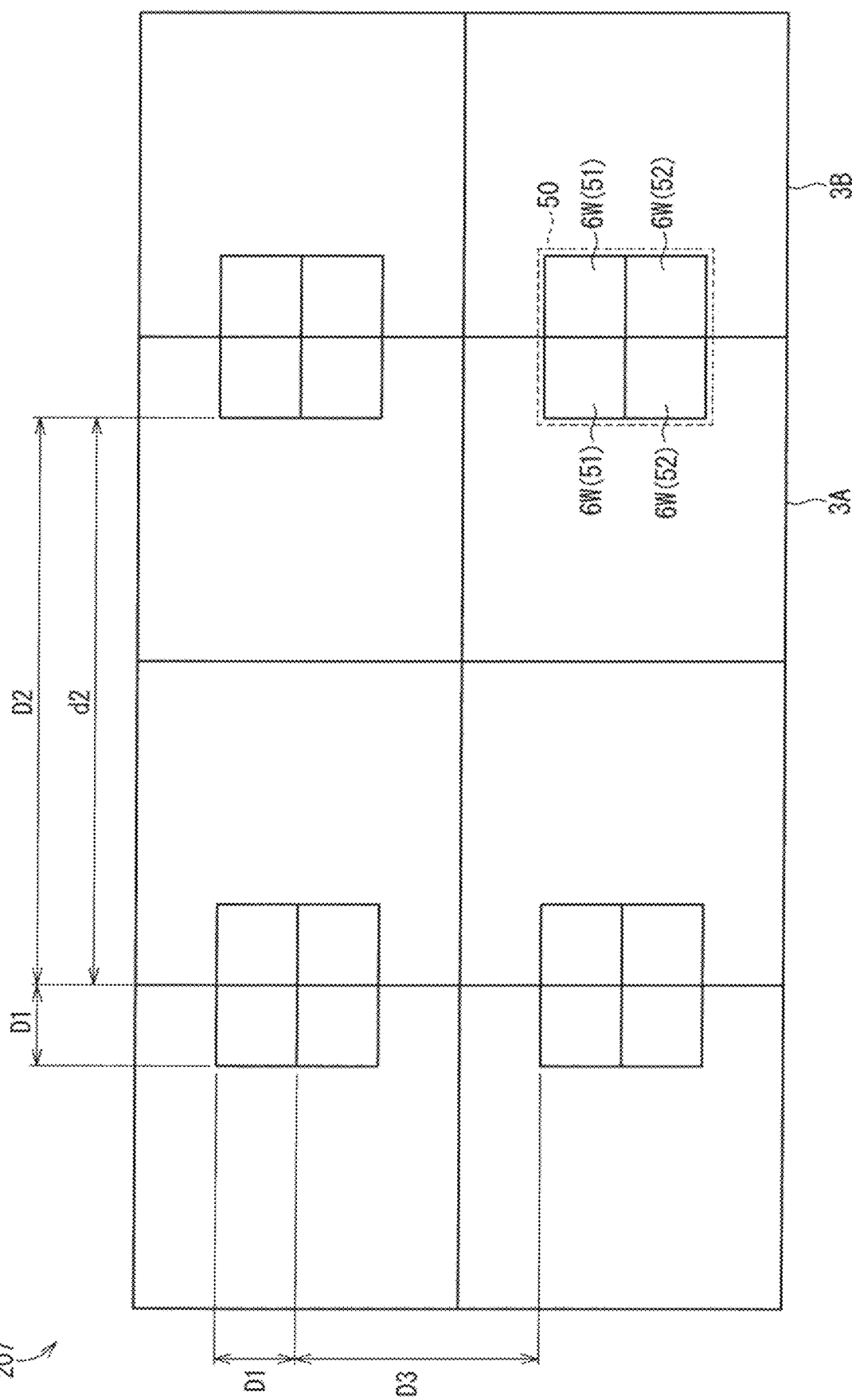
FIG. 19 is an enlarged schematic plan view of the pixel part of the self light emitting apparatus according to a seventh modification of the second embodiment.

FIG. 19 is an enlarged schematic plan view of four pixels 3A and four pixels 3B of a self light emitting apparatus 207 according to a seventh modification of the second embodiment. The self light emitting apparatus 207 is obtained by applying the fourth modification of the first embodiment to the second embodiment. The self light emitting apparatus 207 is different from the self light emitting apparatus 201 according to the first modification of the second embodiment only in that each of subpixels 51 and 52 includes one LED element 6W that emits white light.

According to the self light emitting apparatus 207, when a full color display is not needed, quantity of light can be adjusted for each pixel 3. For example, by using the self light emitting apparatus 207 as a backlight of a liquid crystal display apparatus and adjusting the quantity of light for each pixel 3 depending on a display image of the liquid crystal display apparatus, the contrast ratio of the liquid crystal display apparatus can be enhanced.

<B-3-8. Eighth Modification>

Figure 20:
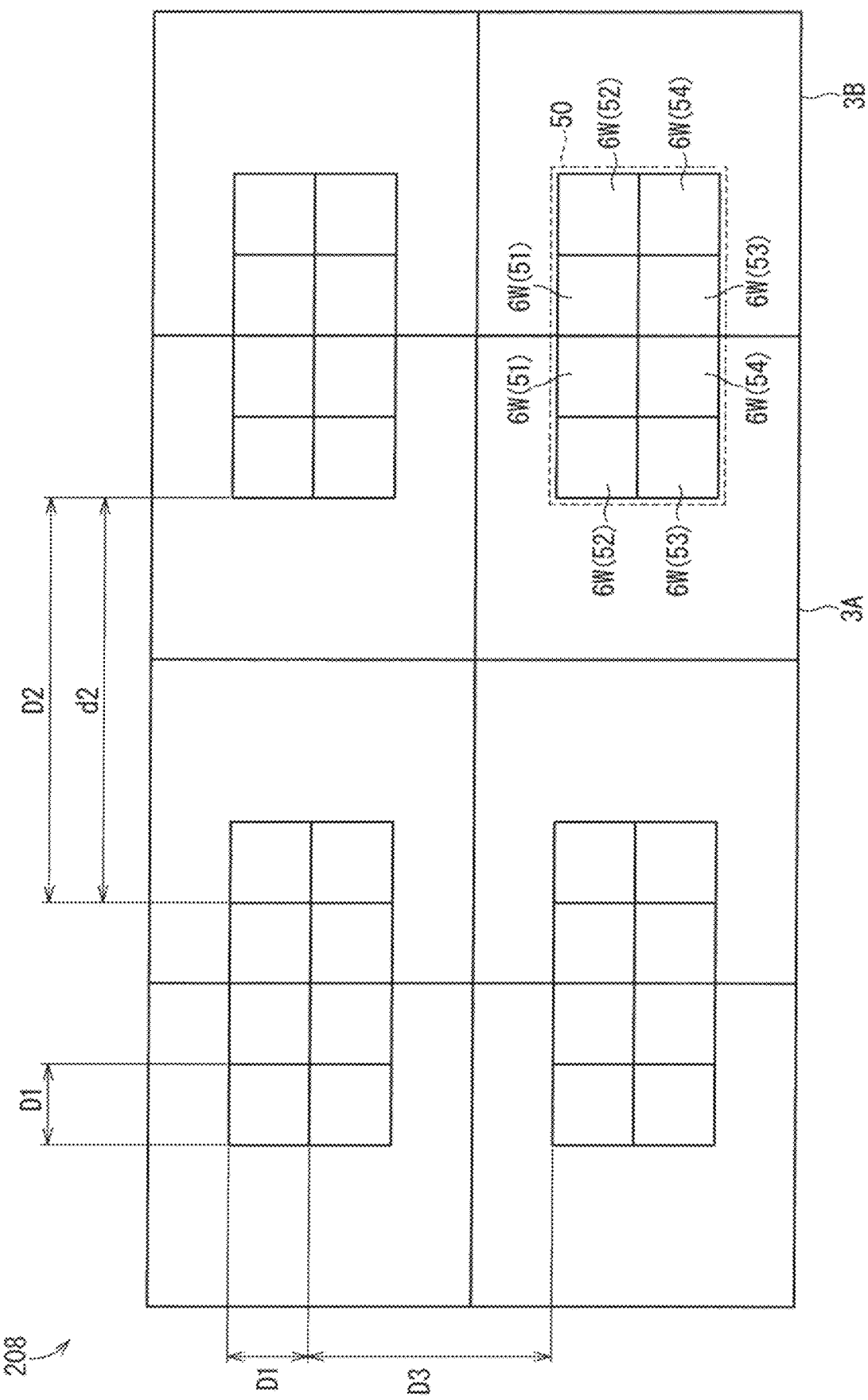
FIG. 20 is an enlarged schematic plan view of the pixel part of the self light emitting apparatus according to an eighth modification of the second embodiment.

FIG. 20 is an enlarged schematic plan view of four pixels 3A and four pixels 3B of a self light emitting apparatus 208 according to an eighth modification of the second embodiment. The self light emitting apparatus 208 is obtained by applying the fifth modification of the first embodiment to the second embodiment. The self light emitting apparatus 208 is different from the self light emitting apparatus 202 according to the second modification of the second embodiment only in that each of the subpixels 51 to 54 includes one LED element 6W that emits white light.

According to the self light emitting apparatus 208, when a full color display is not needed, quantity of light can be adjusted for each pixel 3. For example, by using the self light emitting apparatus 208 as a backlight of a liquid crystal display apparatus and adjusting the quantity of light for each pixel 3 depending on a display image of the liquid crystal display apparatus, the contrast ratio of the liquid crystal display apparatus can be enhanced.

<B-3-9. Ninth Modification>

Figure 21:
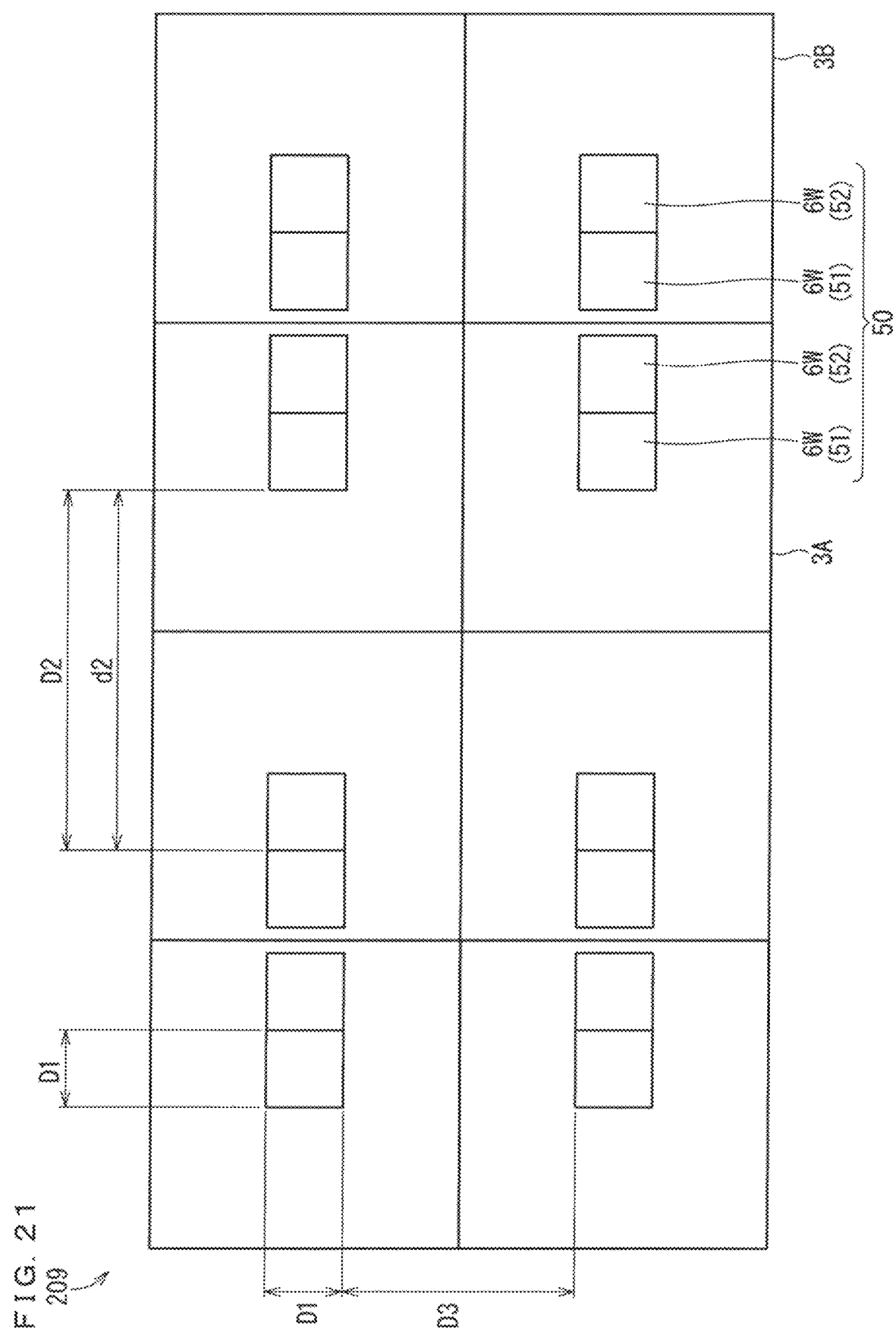
FIG. 21 is an enlarged schematic plan view of the pixel part of the self light emitting apparatus according to a ninth modification of the second embodiment.

FIG. 21 is an enlarged schematic plan view of four pixels 3A and four pixels 3B of a self light emitting apparatus 209 according to a ninth modification of the second embodiment. The self light emitting apparatus 209 is different from the self light emitting apparatus 206 according to the sixth modification of the second embodiment only in that a gap is provided between the subpixel 52 of the pixel 3A and the subpixel 51 of the pixel 3B on the right side of the pixel 3A. Further, the self light emitting apparatus 209 is different from the self light emitting apparatus 203 according to the third modification of the second embodiment only in that each of the subpixels 51 and 52 includes one LED element 6W that emits white light. The four subpixels 51 and 52 being adjacent to each other across the two pixels 3A and 3B with a gap being provided therebetween constitute the subpixel group 50 as an integrated assembly. In other words, the subpixels 51 and 52 in the subpixel group 50 are not structurally divided. Thus, the four LED elements 6W included in the subpixel group 50 are not structurally divided and are integrated. The four LED elements 6W are integrated and assembled into one chip, using a semiconductor process. Each subpixel group 50 is formed into one chip by integrating and assembling the four LED elements 6W formed on a substrate such as a sapphire substrate, and performing singulation, with the four LED elements 6W being one unit. In the self light emitting apparatus 209, a gap is provided between the subpixel 52 of the pixel 3A and the subpixel 51 of the pixel 3B on the right side of the pixel 3A, and therefore mixing of colors between the pixels 3A and 3B can be hindered, similarly to the third to fifth modifications of the second embodiment.

<B-3-10. Tenth Modification>

Figure 22:
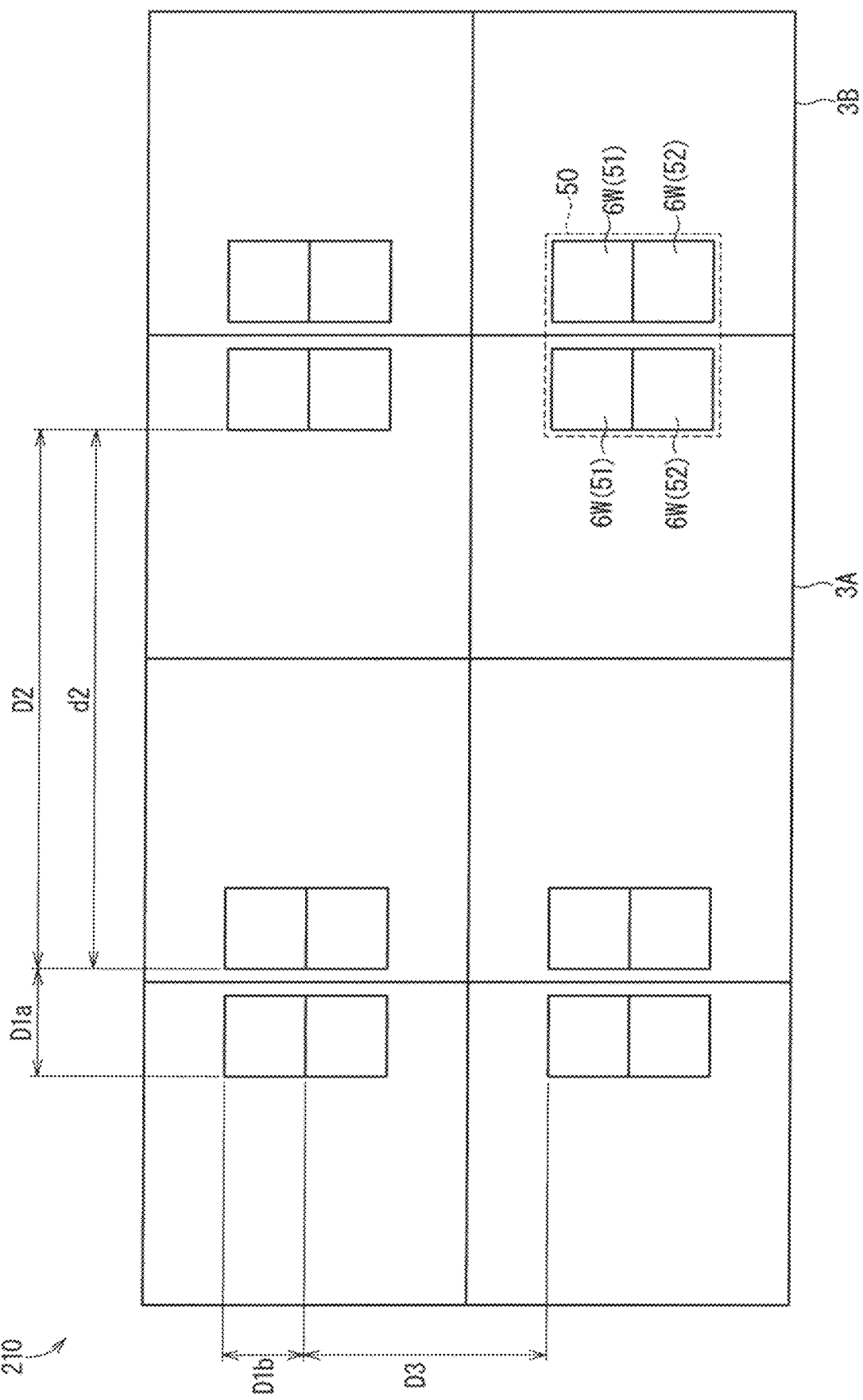
FIG. 22 is an enlarged schematic plan view of the pixel part of the self light emitting apparatus according to a tenth modification of the second embodiment.

FIG. 22 is an enlarged schematic plan view of four pixels 3A and four pixels 3B of a self light emitting apparatus 210 according to a tenth modification of the second embodiment. The self light emitting apparatus 210 is different from the self light emitting apparatus 207 according to the seventh modification of the second embodiment only in that a gap is provided between the subpixels 51 and 52 of the pixel 3A and the subpixels 51 and 52 of the pixel 3B on the right side of the pixel 3A. Further, the self light emitting apparatus 210 is different from the self light emitting apparatus 204 according to the fourth modification of the second embodiment only in that each of the subpixels 51 and 52 includes one LED element 6W that emits white light.

A horizontal array pitch D1$a$ and a vertical array pitch D1$b$ of the plurality of subpixels 51 and 52 in one subpixel group 50 are smaller than horizontal and vertical array pitches D2 and D3 of the subpixels 51 and 52 across adjacent subpixel groups 50, respectively. Similarly, a horizontal array pitch d1 of the LED element 6 in one subpixel group 50 is smaller than a horizontal array pitch d2 of the LED elements 6 across adjacent subpixel groups 50. With this, the subpixel 52 functions as a redundant cell for the subpixel 51.

The four subpixels 51 and 52 being adjacent to each other across the two pixels 3A and 3B with a gap being provided therebetween constitute the subpixel group 50 as an integrated assembly. In other words, the subpixels 51 and 52 in the subpixel group 50 are not structurally divided. Thus, the four LED elements 6W included in the subpixel group 50 are not structurally divided and are integrated. The four LED elements 6W are integrated and assembled into one chip, using a semiconductor process. Each subpixel group 50 is formed into one chip by integrating and assembling the four LED elements 6W formed on a substrate such as a sapphire substrate, and performing singulation, with the four LED elements 6W being one unit. In the self light emitting apparatus 210, a gap is provided between the subpixels 51 and 52 of the pixel 3A and the subpixels 51 and 52 of the pixel 3B on the right side of the pixel 3A, and therefore mixing of colors between the pixels 3A and 3B can be hindered, similarly to the third to fifth and ninth modifications of the second embodiment.

<B-3-11. Eleventh Modification>

Figure 23:
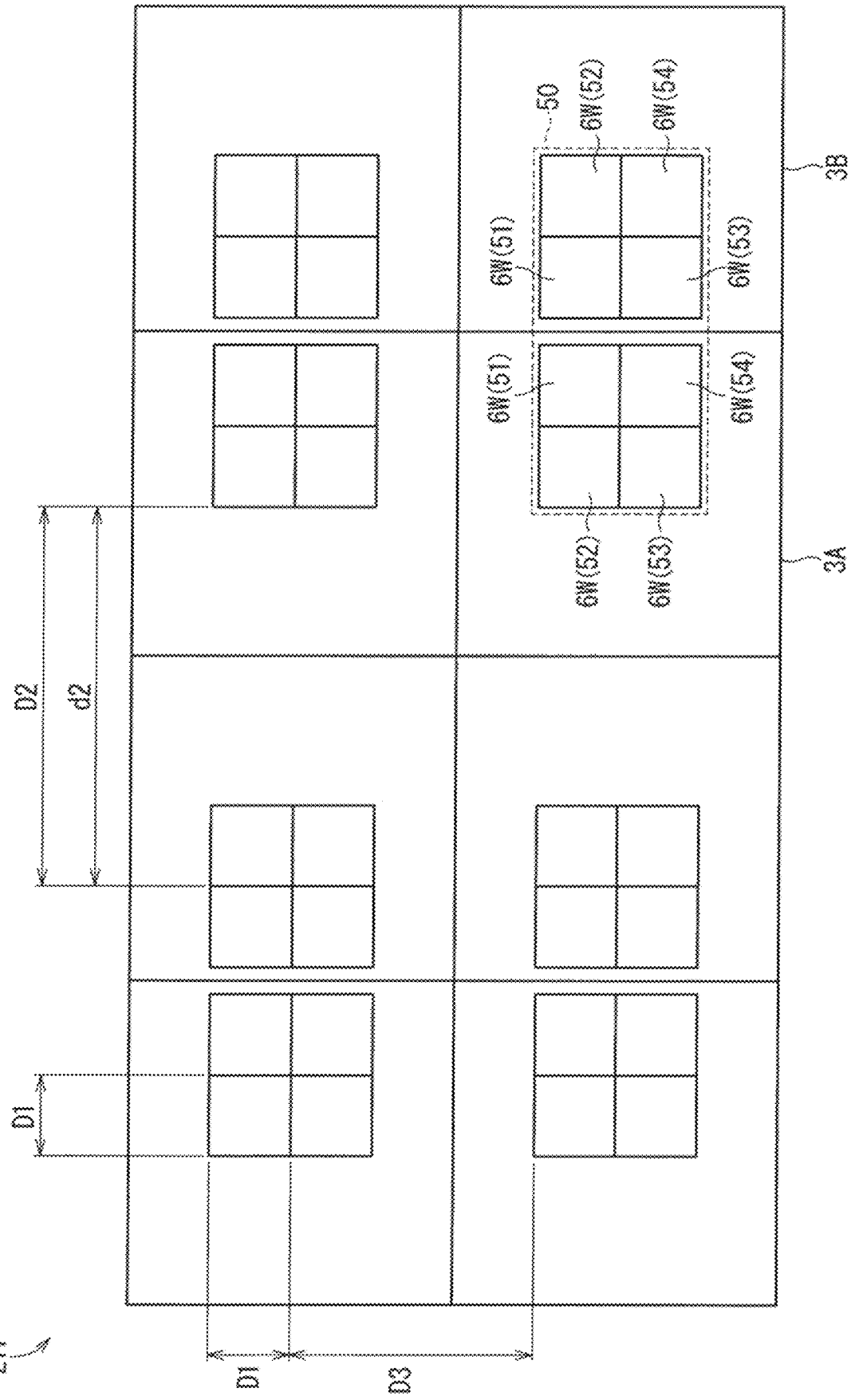
FIG. 23 is an enlarged schematic plan view of the pixel part of the self light emitting apparatus according to an eleventh modification of the second embodiment.

FIG. 23 is an enlarged schematic plan view of four pixels 3A and four pixels 3B of a self light emitting apparatus 211 according to an eleventh modification of the second embodiment. The self light emitting apparatus 211 is different from the self light emitting apparatus 208 according to the eighth modification of the second embodiment only in that a gap is provided between the subpixels 52 and 54 of the pixel 3A and the subpixels 51 and 53 of the pixel 3B on the right side of the pixel 3A. Further, the self light emitting apparatus 211 is different from the self light emitting apparatus 205 according to the fifth modification of the second embodiment only in that each of the subpixels 51 and 52 includes one LED element 6W that emits white light. The eight subpixels 51 to 54 being adjacent to each other across the two pixels 3A and 3B with a gap being provided therebetween constitute the subpixel group 50 as an integrated assembly. In other words, the subpixels 51 to 54 in the subpixel group 50 are not structurally divided. Thus, the eight LED elements 6W included in the subpixel group 50 are not structurally divided and are integrated. The eight LED elements 6W are integrated and assembled into one chip, using a semiconductor process. Each subpixel group 50 is formed into one chip by integrating and assembling the eight LED elements 6W formed on a substrate such as a sapphire substrate, and performing singulation, with the eight LED elements 6W being one unit. In the self light emitting apparatus 211, a gap is provided between the subpixels 52 and 54 of the pixel 3A and the subpixels 51 and 53 of the pixel 3B on the right side of the pixel 3A, and therefore mixing of colors between the pixels 3A and 3B can be hindered, similarly to the third to fifth, ninth, and tenth modifications of the second embodiment.

<B-3-12. Twelfth Modification>

Figure 24:
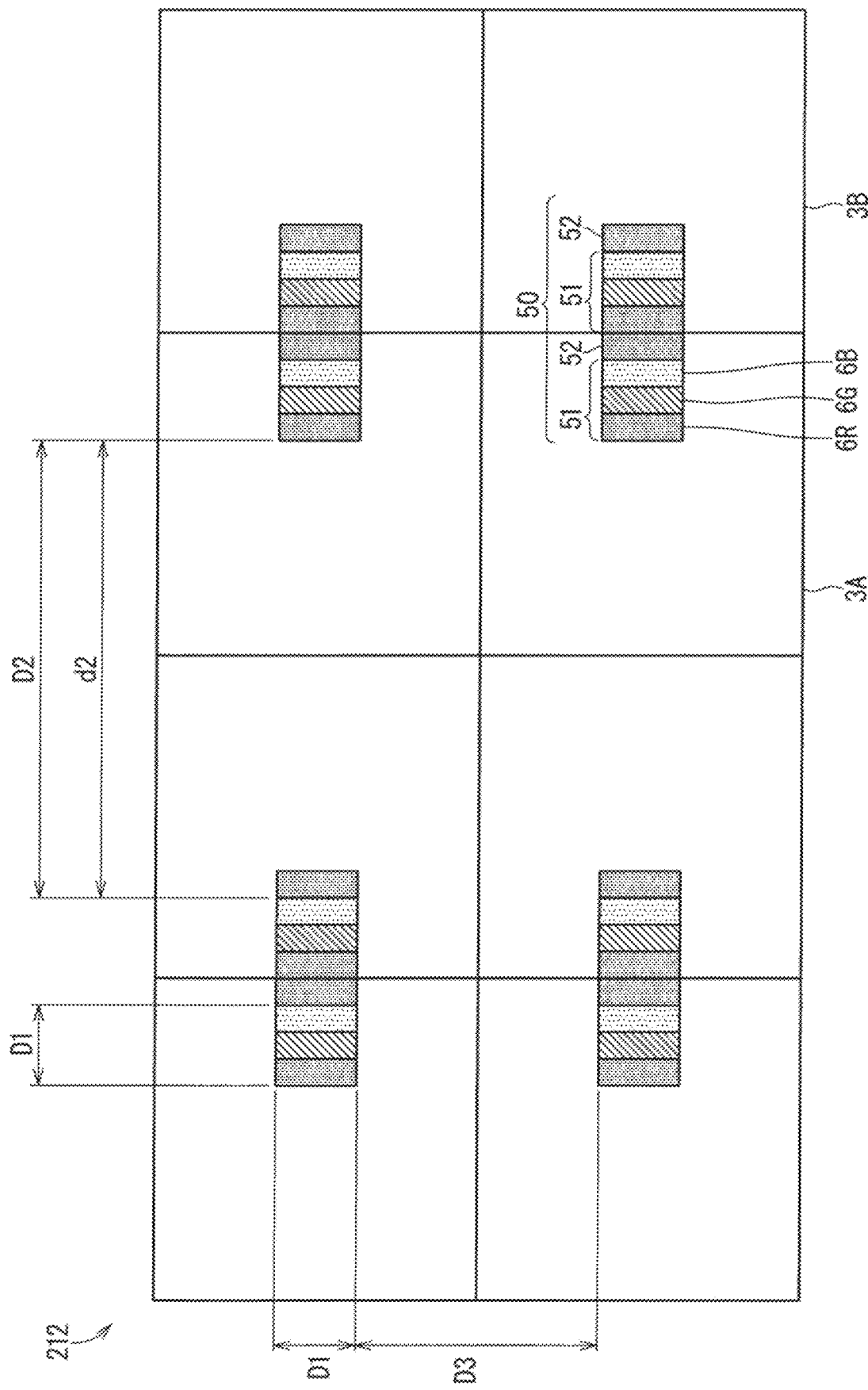
FIG. 24 is an enlarged schematic plan view of the pixel part of the self light emitting apparatus according to a twelfth modification of the second embodiment.

FIG. 24 is an enlarged schematic plan view of four pixels 3A and four pixels 3B of a self light emitting apparatus 212 according to a twelfth modification of the second embodiment. The self light emitting apparatus 212 is obtained by applying the sixth modification of the first embodiment to the second embodiment. The self light emitting apparatus 212 is different from the self light emitting apparatus 200 according to the second embodiment only in that the subpixel 52 includes one LED element 6R.

In the self light emitting apparatus 212, the subpixel 52 includes one LED element 6R, and thus the configuration thereof is simplified as compared to the self light emitting apparatus 200 according to the second embodiment whose subpixel 52 includes the LED elements 6R, 60, and 6B. Further, according to the self light emitting apparatus 212, even if a failure occurs in the LED element 6R of the subpixel 51, a pixel defect does not occur as long as a defect does not occur in the LED element 6R of the subpixel 52. Accordingly, reduction of a yield of the self light emitting apparatus 212 can be hindered to a certain degree. In the present modification, the subpixel 52 includes the LED element 6R. However, the subpixel 52 may include the LED element 6G or the LED element 6B. For example, by employing an LED element of a specific color that is liable to cause a failure as the subpixel 52, reduction of a yield of the self light emitting apparatus 212 can be efficiently hindered.

<B-3-13. Thirteenth Modification>

Figure 25:
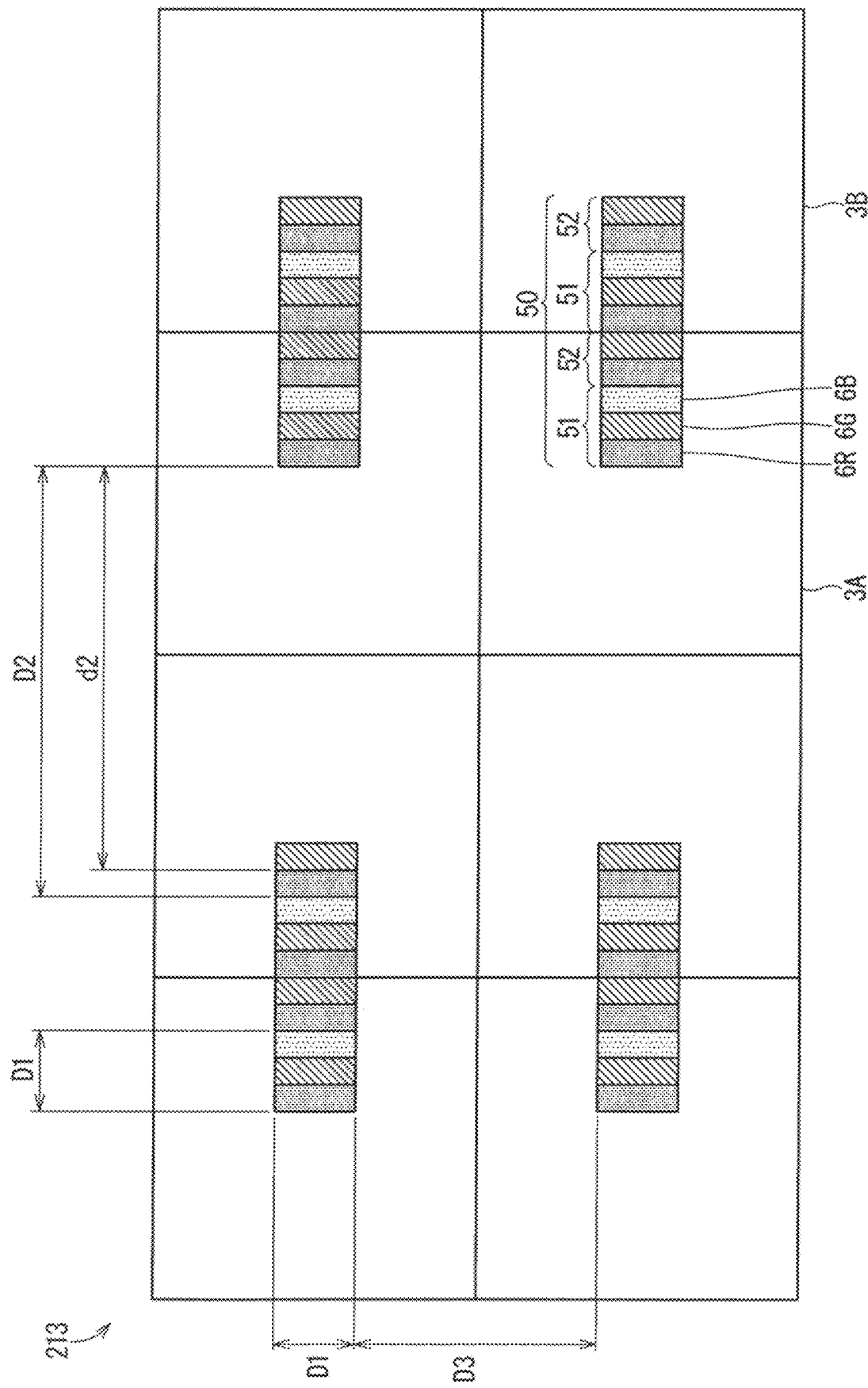
FIG. 25 is an enlarged schematic plan view of the pixel part of the self light emitting apparatus according to a thirteenth modification of the second embodiment.

FIG. 25 is an enlarged schematic plan view of four pixels 3A and four pixels 3B of a self light emitting apparatus 213 according to a thirteenth modification of the second embodiment. The self light emitting apparatus 213 is obtained by applying the seventh modification of the first embodiment to the second embodiment. The self light emitting apparatus 213 is different from the self light emitting apparatus 200 according to the second embodiment only in that the subpixel 52 includes the LED element 6R and the LED element 6G.

In the self light emitting apparatus 213, the subpixel 52 includes the LED elements 6R and 6G, and thus the configuration thereof is simplified as compared to the self light emitting apparatus 200 according to the second embodiment whose subpixel 52 includes the LED elements 6R, 6G, and 6B. Further, according to the self light emitting apparatus 213, even if a failure occurs in the LED elements 6R and 6G of the subpixel 51, a pixel defect does not occur as long as a defect does not occur in the same colors of the LED elements 6R and 6G in the subpixel 52. Accordingly, reduction of a yield of the self light emitting apparatus 213 can be hindered to a certain degree. In the present modification, the subpixel 52 includes the LED elements 6R and 6G. However, the subpixel 52 may include a combination of any two LED elements out of the LED elements 6R, 6G, and 6B. For example, by employing an LED element of a specific color that is liable to cause a failure as the subpixel 52, reduction of a yield of the self light emitting apparatus 213 can be efficiently hindered.

<B-3-14. Fourteenth Modification>

Figure 26:
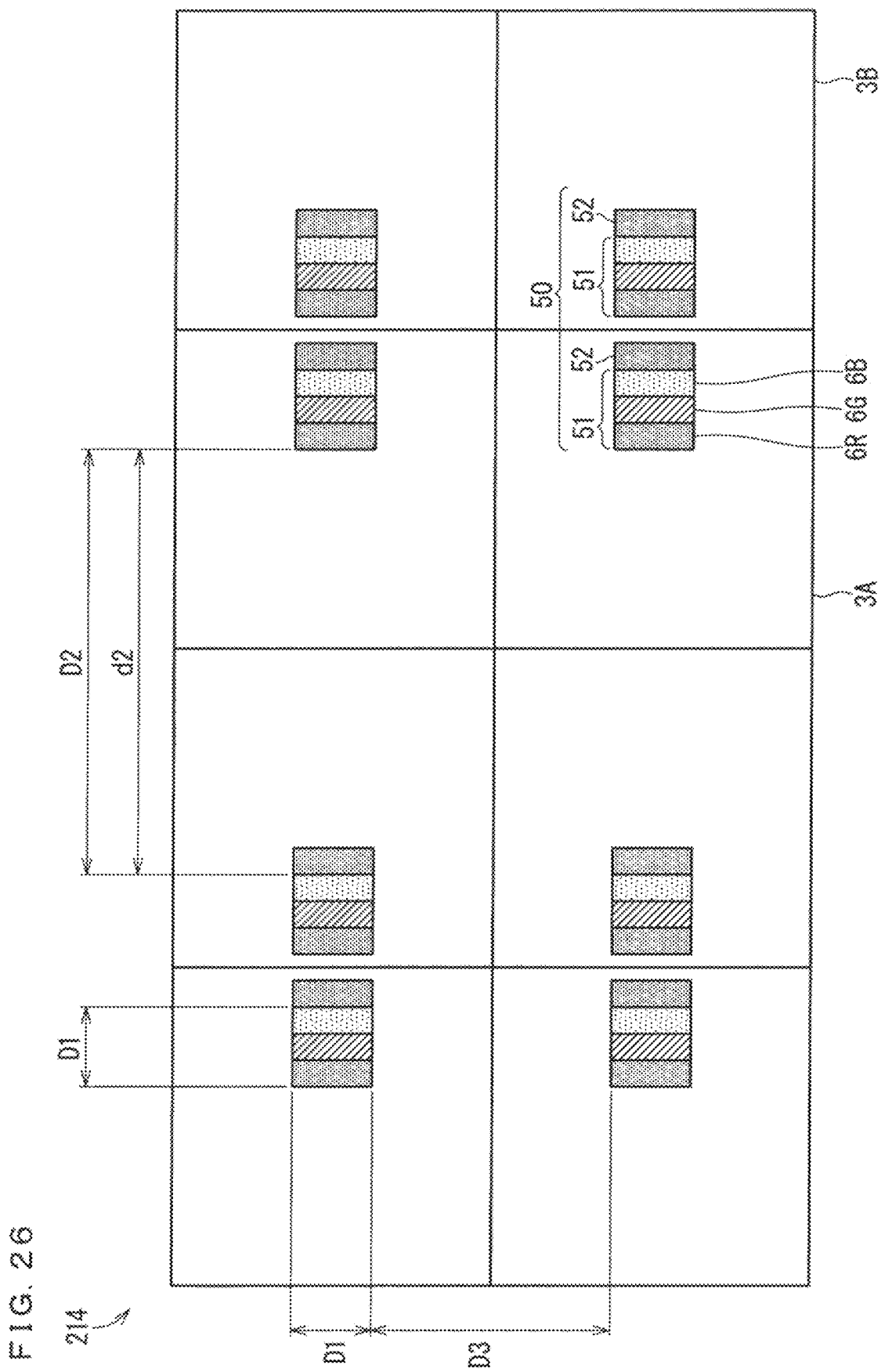
FIG. 26 is an enlarged schematic plan view of the pixel part of the self light emitting apparatus according to a fourteenth modification of the second embodiment.

FIG. 26 is an enlarged schematic plan view of four pixels 3A and four pixels 3B of a self light emitting apparatus 214 according to a fourteenth modification of the second embodiment. The self light emitting apparatus 214 is different from the self light emitting apparatus 212 according to the twelfth modification of the second embodiment only in that a gap is provided between the subpixel 52 of the pixel 3A and the subpixel 51 of the pixel 3B on the right side of the pixel 3A. The four subpixels 51 and 52 being adjacent to each other across the two pixels 3A and 3B with a gap being provided therebetween constitute the subpixel group 50 as an integrated assembly. In other words, the subpixels 51 and 52 in the subpixel group 50 are not structurally divided. Further, the three LED elements 6R, 6G, and 6B in the subpixel 51 are not structurally divided either and are integrated. Thus, the eight LED elements 6 included in the subpixel group 50 are not structurally divided and are integrated. The eight LED elements 6 are integrated and assembled into one chip, using a semiconductor process. Each subpixel group 50 is formed into one chip by integrating and assembling the eight LED elements 6 formed on a substrate such as a sapphire substrate, and performing singulation, with the eight LED elements 6 being one unit.

In the self light emitting apparatus 212 according to the twelfth modification of the second embodiment, the distance between the subpixels is small between the adjacent pixels 3A and 3B, and thus there is a fear of mixing of colors between the pixels 3A and 3B. However, in the self light emitting apparatus 214, a gap is provided between the subpixel 52 of the pixel 3A and the subpixel 51 of the pixel 3B on the right side of the pixel 3A, and therefore mixing of colors can be hindered.

<B-3-15. Fifteenth Modification>

Figure 27:
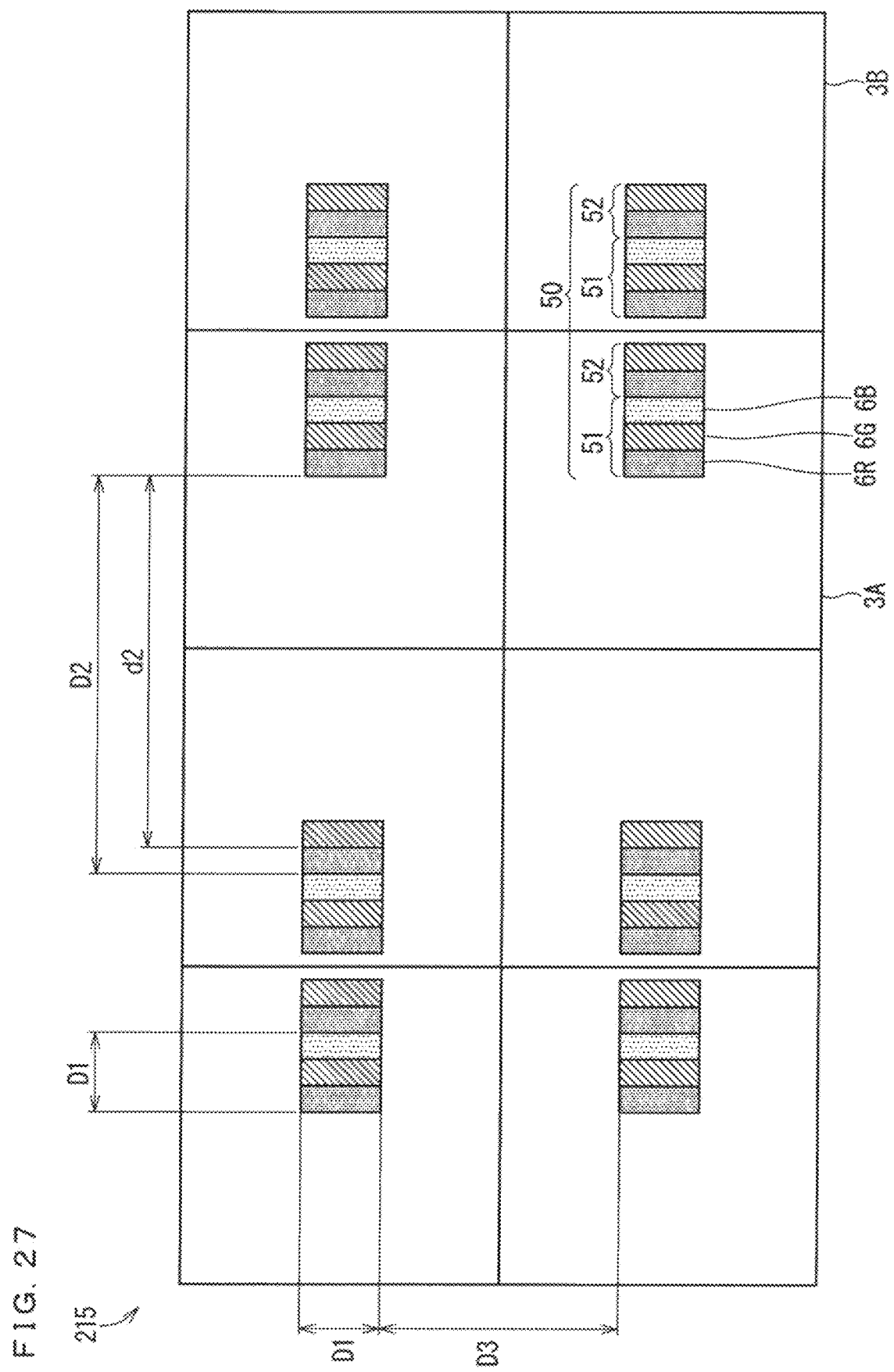
FIG. 27 is an enlarged schematic plan view of the pixel part of the self light emitting apparatus according to a fifteenth modification of the second embodiment.

FIG. 27 is an enlarged schematic plan view of four pixels 3A and four pixels 3B of a self light emitting apparatus 215 according to a fifteenth modification of the second embodiment. The self light emitting apparatus 215 is different from the self light emitting apparatus 213 according to the thirteenth modification of the second embodiment only in that a gap is provided between the subpixel 52 of the pixel 3A and the subpixel 51 of the pixel 3B on the right side of the pixel 3A. The four subpixels 51 and 52 being adjacent to each other across the two pixels 3A and 3B with a gap being provided therebetween constitute the subpixel group 50 as an integrated assembly. In other words, the subpixels 51 and 52 in the subpixel group 50 are not structurally divided. Further, the three LED elements 6R, 6G, and 6B in the subpixel 51 and the two LED elements 6R and 60 in the subpixel 52 are not structurally divided either and are integrated. Thus, the 10 LED elements 6 included in the subpixel group 50 are not structurally divided and are integrated. The 10 LED elements 6 are integrated and assembled into one chip, using a semiconductor process. Each subpixel group 50 is formed into one chip by integrating and assembling the 10 LED elements 6 formed on a substrate such as a sapphire substrate, and performing singulation, with the 10 LED elements 6 being one unit.

In the self light emitting apparatus 213 according to the thirteenth modification of the second embodiment, the distance between the subpixels is small between the adjacent pixels 3A and 3B, and thus there is a fear of mixing of colors between the pixels 3A and 3B. However, in the self light emitting apparatus 215, a gap is provided between the subpixel 52 of the pixel 3A and the subpixel 51 of the pixel 3B on the right side of the pixel 3A, and therefore mixing of colors can be hindered.

C. Third Embodiment

<C-1. Configuration>

Figure 28:
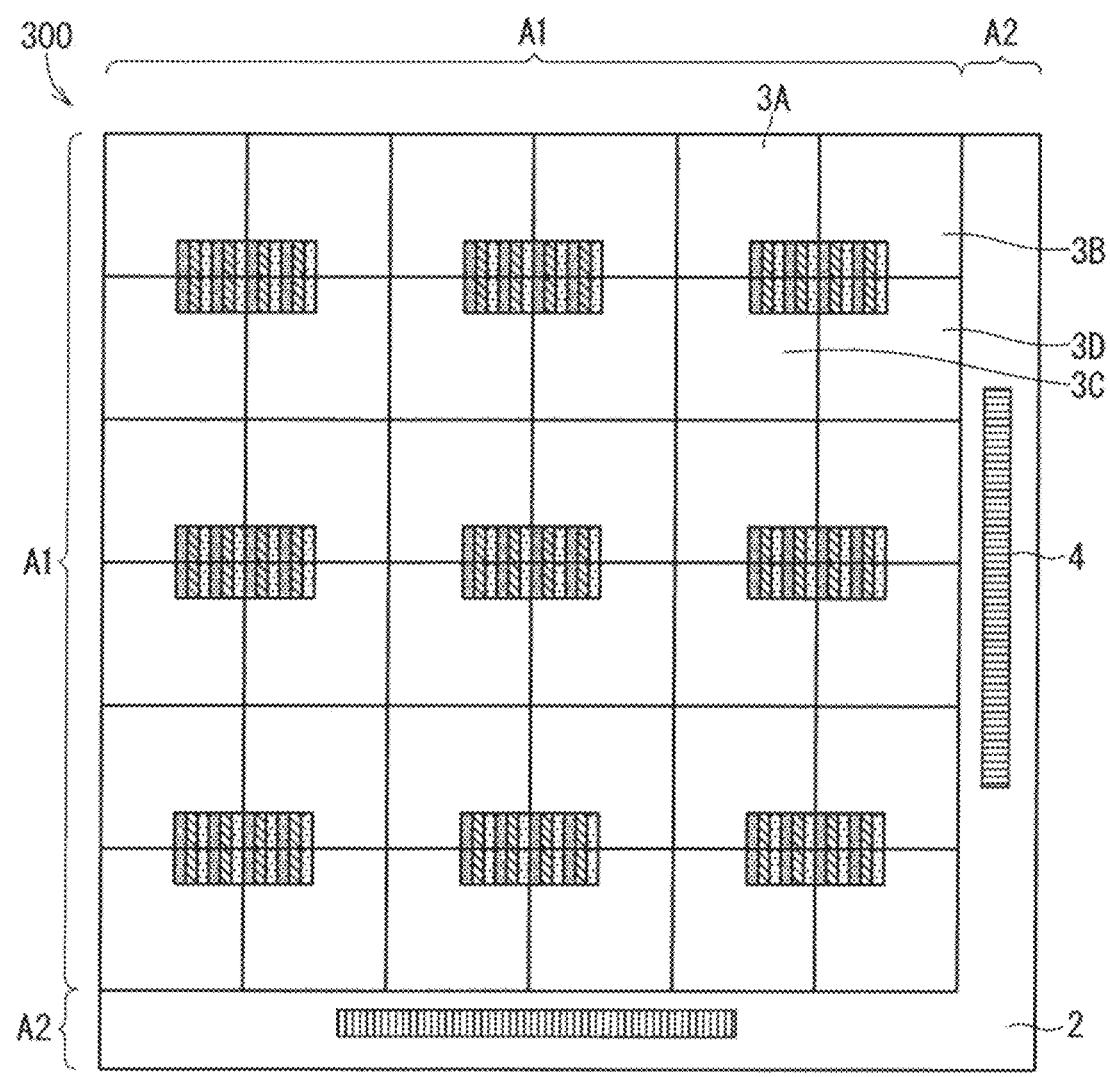
FIG. 28 is a schematic plan view illustrating a configuration of a self light emitting apparatus according to the third embodiment.

FIG. 28 is a schematic plan view illustrating a configuration of a self light emitting apparatus 300 according to the third embodiment. In the self light emitting apparatus 100 according to the first embodiment, the subpixels are disposed at the center of the pixel 3, whereas in the self light emitting apparatus 300, the subpixels are disposed at a lower right corner, a lower left corner, an upper right corner, or an upper left corner of the pixel 3. In the present embodiment, for the sake of distinction, a pixel 3 in which the subpixels are disposed at the lower right corner is referred to as a pixel 3A, a pixel 3 in which the subpixels are disposed at the lower left corner is referred to as a pixel 3B, a pixel 3 in which the subpixels are disposed at the upper right corner is referred to as a pixel 3C, and a pixel 3 in which the subpixels are disposed at the upper left corner is referred to as a pixel 3D. In the active area A1 of the self light emitting apparatus 300, the pixel 3A and the pixel 3B are alternately arrayed in the horizontal direction, the pixel 3A and the pixel 3C are alternately arrayed in the vertical direction, and the pixel 3B and the pixel 3D are alternately arrayed in the vertical direction.

Figure 29:
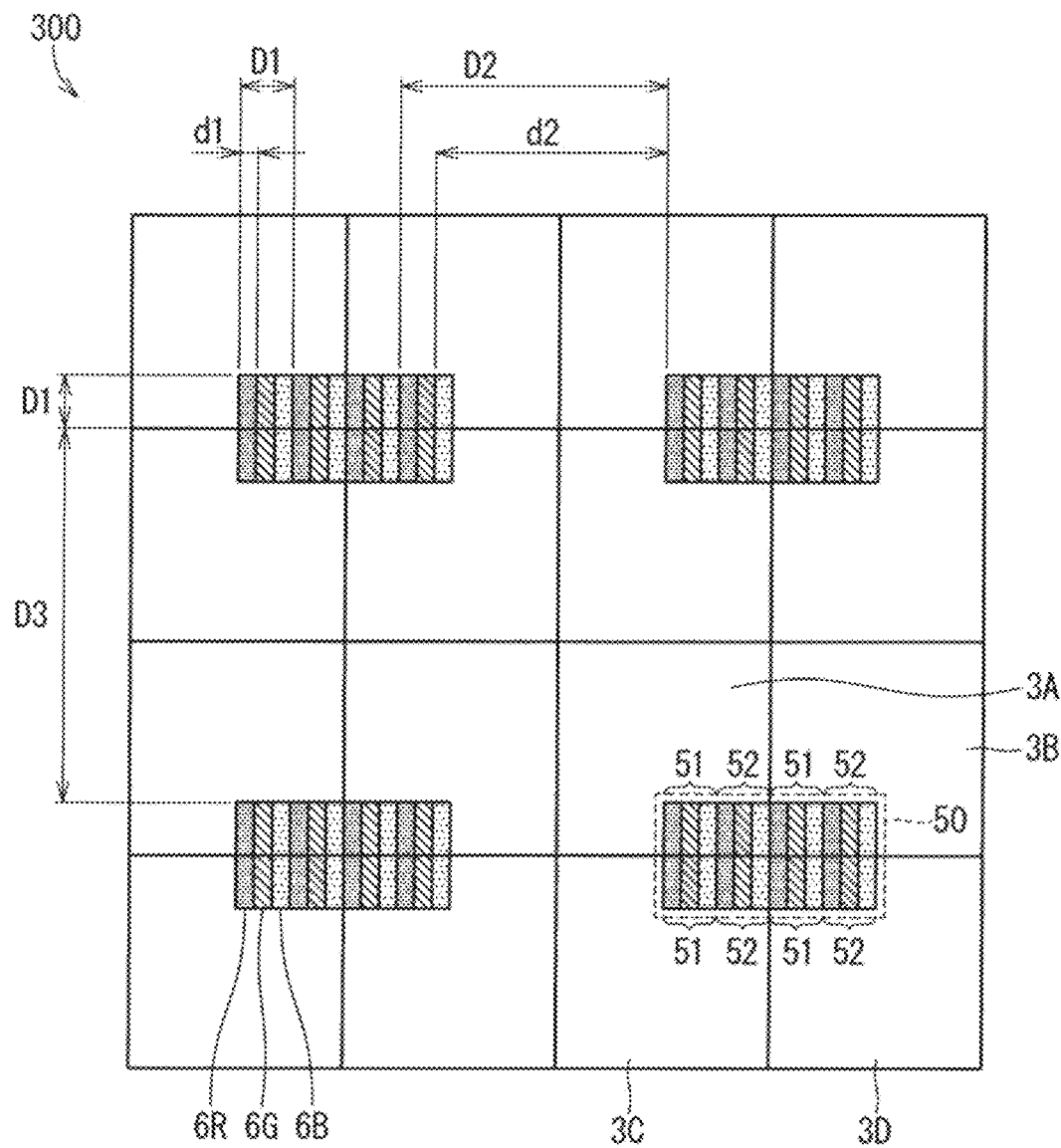
FIG. 29 is an enlarged schematic plan view of a pixel part of the self light emitting apparatus according to the third embodiment.

FIG. 29 is an enlarged schematic plan view of four pixels 3A, four pixels 3B, four pixels 3C, and four pixels 3D of the self light emitting apparatus 300. The pixels 3A, 3B, 3C, and 3D each include two subpixels 51 and 52 arrayed from left to right in the horizontal direction in this order. In the pixel 3A, the two subpixels 51 and 52 are disposed at the lower right corner of the pixel 3A. Specifically, disposition is implemented such that the right end surface of the subpixel 52 matches the right end surface of the pixel 3A, and the lower end surface of each of the subpixels 51 and 52 matches the lower end surface of the pixel 3A. Further, in the pixel 3B, the two subpixels 51 and 52 are disposed at the lower left corner of the pixel 3B. Specifically, disposition is implemented such that the left end surface of the subpixel 51 matches the left end surface of the pixel 3B, and the lower end surface of each of the subpixels 51 and 52 matches the lower end surface of the pixel 3B. Further, in the pixel 3C, the two subpixels 51 and 52 are disposed at the upper right corner of the pixel 3A. Specifically, disposition is implemented such that the right end surface of the subpixel 52 matches the right end surface of the pixel 3A, and the upper end surface of each of the subpixels 51 and 52 matches the upper end surface of the pixel 3A. Further, in the pixel 3D, the two subpixels 51 and 52 are disposed at the upper left corner of the pixel 3D. Specifically, disposition is implemented such that the left end surface of the subpixel 51 matches the left end surface of the pixel 3D, and the upper end surface of each of the subpixels 51 and 52 matches the upper end surface of the pixel 3D. In the self light emitting apparatus 300, configurations other than the disposition of the subpixels 51 and 52 are the same as those of the self light emitting apparatus 100.

Owing to such disposition of the subpixels 51 and 52, the subpixels 51 and 52 in the four pixels 3A to 3D, namely the pixel 3A, the pixel 3B on the right side of the pixel 3A, the pixel 3C on the lower side of the pixel 3A, and the pixel 3D on the right side of the pixel 3C, are situated adjacent to each other. The eight subpixels 51 and 52 being adjacent to each other across the four pixels 3A to 3D constitute the subpixel group 50 as an integrated assembly. In other words, the subpixels 51 and 52 in the subpixel group 50 are not structurally divided. Further, the three LED elements 6R, 6G, and 6B in each of the subpixels 51 and 52 are not structurally divided either and are integrated. Thus, the 24 LED elements 6 included in the subpixel group 50 are not structurally divided and are integrated. The 24 LED elements 6 are integrated and assembled into one chip, using a semiconductor process. Each subpixel group 50 is formed into one chip by integrating and assembling the 24 LED elements 6 formed on a substrate such as a sapphire substrate, and performing singulation, with the 24 LED elements 6 being one unit.

A horizontal and vertical array pitch D1 of the plurality of subpixels 51 and 52 in one subpixel group 50 is smaller than each of horizontal and vertical array pitches D2 and D3 of the subpixels 51 and 52 across adjacent subpixel groups 50. Similarly, a horizontal array pitch d1 of the LED element 6 in one subpixel group 50 is smaller than a horizontal array pitch d2 of the LED elements 6 across adjacent subpixel groups 50. With this, the subpixel 52 functions as a redundant cell for the subpixel 51.

In one subpixel group 50, the subpixels 51 and 52 belonging to the pixel 3A are independently driven as one display pixel by the driver IC 4, the subpixels 51 and 52 belonging to the pixel 3B are independently driven as one display pixel by the driver IC 4, the subpixels 51 and 52 belonging to the pixel 3C are independently driven as one display pixel by the driver IC 4, and the subpixels 51 and 52 belonging to the pixel 3D are independently driven as one display pixel by the driver IC 4. Note that the subpixel 52 functions as a redundant cell for the subpixel 51 belonging to the same pixels 3A to 3D. In this manner, the self light emitting apparatus 300 functions as a display apparatus. For example, only the subpixel group 50 being an integrated assembly including four subpixels 51 and four subpixels 52 configures four pixels 3. Owing to the disposition of the pixels 3A to 3D illustrated in FIG. 29, a 4×4 display is configured.

<C-2. Effects>

In the self light emitting apparatus 300 according to the third embodiment, the subpixels 51 and 52 of each pixel are adjacent to the subpixels of each of other three pixels adjacent to each pixel, and are configured as an assembly integrated with the subpixels 51 and 52 of each of the other three pixels adjacent to each pixel. For example, the subpixels 51 and 52 of the pixel 3A are adjacent to the subpixels 51 and 52 of each of other three pixels 3B to 3D adjacent to the pixel 3A.

According to the above configuration, the LED elements 6R, 6G, and 6B constituting the subpixels 51 and 52 of four adjacent pixels 3A to 3D can be collectively mounted to the backplane 2 as one subpixel group 50, and thus the number of times of mounting the LED elements 6R, 6G, and 6B can be reduced. As a result, according to the self light emitting apparatus 300, an effect of reduction of manufacturing costs is achieved because of reduction of the number of times of mounting the LED elements 6R, 6G, and 6B, in addition to the effect of hindering reduction of a yield due to a pixel defect according to the first embodiment.

In the self light emitting apparatus 200 according to the second embodiment, the LED elements 6 of two pixels can be collectively mounted, whereas in the self light emitting apparatus 300, the LED elements 6 of four pixels can be collectively mounted.

Therefore, the self light emitting apparatus 300 enables further reduction of manufacturing costs because of reduction of the number of times of mounting than the self light emitting apparatus 200.

<C-3. Modifications>

Modifications regarding disposition of the LED elements 6 will be described below. Each of the modifications described below exerts the effects of the third embodiment.

<C-3-1. First Modification>

Figure 30:
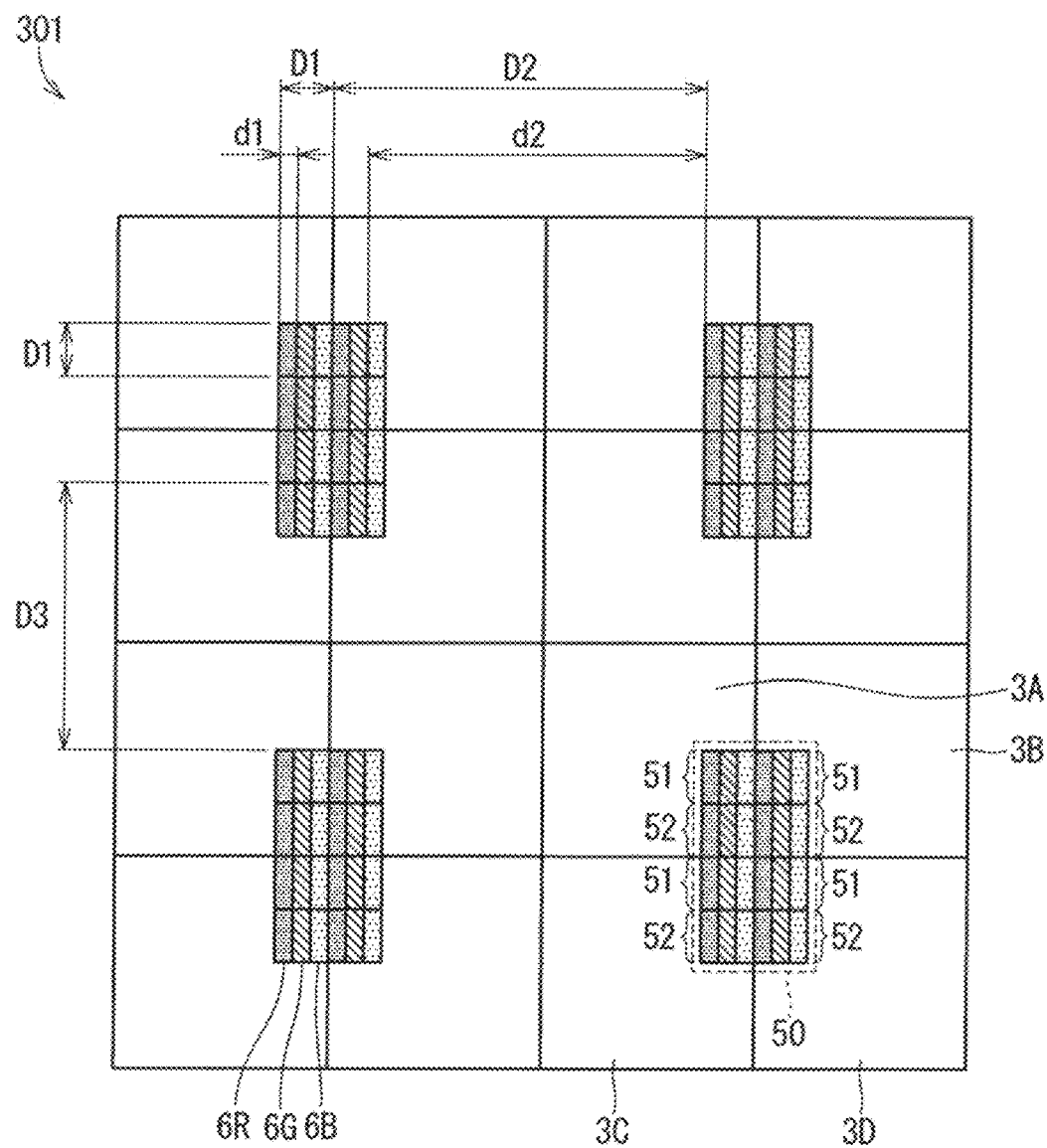
FIG. 30 is an enlarged schematic plan view of the pixel part of the self light emitting apparatus according to a first modification of the third embodiment.

FIG. 30 is an enlarged schematic plan view of four pixels 3A, four pixels 3B, four pixels 3C, and four pixels 3D of a self light emitting apparatus 301 according to a first modification of the third embodiment. The self light emitting apparatus 301 is obtained by applying the first modification of the first embodiment to the third embodiment. The self light emitting apparatus 301 is different from the self light emitting apparatus 300 according to the third embodiment only in that the subpixels 51 and 52 are arrayed in the vertical direction.

Specifically, in the pixel 3A, the right end surface of each of the subpixels 51 and 52 and the lower end surface of the subpixel 52 respectively match the right end surface and the lower end surface of the pixel 3A. Further, in the pixel 3B, the left end surface of each of the subpixels 51 and 52 and the lower end surface of the subpixel 52 respectively match the left end surface and the lower end surface of the pixel 3B. Further, in the pixel 3C, the right end surface of each of the subpixels 51 and 52 and the upper end surface of the subpixel 52 respectively match the right end surface and the upper end surface of the pixel 3C. Further, in the pixel 3D, the left end surface of each of the subpixels 51 and 52 and the upper end surface of the subpixel 52 respectively match the left end surface and the upper end surface of the pixel 3D.

In the self light emitting apparatus 301 in which the subpixels 51 and 52 are arrayed in the vertical direction as well, similarly to the third embodiment, the LED elements 6 constituting the subpixels 51 and 52 of four pixels 3A to 3D can be collectively mounted to the backplane 2 as one subpixel group 50, and thus the number of times of mounting the LED elements 6 can be reduced.

<C-3-2. Second Modification>

Figure 31:
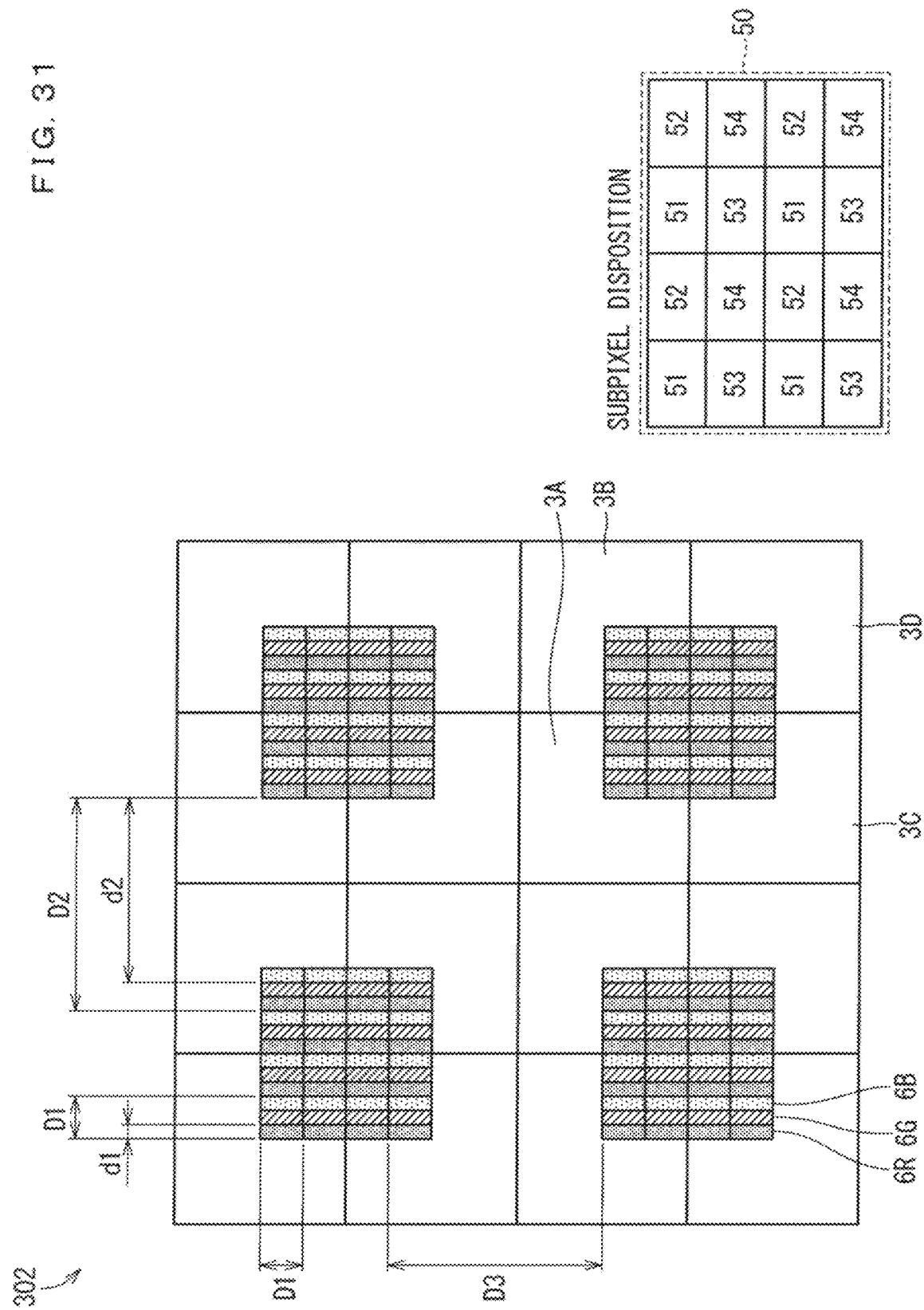
FIG. 31 is an enlarged schematic plan view of the pixel part of the self light emitting apparatus according to a second modification of the third embodiment.

FIG. 31 is an enlarged schematic plan view of four pixels 3A, four pixels 3B, four pixels 3C, and four pixels 3D of a self light emitting apparatus 302 according to a second modification of the third embodiment. The self light emitting apparatus 302 is obtained by applying the second modification of the first embodiment to the third embodiment. The self light emitting apparatus 302 is different from the self light emitting apparatus 200 according to the third embodiment only in that four subpixels 51 to 54 are arrayed in two rows and two columns in each of the pixels 3A to 3D.

Specifically, in the pixel 3A, the right end surface of each of the subpixels 52 and 54 matches the right end surface of the pixel 3A, and the lower end surface of each of the subpixels 53 and 54 matches the lower end surface of the pixel 3A. Further, in the pixel 3B, the left end surface of each of the subpixels 51 and 53 matches the left end surface of the pixel 3B, and the lower end surface of each of the subpixels 53 and 54 matches the lower end surface of the pixel 3B. Further, in the pixel 3C, the right end surface of each of the subpixels 52 and 54 matches the right end surface of the pixel 3C, and the upper end surface of each of the subpixels 51 and 52 matches the upper end surface of the pixel 3C. Further, in the pixel 3D, the left end surface of each of the subpixels 51 and 53 matches the left end surface of the pixel 3D, and the upper end surface of each of the subpixels 51 and 52 matches the upper end surface of the pixel 3D. In this manner, the subpixels 51 to 54 of the pixels 3A to 3D are situated adjacent to each other. These 16 adjacent subpixels 51 to 54 constitute the subpixel group 50.

In the self light emitting apparatuses 300 and 301, only the subpixel 52 functions as a redundant cell, and thus if a failure occurs in the LED elements of both of the subpixels 51 and 52, a pixel defect occurs. However, in the self light emitting apparatus 302, the subpixels 52 to 54 each function as a redundant cell in each of the pixels 3A to 3D. Accordingly, even if a failure occurs in the LED elements in a maximum of three subpixels out of the four subpixels 51 to 54, a pixel defect does not occur. In this manner, according to the self light emitting apparatus 302, an effect of further hindering reduction of a yield can be achieved.

<C-3-3. Third Modification>

Figure 32:
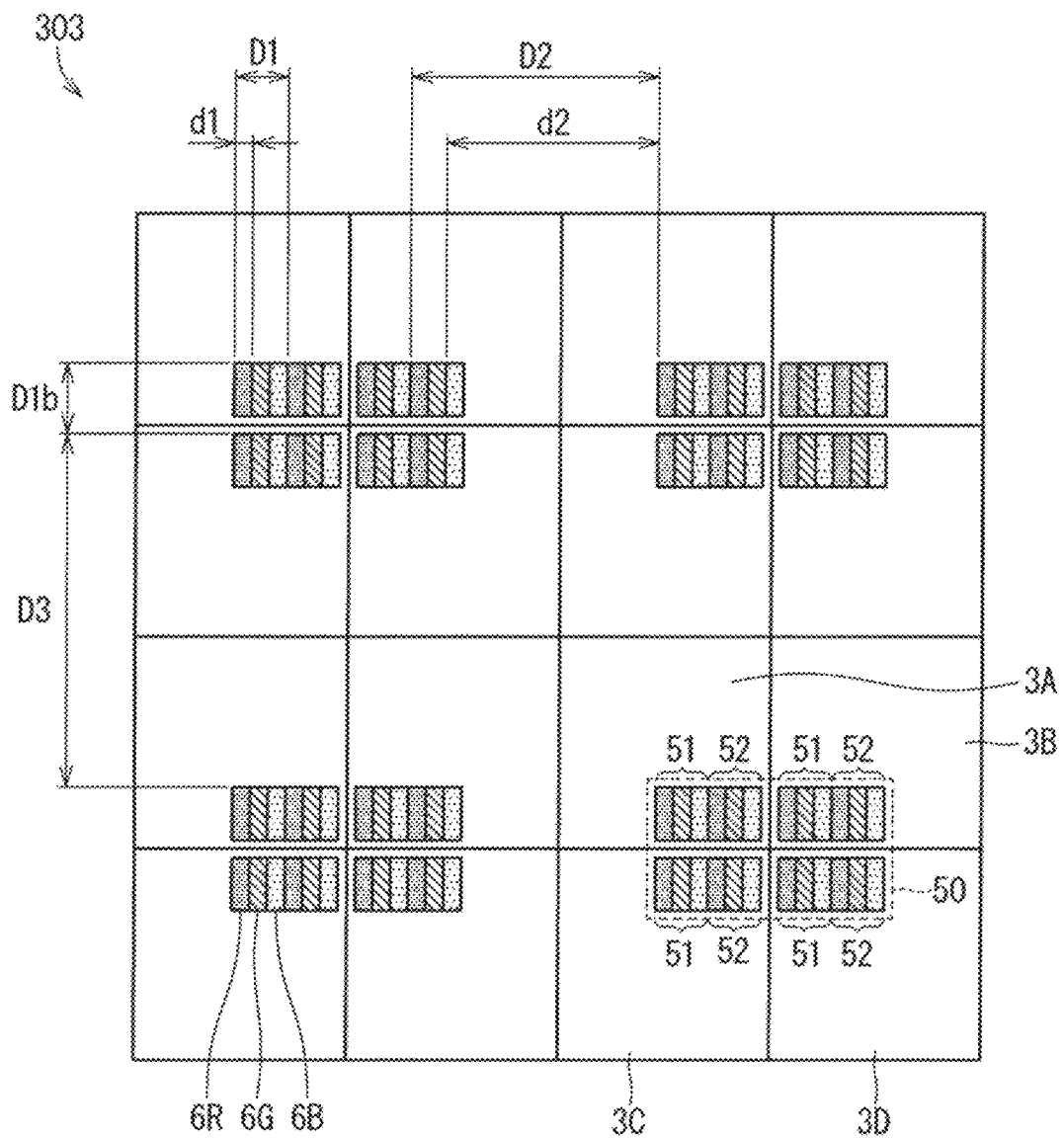
FIG. 32 is an enlarged schematic plan view of the pixel part of the self light emitting apparatus according to a third modification of the third embodiment.

FIG. 32 is an enlarged schematic plan view of four pixels 3A, four pixels 3B, four pixels 3C, and four pixels 3D of a self light emitting apparatus 303 according to a third modification of the third embodiment. The self light emitting apparatus 303 is different from the self light emitting apparatus 300 according to the third embodiment only in that a gap is provided between the subpixels of different pixels in the subpixel group 50. In other words, in the self light emitting apparatus 303, the subpixels 51 and 52 of each pixel 3A are adjacent to the subpixels 51 and 52 of each of other three pixels 3B to 3D adjacent to each pixel with a gap being provided therebetween. Specifically, a gap is provided between the right end surface of the subpixel 52 of the pixel 3A and the left end surface of the subpixel 51 of the pixel 3B on the right side thereof. Further, a gap is provided between the lower end surface of each of the subpixels 51 and 52 of the pixel 3A and the upper end surface of each of the subpixels 51 and 52 of the pixel 3C on the lower side thereof. Further, a gap is provided between the lower end surface of each of the subpixels 51 and 52 of the pixel 3B and the upper end surface of each of the subpixels 51 and 52 of the pixel 3D on the lower side thereof. Further, a gap is provided between the right end surface of the subpixel 52 of the pixel 3C and the left end surface of the subpixel 51 of the pixel 3D on the right side thereof.

A horizontal array pitch D1$a$ and a vertical array pitch D1$b$ of the plurality of subpixels 51 and 52 in one subpixel group 50 are smaller than horizontal and vertical array pitches D2 and D3 of the subpixels 51 and 52 across adjacent subpixel groups 50, respectively. Similarly, a horizontal array pitch d1 of the LED element 6 in one subpixel group 50 is smaller than a horizontal array pitch d2 of the LED elements 6 across adjacent subpixel groups 50. With this, the subpixel 52 functions as a redundant cell for the subpixel 51.

The eight subpixels 51 and 52 being adjacent to each other across the four pixels 3A to 3D with a gap being provided therebetween constitute the subpixel group 50 as an integrated assembly. In other words, the subpixels 51 and 52 in the subpixel group 50 are not structurally divided. Further, the three LED elements 6R, 6G, and 6B in each of the subpixels 51 and 52 are not structurally divided either and are integrated. Thus, the 24 LED elements 6 included in the subpixel group 50 are not structurally divided and are integrated. The 24 LED elements 6 are integrated and assembled into one chip, using a semiconductor process. Each subpixel group 50 is formed into one chip by integrating and assembling the 24 LED elements 6 formed on a substrate such as a sapphire substrate, and performing singulation, with the 24 LED elements 6 being one unit.

In the self light emitting apparatus 300 according to the third embodiment, the distance between the subpixels is small between the adjacent pixels 3A to 3D, and thus there is a fear of mixing of colors between the pixels 3A to 3D. However, in the self light emitting apparatus 303, as described above, a gap is provided between the subpixels of the pixels 3A to 3D, and therefore mixing of colors can be hindered.

<C-3-4. Fourth Modification>

Figure 33:
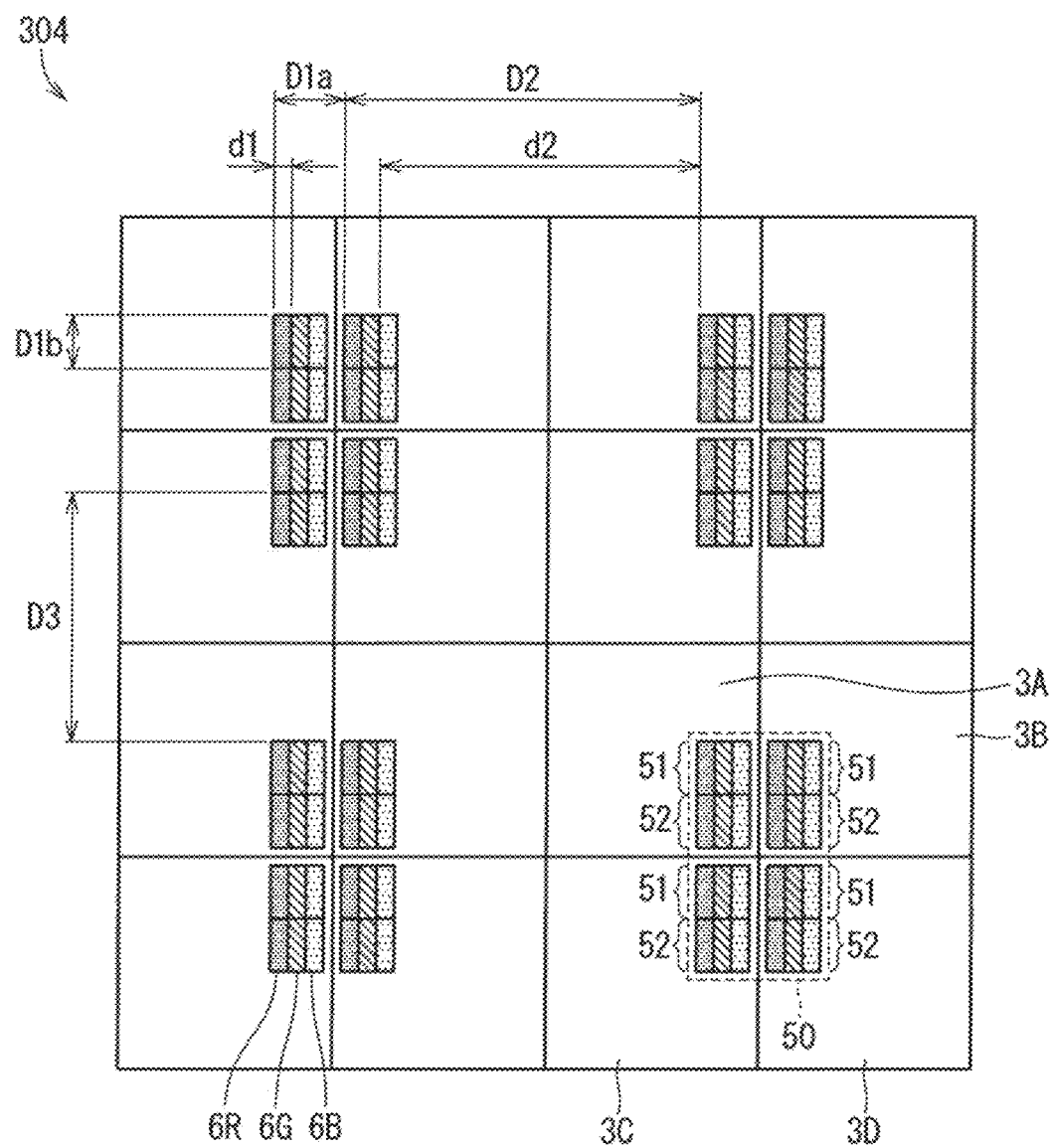
FIG. 33 is an enlarged schematic plan view of the pixel part of the self light emitting apparatus according to a fourth modification of the third embodiment.

FIG. 33 is an enlarged schematic plan view of four pixels 3A, four pixels 3B, four pixels 3C, and four pixels 3D of a self light emitting apparatus 304 according to a fourth modification of the third embodiment. The self light emitting apparatus 304 is different from the self light emitting apparatus 301 according to the first modification of the third embodiment only in that a gap is provided between the subpixels of different pixels in the subpixel group 50. Specifically, a gap is provided between the right end surface of each of the subpixels 51 and 52 of the pixel 3A and the left end surface of each of the subpixels 51 and 52 of the pixel 3B on the right side thereof. Further, a gap is provided between the lower end surface of the subpixel 52 of the pixel 3A and the upper end surface of the subpixel 51 of the pixel 3C on the lower side thereof. Further, a gap is provided between the lower end surface of the subpixel 52 of the pixel 3B and the upper end surface of the subpixel 51 of the pixel 3D on the lower side thereof. Further, a gap is provided between the right end surface of each of the subpixels 51 and 52 of the pixel 3C and the left end surface of each of the subpixels 51 and 52 of the pixel 3D on the right side thereof.

A horizontal array pitch D1*a* and a vertical array pitch D1*b* of the plurality of subpixels 51 and 52 in one subpixel group 50 are smaller than horizontal and vertical array pitches D2 and D3 of the subpixels 51 and 52 across adjacent subpixel groups 50, respectively. Similarly, a horizontal array pitch d1 of the LED element 6 in one subpixel group 50 is smaller than a horizontal array pitch d2 of the LED elements 6 across adjacent subpixel groups 50. With this, the subpixel 52 functions as a redundant cell for the subpixel 51.

The eight subpixels 51 and 52 being adjacent to each other across the four pixels 3A to 3D with a gap being provided therebetween constitute the subpixel group 50 as an integrated assembly. In other words, the subpixels 51 and 52 in the subpixel group 50 are not structurally divided. Further, the three LED elements 6R, 6G, and 6B in each of the subpixels 51 and 52 are not structurally divided either and are integrated. Thus, the 24 LED elements 6 included in the subpixel group 50 are not structurally divided and are integrated. The 24 LED elements 6 are integrated and assembled into one chip, using a semiconductor process. Each subpixel group 50 is formed into one chip by integrating and assembling the 24 LED elements 6 formed on a substrate such as a sapphire substrate, and performing singulation, with the 24 LED elements 6 being one unit.

In the self light emitting apparatus 304, as described above, a gap is provided between the subpixels of different pixels in the subpixel group 50, and therefore mixing of colors can be hindered between the pixels 3A to 3D.

<C-3-5. Fifth Modification>

Figure 34:
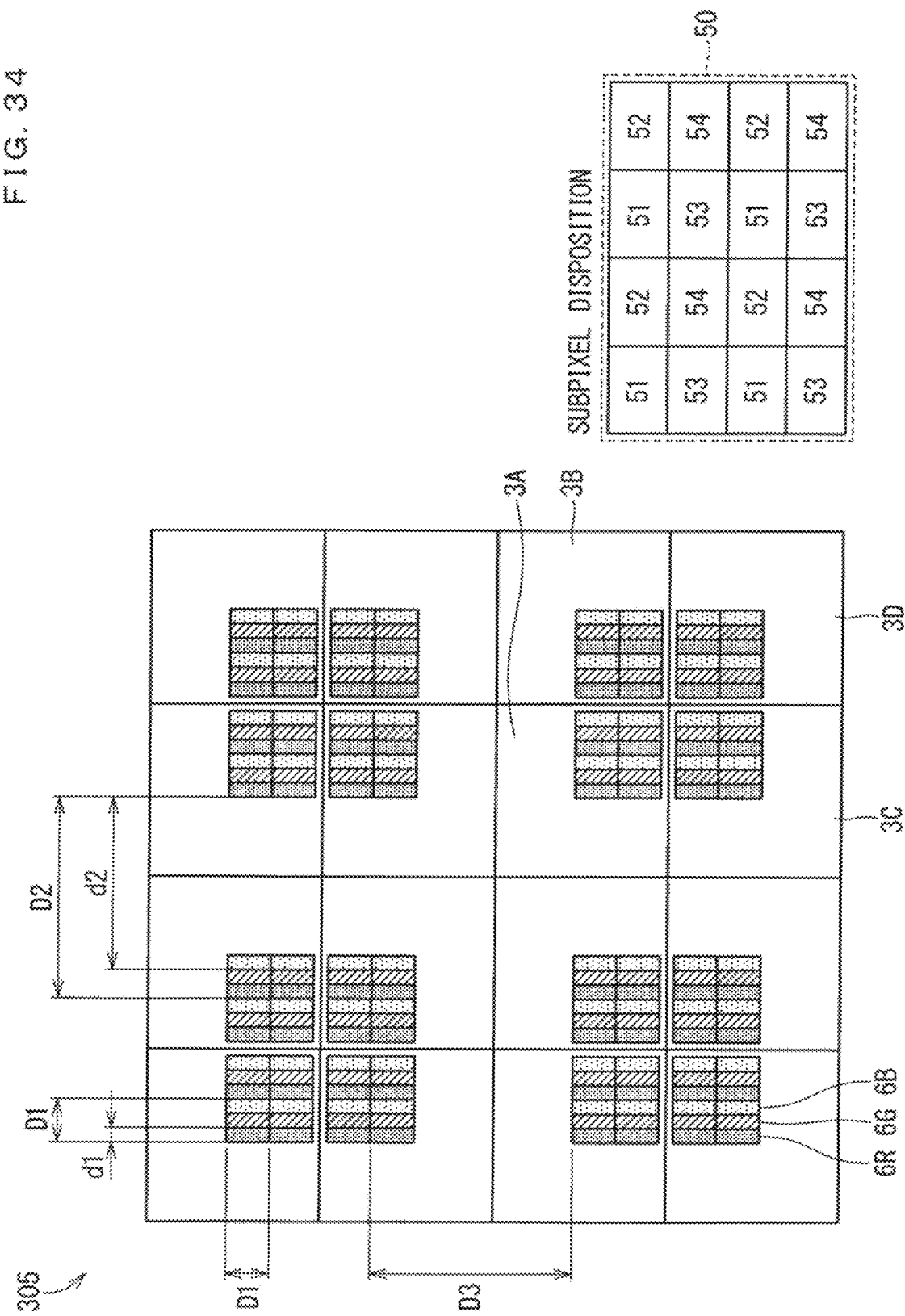
FIG. 34 is an enlarged schematic plan view of the pixel part of the self light emitting apparatus according to a fifth modification of the third embodiment.

FIG. 34 is an enlarged schematic plan view of four pixels 3A, four pixels 3B, four pixels 3C, and four pixels 3D of a self light emitting apparatus 305 according to a fifth modification of the third embodiment. The self light emitting apparatus 305 is different from the self light emitting apparatus 302 according to the second modification of the third embodiment only in that a gap is provided between the subpixels of different pixels in the subpixel group 50. Specifically, a gap is provided between the right end surface of each of the subpixels 52 and 54 of the pixel 3A and the left end surface of each of the subpixels 51 and 53 of the pixel 3B on the right side thereof. Further, a gap is provided between the lower end surface of each of the subpixels 53 and 54 of the pixel 3A and the upper end surface of each of the subpixels 51 and 52 of the pixel 3C on the lower side thereof. Further, a gap is provided between the lower end surface of each of the subpixels 53 and 54 of the pixel 3B and the upper end surface of each of the subpixels 51 and 52 of the pixel 3D on the lower side thereof. Further, a gap is provided between the right end surface of each of the subpixels 52 and 54 of the pixel 3C and the left end surface of each of the subpixels 51 and 53 of the pixel 3D on the right side thereof.

The 16 subpixels 51 to 54 being adjacent to each other across the four pixels 3A to 3D with a gap being provided therebetween constitute the subpixel group 50 as an integrated assembly. In other words, the subpixels 51 to 54 in the subpixel group 50 are not structurally divided. Further, the three LED elements 6R, 6G, and 6B in each of the subpixels 51 to 54 are not structurally divided either and are integrated. Thus, the 48 LED elements 6 included in the subpixel group 50 are not structurally divided and are integrated. The 48 LED elements 6 are integrated and assembled into one chip, using a semiconductor process. Each subpixel group 50 is formed into one chip by integrating and assembling the 48 LED elements 6 formed on a substrate such as a sapphire substrate, and performing singulation, with the 48 LED elements 6 being one unit.

In the self light emitting apparatus 305, as described above, a gap is provided between the subpixels of different pixels in the subpixel group 50, and therefore mixing of colors can be hindered between the pixels 3A to 3D.

<C-3-6. Sixth Modification>

Figure 35:
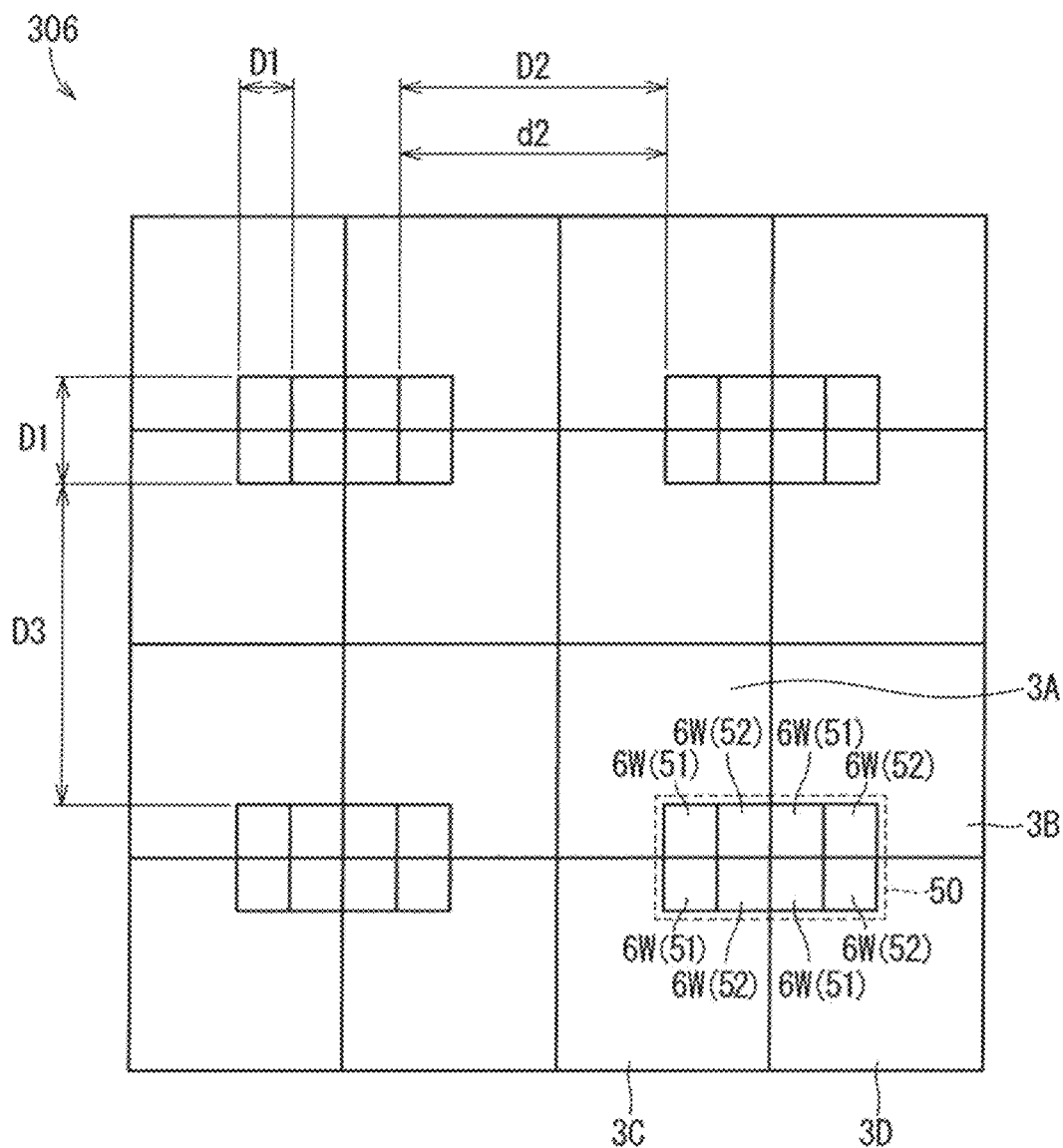
FIG. 35 is an enlarged schematic plan view of the pixel part of the self light emitting apparatus according to a sixth modification of the third embodiment.

FIG. 35 is an enlarged schematic plan view of four pixels 3A, four pixels 3B, four pixels 3C, and four pixels 3D of a self light emitting apparatus 306 according to a sixth modification of the third embodiment. The self light emitting apparatus 306 is obtained by applying the third modification of the first embodiment to the third embodiment. The self light emitting apparatus 306 is different from the self light emitting apparatus 300 according to the third embodiment only in that each of the subpixels 51 and 52 includes one LED element 6W that emits white light.

According to the self light emitting apparatus 306, when a full color display is not needed, quantity of light can be adjusted for each pixel 3. For example, by using the self light emitting apparatus 306 as a backlight of a liquid crystal display apparatus and adjusting the quantity of light for each pixel 3 depending on a display image of the liquid crystal display apparatus, the contrast ratio of the liquid crystal display apparatus can be enhanced.

<C-3-7. Seventh Modification>

Figure 36:
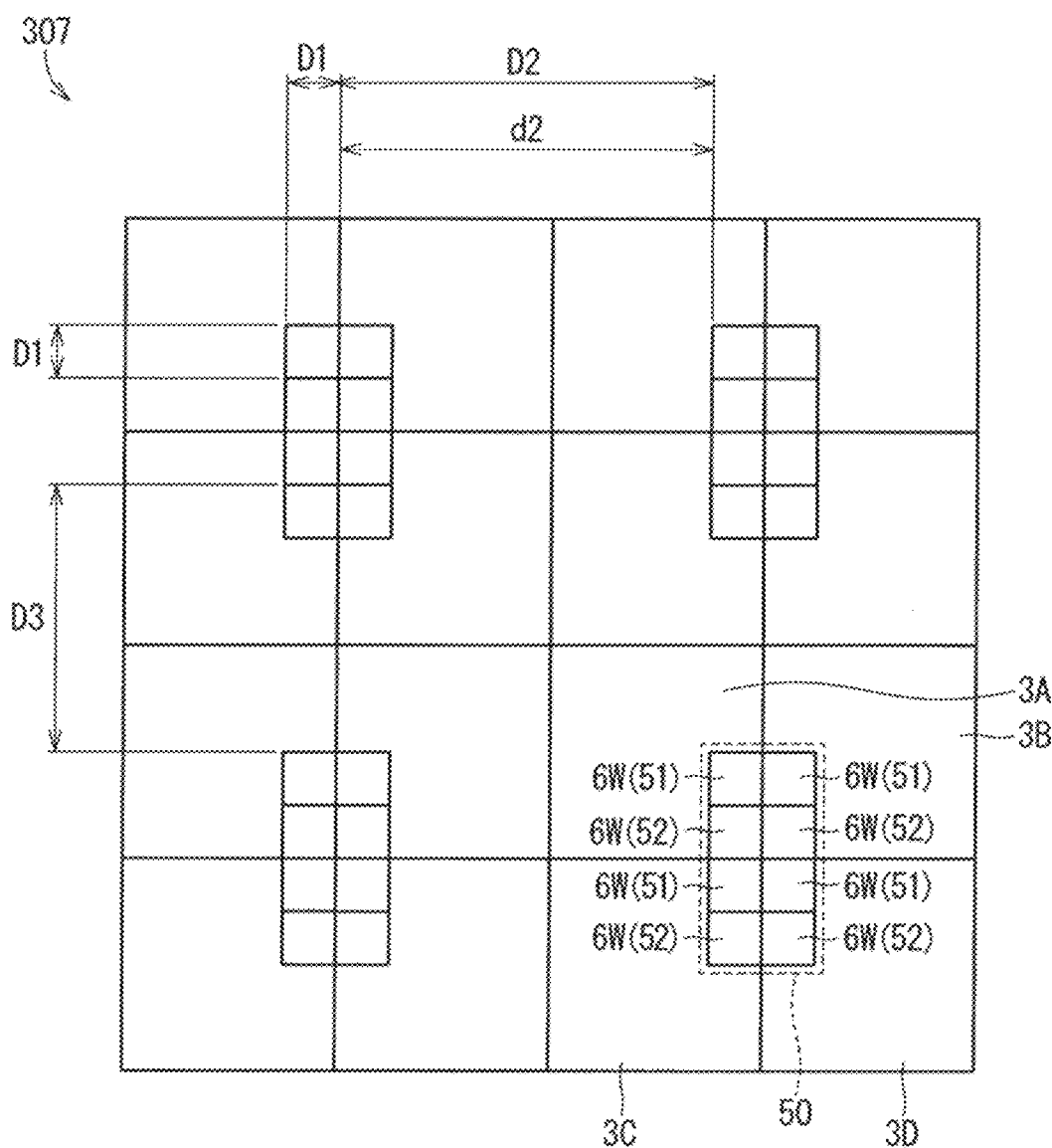
FIG. 36 is an enlarged schematic plan view of the pixel part of the self light emitting apparatus according to a seventh modification of the third embodiment.

FIG. 36 is an enlarged schematic plan view of four pixels 3A, four pixels 3B, four pixels 3C, and four pixels 3D of a self light emitting apparatus 307 according to a seventh modification of the third embodiment. The self light emitting apparatus 307 is obtained by applying the fourth modification of the first embodiment to the third embodiment. The self light emitting apparatus 307 is different from the self light emitting apparatus 301 according to the first modification of the third embodiment only in that each of the subpixels 51 and 52 includes one LED element 6W that emits white light.

According to the self light emitting apparatus 307, when a full color display is not needed, quantity of light can be adjusted for each pixel 3. For example, by using the self light emitting apparatus 307 as a backlight of a liquid crystal display apparatus and adjusting the quantity of light for each pixel 3 depending on a display image of the liquid crystal display apparatus, the contrast ratio of the liquid crystal display apparatus can be enhanced.

<C-3-8. Eighth Modification>

Figure 37:
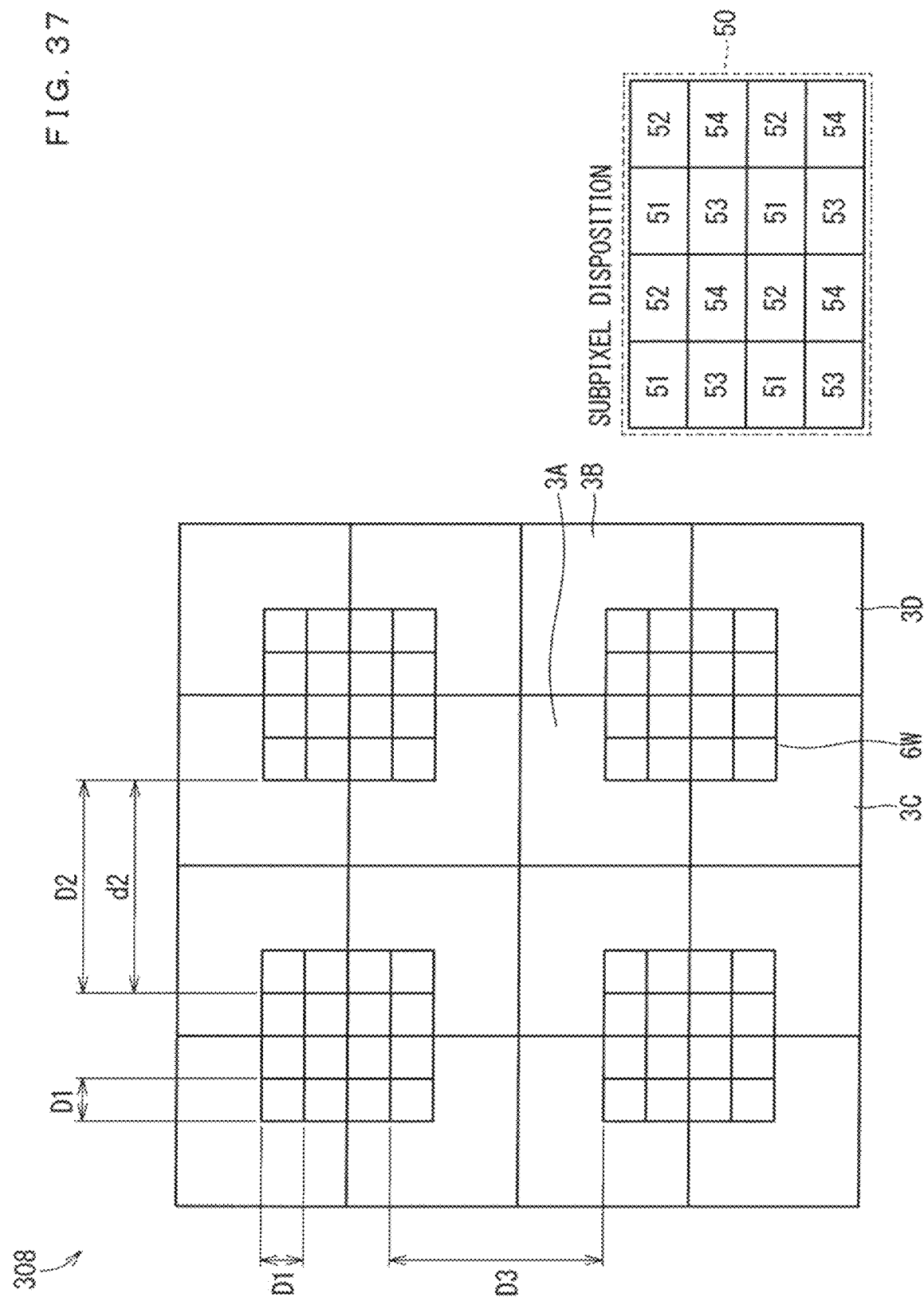
FIG. 37 is an enlarged schematic plan view of the pixel part of the self light emitting apparatus according to an eighth modification of the third embodiment.

FIG. 37 is an enlarged schematic plan view of four pixels 3A, four pixels 3B, four pixels 3C, and four pixels 3D of a self light emitting apparatus 308 according to an eighth modification of the third embodiment. The self light emitting apparatus 308 is obtained by applying the fifth modification of the first embodiment to the third embodiment. The self light emitting apparatus 308 is different from the self light emitting apparatus 302 according to the second modification of the third embodiment only in that each of the subpixels 51 to 54 includes one LED element 6W that emits white light.

According to the self light emitting apparatus 308, when a full color display is not needed, quantity of light can be adjusted for each pixel 3. For example, by using the self light emitting apparatus 308 as a backlight of a liquid crystal display apparatus and adjusting the quantity of light for each pixel 3 depending on a display image of the liquid crystal display apparatus, the contrast ratio of the liquid crystal display apparatus can be enhanced.

<C-3-9. Ninth Modification>

Figure 38:
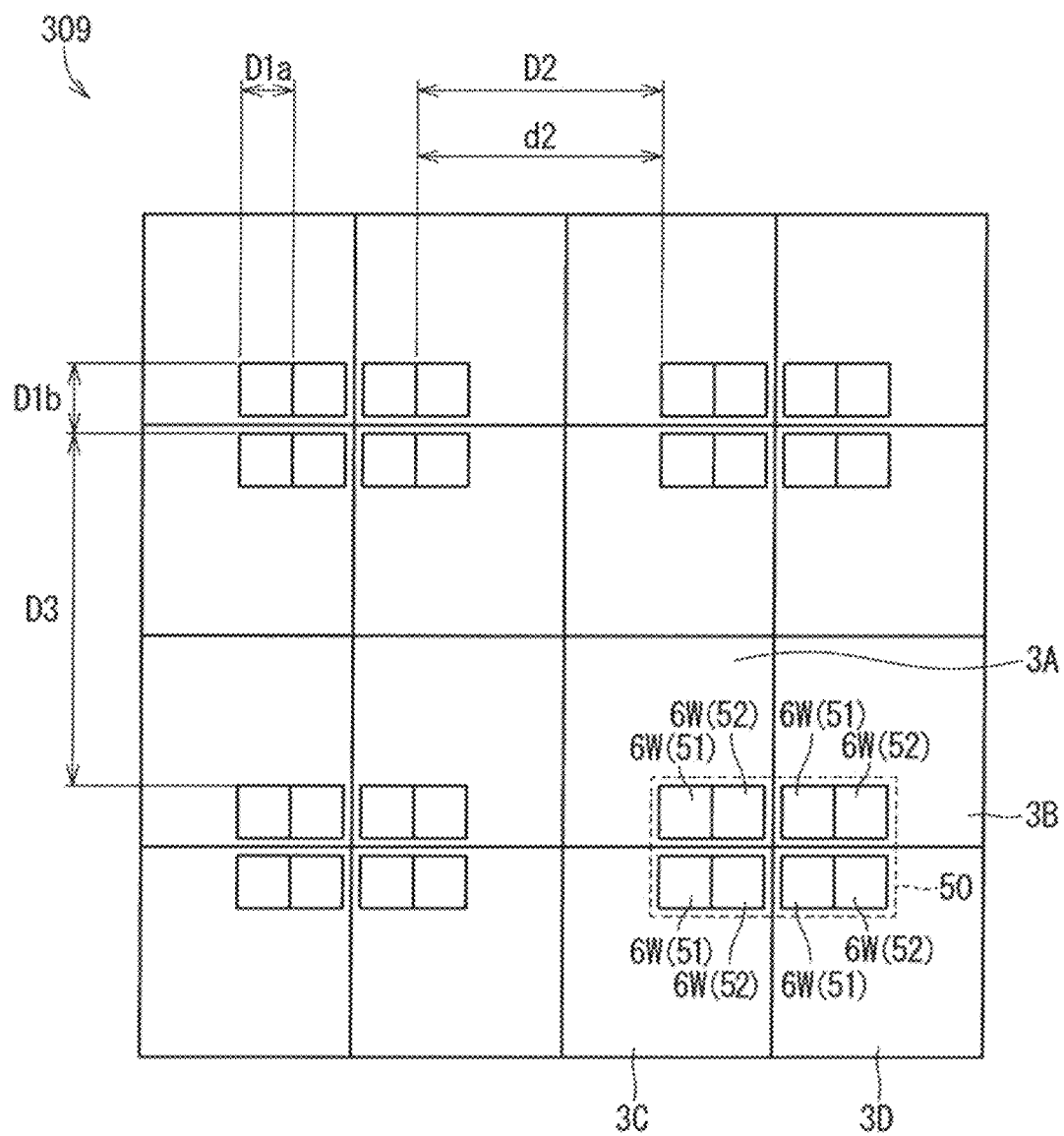
FIG. 38 is an enlarged schematic plan view of the pixel part of the self light emitting apparatus according to a ninth modification of the third embodiment.

FIG. 38 is an enlarged schematic plan view of four pixels 3A, four pixels 3B, four pixels 3C, and four pixels 3D of a self light emitting apparatus 309 according to a ninth modification of the third embodiment. The self light emitting apparatus 309 is different from the self light emitting apparatus 306 according to the sixth modification of the third embodiment only in that a gap is provided between the subpixels of different pixels in the subpixel group 50. Further, the self light emitting apparatus 309 is different from the self light emitting apparatus 303 according to the third modification of the third embodiment only in that each of the subpixels 51 and 52 includes one LED element 6W that emits white light.

A horizontal array pitch D1*a* and a vertical array pitch D1*b* of the plurality of subpixels 51 and 52 in one subpixel group 50 are smaller than horizontal and vertical array pitches D2 and D3 of the subpixels 51 and 52 across adjacent subpixel groups 50, respectively. Similarly, a horizontal array pitch d1 of the LED element 6 in one subpixel group 50 is smaller than a horizontal array pitch d2 of the LED elements 6 across adjacent subpixel groups 50. With this, the subpixel 52 functions as a redundant cell for the subpixel 51.

The eight subpixels 51 and 52 being adjacent to each other across the four pixels 3A to 3D with a gap being provided therebetween constitute the subpixel group 50 as an integrated assembly. In other words, the subpixels 51 and 52 in the subpixel group 50 are not structurally divided. Thus, the eight LED elements 6W included in the subpixel group 50 are not structurally divided and are integrated. The eight LED elements 6W are integrated and assembled into one chip, using a semiconductor process. Each subpixel group 50 is formed into one chip by integrating and assembling the eight LED elements 6W formed on a substrate such as a sapphire substrate, and performing singulation, with the eight LED elements 6W being one unit.

According to the self light emitting apparatus 309, a gap is provided between the subpixels of different pixels in the subpixel group 50, and therefore mixing of colors can be hindered between the pixels 3A to 3D. Further, according to the self light emitting apparatus 309, when a full color display is not needed, quantity of light can be adjusted for each pixel 3. For example, by using the self light emitting apparatus 309 as a backlight of a liquid crystal display apparatus and adjusting the quantity of light for each pixel 3 depending on a display image of the liquid crystal display apparatus, the contrast ratio of the liquid crystal display apparatus can be enhanced.

<C-3-10. Tenth Modification>

Figure 39:
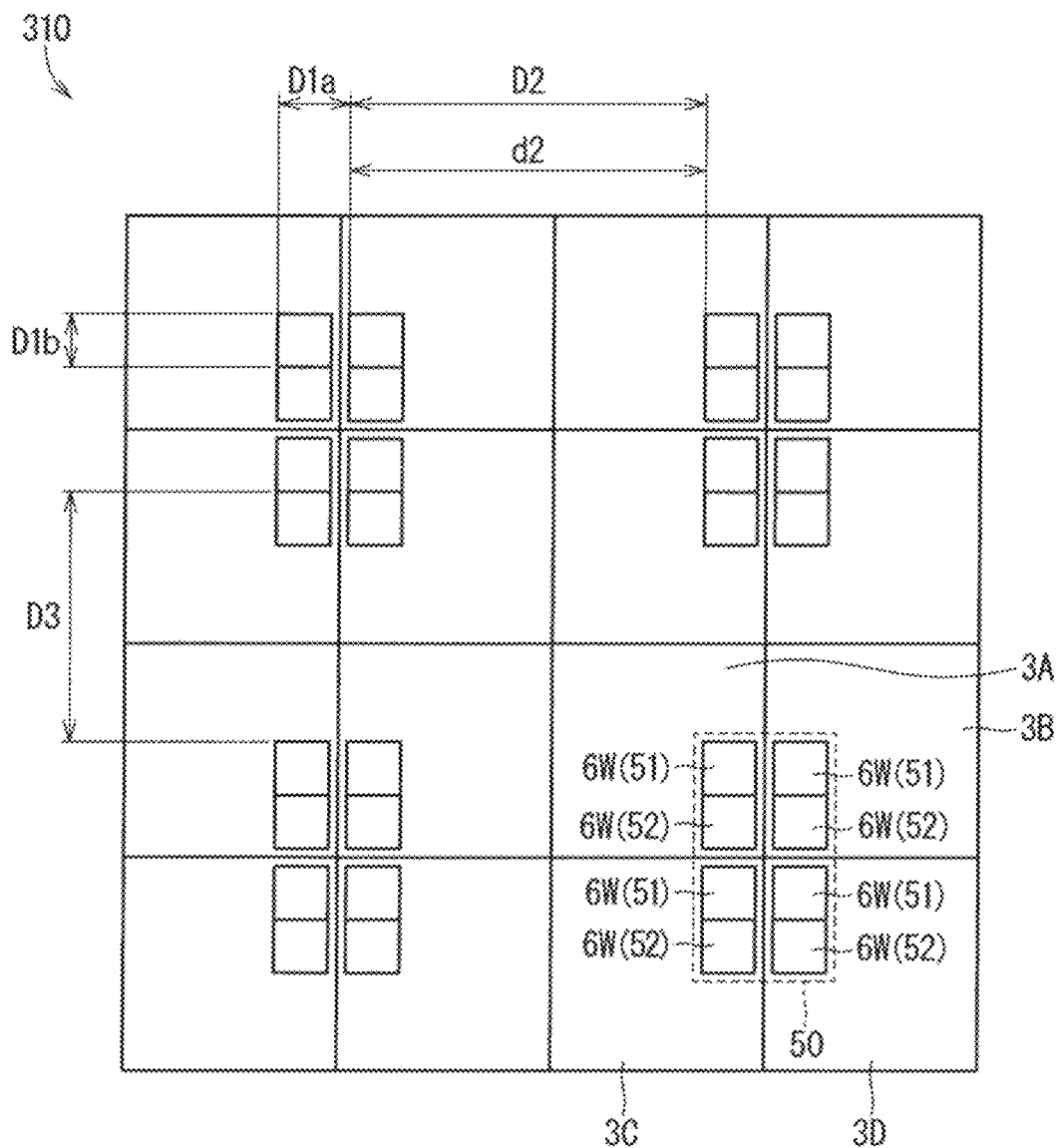
FIG. 39 is an enlarged schematic plan view of the pixel part of the self light emitting apparatus according to a tenth modification of the third embodiment.

FIG. 39 is an enlarged schematic plan view of four pixels 3A, four pixels 3B, four pixels 3C, and four pixels 3D of a self light emitting apparatus 310 according to a tenth modification of the third embodiment. The self light emitting apparatus 310 is different from the self light emitting apparatus 307 according to the seventh modification of the third embodiment only in that a gap is provided between the subpixels of different pixels in the subpixel group 50. Further, the self light emitting apparatus 310 is different from the self light emitting apparatus 304 according to the fourth modification of the third embodiment only in that each of the subpixels 51 and 52 includes one LED element 6W that emits white light.

A horizontal array pitch D1*a* and a vertical array pitch D1*b* of the plurality of subpixels 51 and 52 in one subpixel group 50 are smaller than horizontal and vertical array pitches D2 and D3 of the subpixels 51 and 52 across adjacent subpixel groups 50, respectively. Similarly, a horizontal array pitch d1 of the LED element 6 in one subpixel group 50 is smaller than a horizontal array pitch d2 of the LED elements 6 across adjacent subpixel groups 50. With this, the subpixel 52 functions as a redundant cell for the subpixel 51.

The eight subpixels 51 and 52 being adjacent to each other across the four pixels 3A to 3D with a gap being provided therebetween constitute the subpixel group 50 as an integrated assembly. In other words, the subpixels 51 and 52 in the subpixel group 50 are not structurally divided. Thus, the eight LED elements 6W included in the subpixel group 50 are not structurally divided and are integrated. The eight LED elements 6W are integrated and assembled into one chip, using a semiconductor process. Each subpixel group 50 is formed into one chip by integrating and assembling the eight LED elements 6W formed on a substrate such as a sapphire substrate, and performing singulation, with the eight LED elements 6W being one unit.

According to the self light emitting apparatus 310, a gap is provided between the subpixels of different pixels in the subpixel group 50, and therefore mixing of colors can be hindered between the pixels 3A to 3D. Further, according to the self light emitting apparatus 310, when a full color display is not needed, quantity of light can be adjusted for each pixel 3. For example, by using the self light emitting apparatus 310 as a backlight of a liquid crystal display apparatus and adjusting the quantity of light for each pixel 3 depending on a display image of the liquid crystal display apparatus, the contrast ratio of the liquid crystal display apparatus can be enhanced.

<C-3-11. Eleventh Modification>

Figure 40:
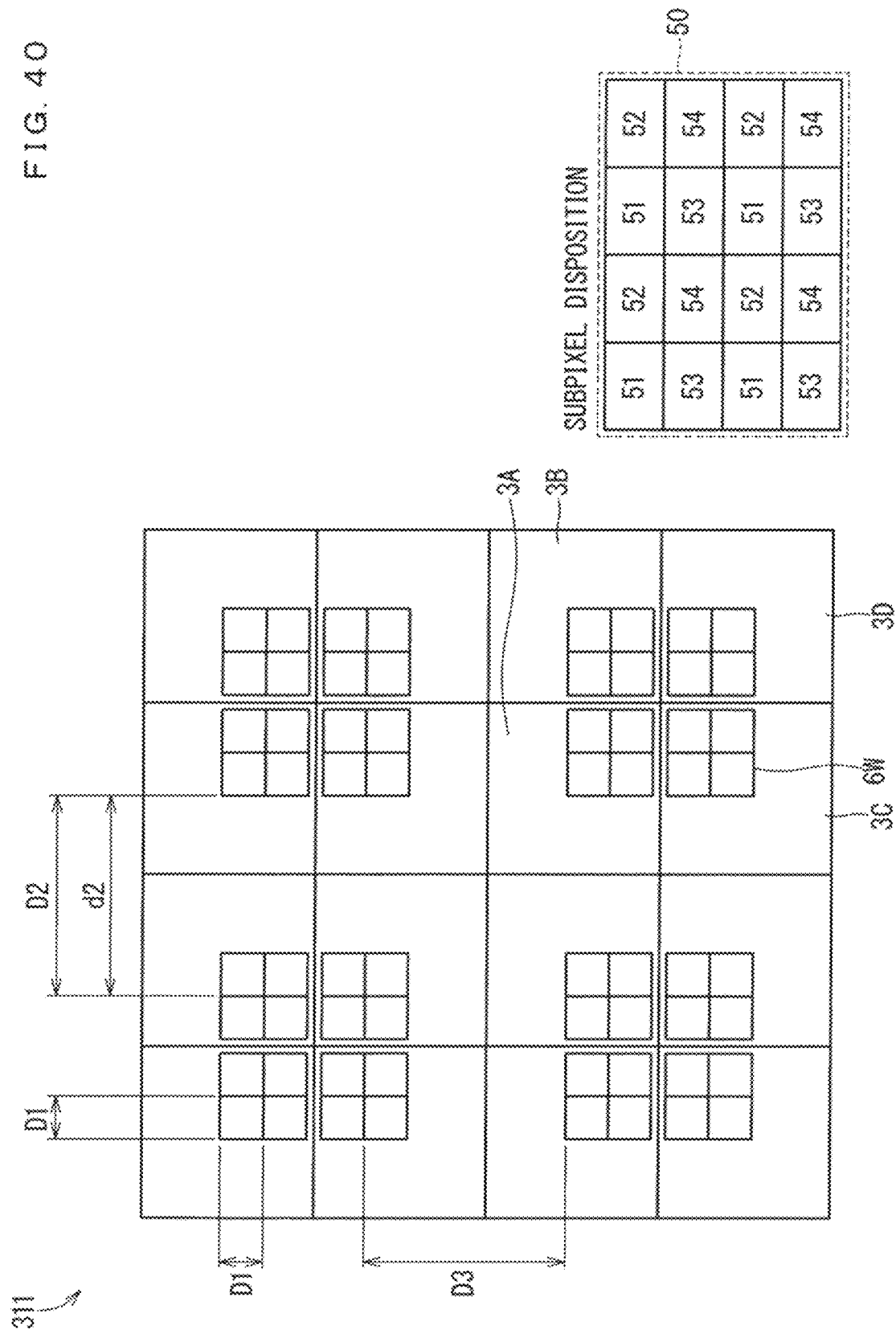
FIG. 40 is an enlarged schematic plan view of the pixel part of the self light emitting apparatus according to an eleventh modification of the third embodiment.

FIG. 40 is an enlarged schematic plan view of four pixels 3A, four pixels 3B, four pixels 3C, and four pixels 3D of a self light emitting apparatus 311 according to an eleventh modification of the third embodiment. The self light emitting apparatus 311 is different from the self light emitting apparatus 308 according to the eighth modification of the third embodiment only in that a gap is provided between the subpixels of different pixels in the subpixel group 50. Further, the self light emitting apparatus 311 is different from the self light emitting apparatus 305 according to the fifth modification of the third embodiment only in that each of the subpixels 51 and 52 includes one LED element 6W that emits white light.

The 16 subpixels 51 to 54 being adjacent to each other across the four pixels 3A to 3D with a gap being provided therebetween constitute the subpixel group 50 as an integrated assembly. In other words, the subpixels 51 to 54 in the subpixel group 50 are not structurally divided. Thus, the 16 LED elements 6W included in the subpixel group 50 are not structurally divided and are integrated. The 16 LED elements 6W are integrated and assembled into one chip, using a semiconductor process. Each subpixel group 50 is formed into one chip by integrating and assembling the 16 LED elements 6W formed on a substrate such as a sapphire substrate, and performing singulation, with the 16 LED elements 6W being one unit.

According to the self light emitting apparatus 311, a gap is provided between the subpixels of different pixels in the subpixel group 50, and therefore mixing of colors can be hindered between the pixels 3A to 3D. Further, according to the self light emitting apparatus 311, when a full color display is not needed, quantity of light can be adjusted for each pixel 3. For example, by using the self light emitting apparatus 311 as a backlight of a liquid crystal display apparatus and adjusting the quantity of light for each pixel 3 depending on a display image of the liquid crystal display apparatus, the contrast ratio of the liquid crystal display apparatus can be enhanced.

<C-3-12. Twelfth Modification>

Figure 41:
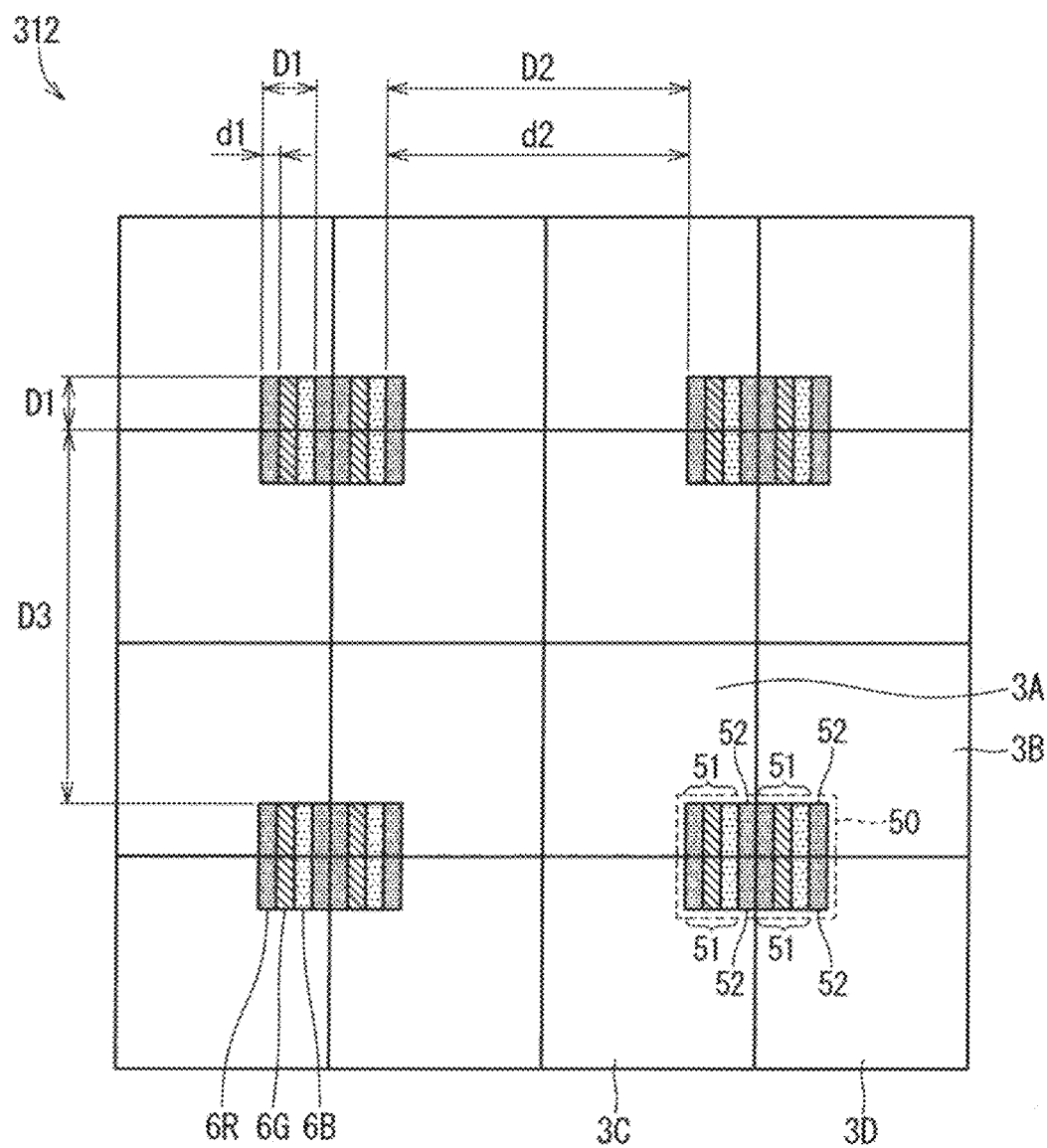
FIG. 41 is an enlarged schematic plan view of the pixel part of the self light emitting apparatus according to a twelfth modification of the third embodiment.

FIG. 41 is an enlarged schematic plan view of four pixels 3A, four pixels 3B, four pixels 3C, and four pixels 3D of a self light emitting apparatus 312 according to a twelfth modification of the third embodiment. The self light emitting apparatus 312 is obtained by applying the sixth modification of the first embodiment to the third embodiment. The self light emitting apparatus 312 is different from the self light emitting apparatus 300 according to the third embodiment only in that the subpixel 52 includes the LED element 6R.

In the self light emitting apparatus 312, the subpixel 52 includes one LED element 6R, and thus the configuration thereof is simplified as compared to the self light emitting apparatus 300 according to the third embodiment whose subpixel 52 includes the LED elements 6R, 60, and 6B. Further, according to the self light emitting apparatus 312, even if a failure occurs in the LED element 6R of the subpixel 51, a pixel defect does not occur as long as a defect does not occur in the LED element 6R of the subpixel 52. Accordingly, in the self light emitting apparatus 312, reduction of a yield due to a failure in the LED element can be hindered to a certain degree. In the present modification, the subpixel 52 includes the LED element 6R. However, the subpixel 52 may include the LED element 6G or the LED element 6B. For example, by employing an LED element of a specific color that is liable to cause a failure as the subpixel 52, reduction of a yield of the self light emitting apparatus 312 can be efficiently hindered.

<C-3-13. Thirteenth Modification>

Figure 42:
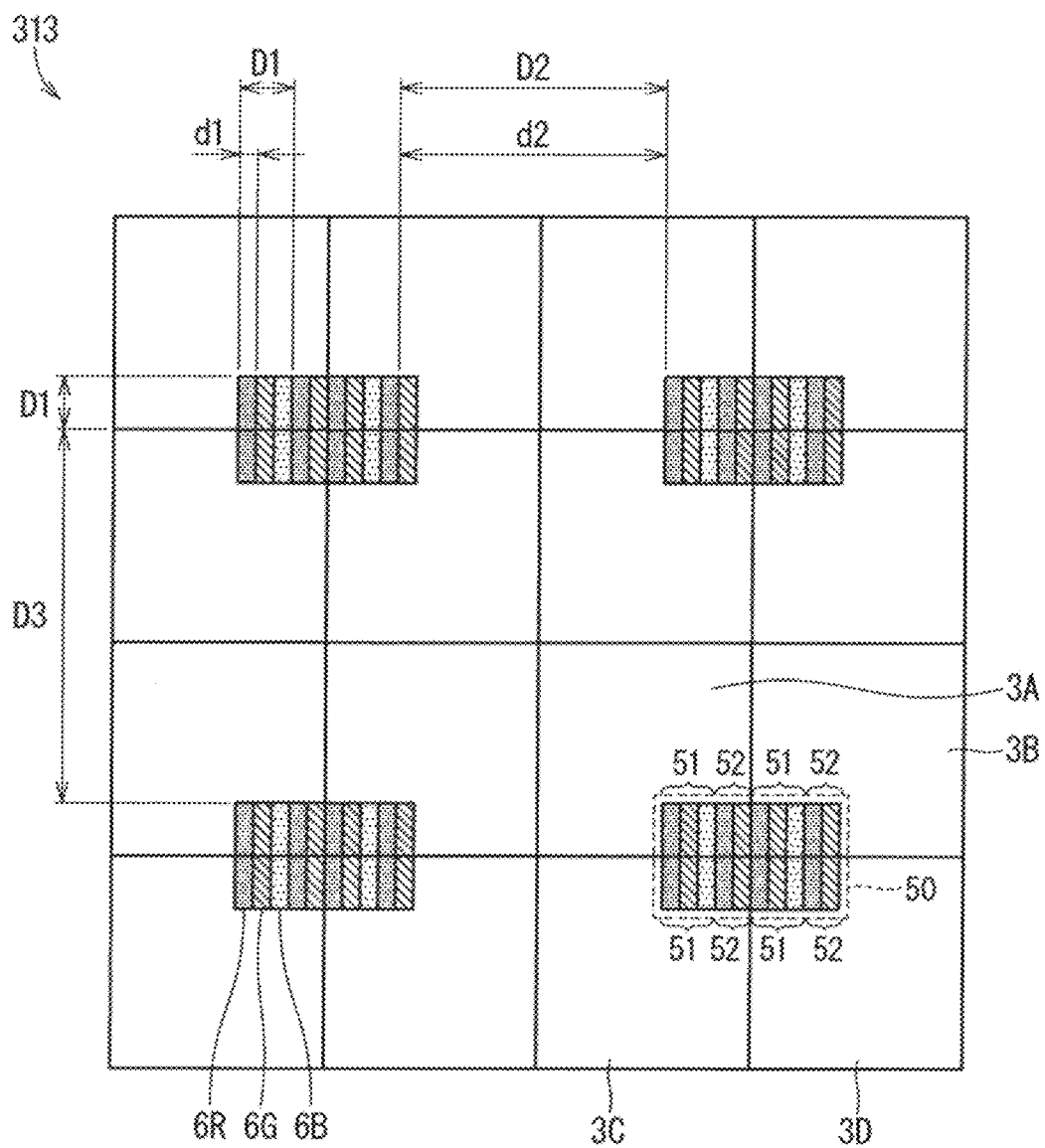
FIG. 42 is an enlarged schematic plan view of the pixel part of the self light emitting apparatus according to a thirteenth modification of the third embodiment.

FIG. 42 is an enlarged schematic plan view of four pixels 3A, four pixels 3B, four pixels 3C, and four pixels 3D of a self light emitting apparatus 313 according to a thirteenth modification of the third embodiment. The self light emitting apparatus 313 is obtained by applying the seventh modification of the first embodiment to the third embodiment. The self light emitting apparatus 313 is different from the self light emitting apparatus 200 according to the second embodiment only in that the subpixel 52 includes the LED element 6R and the LED element 6G.

In the self light emitting apparatus 313, the subpixel 52 includes the LED elements 6R and 6G, and thus the configuration thereof is simplified as compared to the self light emitting apparatus 300 according to the third embodiment whose subpixel 52 includes the LED elements 6R, 6G, and 6B. Further, according to the self light emitting apparatus 313, even if a failure occurs in the LED elements 6R and 6G of the subpixel 51, a pixel defect does not occur as long as a defect does not occur in the same colors of the LED elements 6R and 6G in the subpixel 52. Accordingly, reduction of a yield of the self light emitting apparatus 313 can be hindered to a certain degree. In the present modification, the subpixel 52 includes the LED elements 6R and 6G. However, the subpixel 52 may include a combination of any two LED elements out of the LED elements 6R, 6G, and 6B. For example, by employing an LED element of a specific color that is liable to cause a failure as the subpixel 52, reduction of a yield of the self light emitting apparatus 313 can be efficiently hindered.

<C-3-14. Fourteenth Modification>

Figure 43:
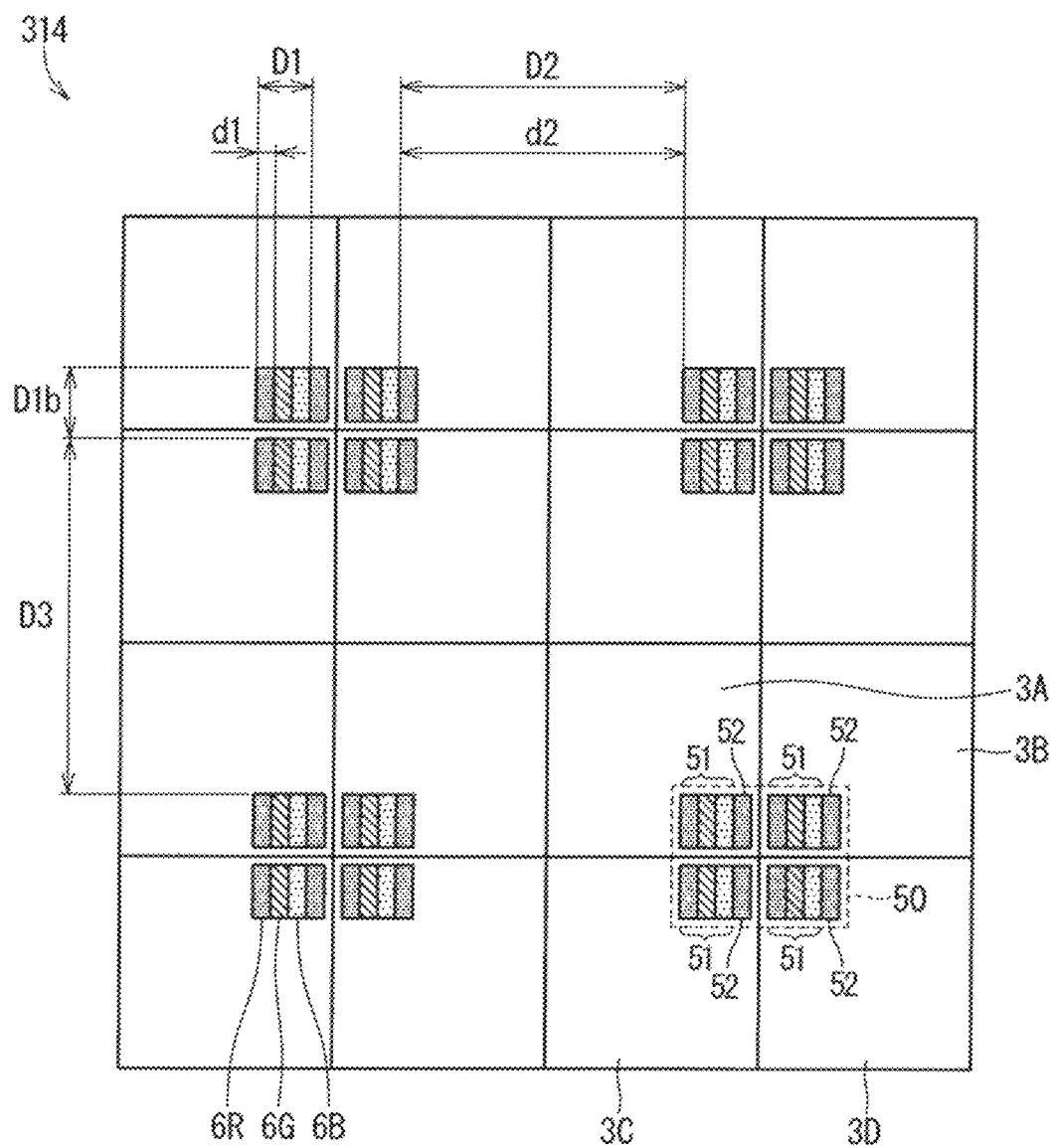
FIG. 43 is an enlarged schematic plan view of the pixel part of the self light emitting apparatus according to a fourteenth modification of the third embodiment.

FIG. 43 is an enlarged schematic plan view of four pixels 3A, four pixels 3B, four pixels 3C, and four pixels 3D of a self light emitting apparatus 314 according to a fourteenth modification of the third embodiment. The self light emitting apparatus 314 is different from the self light emitting apparatus 312 according to the twelfth modification of the third embodiment only in that a gap is provided between the subpixels of different pixels in the subpixel group 50. Specifically, a gap is provided between the right end surface of the subpixel 52 of the pixel 3A and the left end surface of the subpixel 51 of the pixel 3B on the right side thereof. Further, a gap is provided between the lower end surface of each of the subpixels 51 and 52 of the pixel 3A and the upper end surface of each of the subpixels 51 and 52 of the pixel 3C on the lower side thereof. Further, a gap is provided between the lower end surface of each of the subpixels 51 and 52 of the pixel 3B and the upper end surface of each of the subpixels 51 and 52 of the pixel 3D on the lower side thereof. Further, a gap is provided between the right end surface of the subpixel 52 of the pixel 3C and the left end surface of the subpixel 51 of the pixel 3D on the right side thereof.

A horizontal array pitch D1a and a vertical array pitch D1b of the plurality of subpixels 51 and 52 in one subpixel group 50 are smaller than horizontal and vertical array pitches D2 and D3 of the subpixels 51 and 52 across adjacent subpixel groups 50, respectively. Similarly, a horizontal array pitch d1 of the LED element 6 in one subpixel group 50 is smaller than a horizontal array pitch d2 of the LED elements 6 across adjacent subpixel groups 50. With this, the subpixel 52 functions as a redundant cell for the subpixel 51.

The eight subpixels 51 and 52 being adjacent to each other across the four pixels 3A to 3D with a gap being provided therebetween constitute the subpixel group 50 as an integrated assembly. In other words, the subpixels 51 and 52 in the subpixel group 50 are not structurally divided. Further, the three LED elements 6R, 6G, and 6B in the subpixel 51 are not structurally divided either and are integrated. Thus, the eight LED elements 6 included in the subpixel group 50 are not structurally divided and are integrated. The eight LED elements 6 are integrated and assembled into one chip, using a semiconductor process. Each subpixel group 50 is formed into one chip by integrating and assembling the eight LED elements 6 formed on a substrate such as a sapphire substrate, and performing singulation, with the eight LED elements 6 being one unit.

Therefore, according to the self light emitting apparatus 314, the following effects can be exerted in addition to the effects of the self light emitting apparatus 312. In the self light emitting apparatus 312 according to the twelfth modification of the third embodiment, the distance between the subpixels is small between the adjacent pixels 3A to 3D, and thus there is a fear of mixing of colors between the pixels 3A to 3D. However, in the self light emitting apparatus 314, as described above, a gap is provided between the subpixels of different pixels in the subpixel group 50, and therefore mixing of colors can be hindered.

<C-3-15. Fifteenth Modification>

Figure 44:
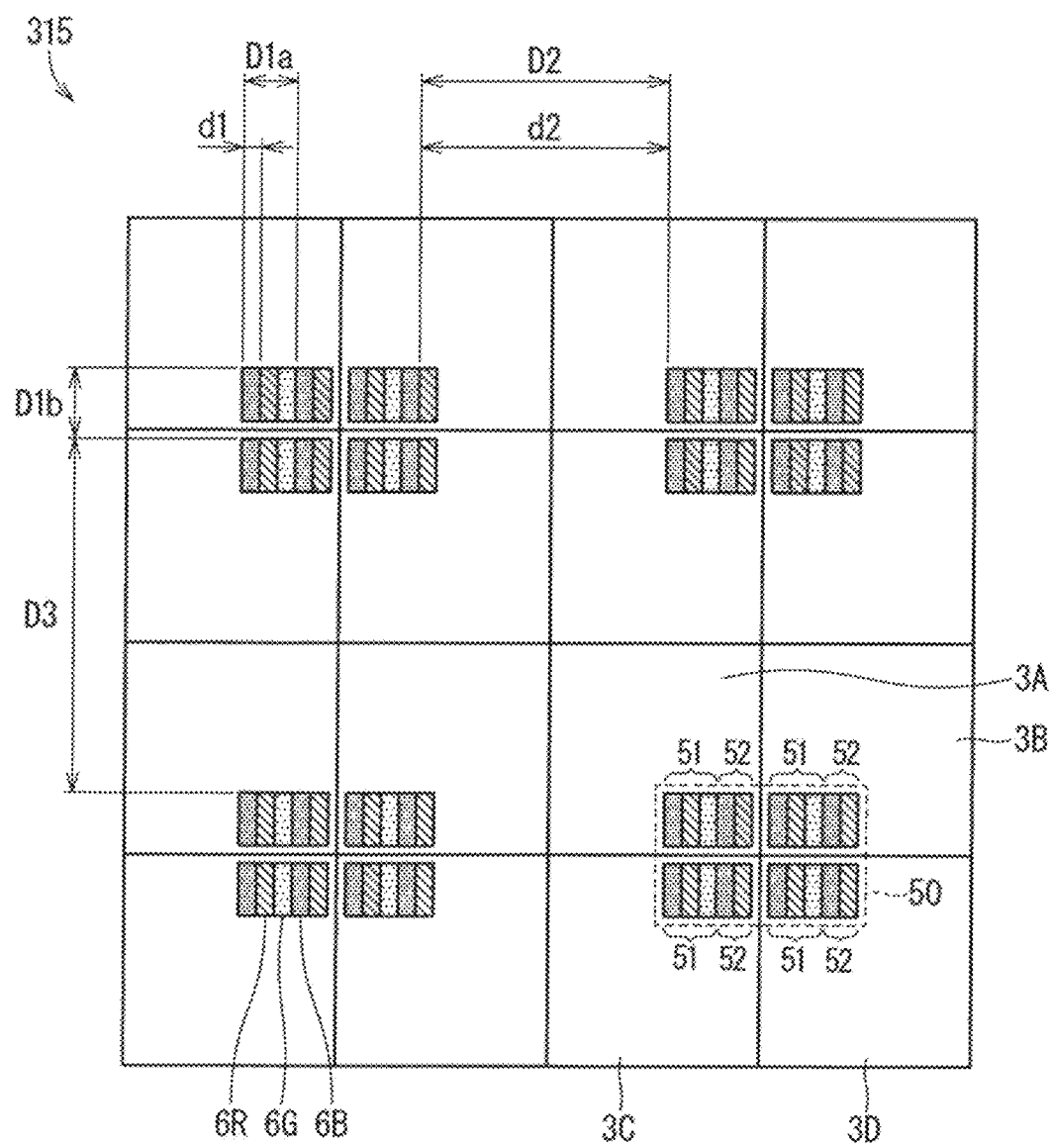
FIG. 44 is an enlarged schematic plan view of the pixel part of the self light emitting apparatus according to a fifteenth modification of the third embodiment.

FIG. 44 is an enlarged schematic plan view of four pixels 3A, four pixels 3B, four pixels 3C, and four pixels 3D of a self light emitting apparatus 315 according to a fifteenth modification of the third embodiment. The self light emitting apparatus 315 is different from the self light emitting apparatus 313 according to the thirteenth modification of the third embodiment only in that a gap is provided between the subpixels of different pixels in the subpixel group 50. Specifically, a gap is provided between the right end surface of the subpixel 52 of the pixel 3A and the left end surface of the subpixel 51 of the pixel 3B on the right side thereof. Further, a gap is provided between the lower end surface of each of the subpixels 51 and 52 of the pixel 3A and the upper end surface of each of the subpixels 51 and 52 of the pixel 3C on the lower side thereof. Further, a gap is provided between the lower end surface of each of the subpixels 51 and 52 of the pixel 3B and the upper end surface of each of the subpixels 51 and 52 of the pixel 3D on the lower side thereof. Further, a gap is provided between the right end surface of the subpixel 52 of the pixel 3C and the left end surface of the subpixel 51 of the pixel 3D on the right side thereof.

A horizontal array pitch D1$a$ and a vertical array pitch D1$b$ of the plurality of subpixels 51 and 52 in one subpixel group 50 are smaller than horizontal and vertical array pitches D2 and D3 of the subpixels 51 and 52 across adjacent subpixel groups 50, respectively. Similarly, a horizontal array pitch d1 of the LED element 6 in one subpixel group 50 is smaller than a horizontal array pitch d2 of the LED elements 6 across adjacent subpixel groups 50. With this, the subpixel 52 functions as a redundant cell for the subpixel 51.

The eight subpixels 51 and 52 being adjacent to each other across the four pixels 3A to 3D with a gap being provided therebetween constitute the subpixel group 50 as an integrated assembly. In other words, the subpixels 51 and 52 in the subpixel group 50 are not structurally divided. Further, the three LED elements 6R, 6G, and 6B in the subpixel 51 and the two LED elements 6R and 6G in the subpixel 52 are not structurally divided either and are integrated. Thus, the 20 LED elements 6 included in the subpixel group 50 are not structurally divided and are integrated. The 20 LED elements 6 are integrated and assembled into one chip, using a semiconductor process. Each subpixel group 50 is formed into one chip by integrating and assembling the 20 LED elements 6 formed on a substrate such as a sapphire substrate, and performing singulation, with the 20 LED elements 6 being one unit.

Therefore, according to the self light emitting apparatus 315, the following effects can be exerted in addition to the effects of the self light emitting apparatus 313. In the self light emitting apparatus 313 according to the thirteenth modification of the third embodiment, the distance between the subpixels is small between the adjacent pixels 3A to 3D, and thus there is a fear of mixing of colors between the pixels 3A to 3D. However, in the self light emitting apparatus 315, as described above, a gap is provided between the subpixels of different pixels in the subpixel group 50, and therefore mixing of colors can be hindered.

D. Fourth Embodiment

<D-1. Configuration>

FIG. 45 is an exploded perspective view illustrating a main configuration of a liquid crystal display apparatus 400 according to the fourth embodiment. The liquid crystal display apparatus 400 includes a liquid crystal panel 7, a backlight unit 8, an optical sheet (not illustrated), and a case 9. The liquid crystal panel 7 includes a TFT array substrate, a color filter substrate being a counter substrate, a liquid crystal layer, and a polarizing plate. The liquid crystal layer is held between the TFT array substrate and the color filter substrate. Further, the polarizing plate is disposed outside the TFT array substrate and the color filter substrate. A surface of the liquid crystal panel 7 on the color filter substrate side serves as a display surface.

As the backlight unit 8, one of the self light emitting apparatuses 100, 200, and 300 according to the first, second, and third embodiments is used. The backlight unit 8 is disposed to face a surface of the liquid crystal panel 7 on the TFT array substrate side, and serves as a light source.

The case 9 houses the liquid crystal panel 7 and the backlight unit 8, as well as optical members such the optical sheet.

<D-2. Operation Method of Backlight>

Because the active area A1 is divided by the pixels 3 of the self light emitting apparatuses 100 to 300, the backlight unit 8 is capable of local dimming control. As the number of divisions is closer to resolution of the liquid crystal panel in the liquid crystal display apparatus, light suitable for an image and a video displayed on the liquid crystal panel can be emitted. Further, luminance of self light emitting elements is adjusted in accordance with the video and the image displayed on the liquid crystal panel.

When single-color self light emitting elements, such as the white LED elements 6W, are disposed in the self light emitting apparatuses 100 to 300, luminance of light emitted from the white LED elements 6W is adjusted through control of the signal transmitted from the driver IC so as to be adapted for the video and the image displayed on the liquid crystal panel. In a region where the video and the image displayed on the liquid crystal panel are bright, an adjustment is made so that the self light emitting elements have high luminance or are turned on, whereas in a dark region, an adjustment is made so that the self light emitting elements have low luminance or are turned off.

When two or more self light emitting elements with different colors of output light, such as the red LED element 6R, the blue LED element 6B, and the green LED element 6G, are disposed as the subpixels of the self light emitting apparatuses 100 to 300, luminance of light emitted from these LED elements 6 is adjusted based not only on the luminance of the video and the image displayed on the liquid crystal panel but also on the colors of the video and the image displayed on the liquid crystal panel. Alternatively, the luminance of the light emitted from the red LED element 6R, the blue LED element 6B, and the green LED element 6G may be adjusted in accordance only with the luminance of the video and the image displayed on the liquid crystal panel, similarly to the white LED elements 6W. Further, even when two or more self light emitting elements with different colors of output light are disposed as the subpixels, an adjustment may be made so that only the self light emitting elements that output light of a specific single color are constantly turned on and the backlight unit 8 displays the single color.

<D-3. Effects>

The liquid crystal display apparatus 400 according to the fourth embodiment includes the liquid crystal panel 7 including the display surface, and the backlight unit 8 provided on a surface of the liquid crystal panel 7 on the opposite side of the display surface. As the backlight unit 8, any one of the self light emitting apparatuses (including their modifications as well) described in the first to third embodiments is used. Therefore, according to the liquid crystal display apparatus 400, in the backlight unit 8, reduction of a yield due to a failure in an LED element is hindered.

Note that each embodiment can be freely combined, and each embodiment can be modified or omitted as appropriate. The above description is in all aspects illustrative. It is therefore understood that numerous unillustrated modifications can be devised. Further, in the self light emitting apparatuses 100 to 300 according to the respective embodiments, the self light emitting elements are LED elements. However, self light emitting elements other than the LED elements may be used.

EXPLANATION OF REFERENCE SIGNS

2 Backplane, 3, 3A, 3B, 3C, 3D Pixel, 4 Driver IC, 5, 51, 52, 53, 54 Subpixel, 6R, 6G, 6B, 6W LED element, 7 Liquid crystal panel, 8 Backlight unit, 9 Case, 50 Subpixel group, 100, 101, 102, 103, 104, 105, 106, 107, 200, 201, 202, 203, 204, 205, 206, 207, 208, 209, 210, 211, 212, 213, 214, 215, 300, 301, 302, 303, 304, 305, 306, 307, 308, 309, 310, 311, 312, 313, 314, 315 Self light emitting apparatus, 400 Liquid crystal display apparatus.

The invention claimed is:
1. A self light emitting apparatus comprising:
a backplane; and
a plurality of target regions arrayed on the backplane, wherein each of the plurality of target regions includes a cell including a self light emitting element being at least one in number,
the cell includes a basic cell, and a redundant cell being at least one in number,
the basic cell includes the self light emitting elements at least two in number, each of whose color of emitted light is different,
the redundant cell includes the self light emitting element that emits light of the color same as the self light emitting element being at least one in number out of the self light emitting elements included in the basic cell,
the basic cell and the redundant cell included in each of the plurality of target regions or adjacent ones of the plurality of the target regions are configured as an assembly in which a plurality of the self light emitting elements are integrated and assembled on a semiconductor substrate without being structurally divided in a semiconductor process,
the assembly is disposed to be structurally divided from another assembly, and
an array pitch of the cell in the assembly is smaller than the array pitch between the cell of the assembly and the cell of an adjacent one of a plurality of the assemblies.
2. The self light emitting apparatus according to claim 1, wherein
the plurality of the target regions are arrayed in a horizontal direction and a vertical direction, and
a plurality of the cells are arrayed in the horizontal direction in each of the plurality of target regions.
3. The self light emitting apparatus according to claim 1, wherein
the plurality of the target regions are arrayed in a horizontal direction and a vertical direction, and
a plurality of the cells are arrayed in the vertical direction in each of the plurality of the target regions.
4. The self light emitting apparatus according to claim 1, wherein
each of the plurality of target regions includes four of the cells including the basic cell and three of the redundant cells, and
the four of the cells are arrayed in two rows and two columns in each of the plurality of target regions.
5. The self light emitting apparatus according to claim 1, wherein
the basic cell includes a red self light emitting element, a green self light emitting element, and a blue self light emitting element, and
the redundant cell includes one or two self light emitting elements out of the red self light emitting element, the green self light emitting element, and the blue self light emitting element.
6. The self light emitting apparatus according to claim 1, wherein
the cell of each of the plurality of target regions is adjacent to the cell of another one of the plurality of the target regions being adjacent to each of the plurality of the target regions, and is configured as the assembly integrated with the cell of the another one of the plurality of the target regions being adjacent to each of the plurality of the target regions.
7. The self light emitting apparatus according to claim 6, wherein
the cell of each of the plurality of target regions is adjacent to the cell of the another one of the plurality of the target regions being adjacent to each of the plurality of the target regions with a gap being provided between the cells.
8. The self light emitting apparatus according to claim 1, wherein
the cell of each of the plurality of target regions is adjacent to the cell of each of other three of the plurality of the target regions being adjacent to each of the plurality of the target regions, and is configured as the assembly integrated with the cell of each of the other three of the plurality of the target regions being adjacent to each of the plurality of the target regions.
9. The self light emitting apparatus according to claim 8, wherein
the cell of each of the plurality of target regions is adjacent to the cell of each of the other three of the plurality of the target regions being adjacent to each of the plurality of the target regions with a gap being provided between the cells.
10. The self light emitting apparatus according to claim 1, wherein
each of the plurality of target regions is a display pixel.
11. The self light emitting apparatus according to claim 1, wherein
each of the plurality of target regions is a light emitting section dividing an active area.
12. The self light emitting apparatus according to claim 1, wherein
in each of the plurality of target regions, the self light emitting element being at least one in number emits light.
13. The self light emitting apparatus according to claim 1, wherein
luminance of output light of each of the self light emitting element in each of the plurality of target regions is individually determined based on a luminance difference between adjacent ones of the plurality of the target regions.
14. A liquid crystal display apparatus comprising:
a liquid crystal panel including a display surface; and a backlight unit provided on a surface of the liquid crystal panel on an opposite side of the display surface, wherein the backlight unit is the self light emitting apparatus according to claim 1.

15. A manufacturing method for a self light emitting apparatus, comprising:

manufacturing an assembly including a plurality of self light emitting elements being integrated; and manufacturing the self light emitting apparatus according to claim 1 by disposing the assembly on a backplane.

16. A self light emitting apparatus comprising:

a backplane; and a plurality of target regions arrayed on the backplane, wherein each of the plurality of target regions includes a cell including a self light emitting element being at least one in number, the cell includes a basic cell, and a redundant cell being at least one in number, the basic cell includes the self light emitting element being at least one in number, the redundant cell includes the self light emitting element that emits light of a color same as the self light emitting element being at least one in number out of the self light emitting element included in the basic cell, the basic cell and the redundant cell included in each of the plurality of the target regions or adjacent ones of the plurality of the target regions are configured as an assembly in which a plurality of the self light emitting elements are integrated and assembled on a semiconductor substrate without being structurally divided in a semiconductor process, the assembly is disposed to be structurally divided from another assembly, an array pitch of the cell in the assembly is smaller than the array pitch between the cell of the assembly and the cell of an adjacent one of a plurality of the assemblies, and luminance of output light of each of the self light emitting element in each of the plurality of the target regions is individually determined based on a luminance difference between adjacent ones of the plurality of the target regions.

17. The self light emitting apparatus according to claim 16, wherein the self light emitting element is a white self light emitting element.

18. The self light emitting apparatus according to claim 1, wherein each of the self light emitting elements is connected to a switching element in a one-to-one manner.

* * * * *

UNITED STATES PATENT AND TRADEMARK OFFICE
CERTIFICATE OF CORRECTION

PATENT NO. : 12,166,019 B2
APPLICATION NO. : 18/009746
DATED : December 10, 2024
INVENTOR(S) : Manabu Iwakawa et al.

Page 1 of 1

It is certified that error appears in the above-identified patent and that said Letters Patent is hereby corrected as shown below:

In the Specification

Column 7, Lines 64-65, the "." after "the p-type semiconductor layer" should be deleted, and the line break between "the p-type semiconductor layer" and "(Step S103) ." should be deleted.

Column 9, Lines 38 and 64, "elements 6R, 60, and 6B" should be --elements 6R, 6G, and 6B--.

Column 13, Line 17, "elements 6R, 60, and 6B" should be --elements 6R, 6G, and 6B--.

Column 15, Line 61, "elements 6R, 60, and 6B" should be --elements 6R, 6G, and 6B--.

Column 19, Line 18, "elements 6R, 60, and 6B" should be --elements 6R, 6G, and 6B--.

Column 20, Line 43, "elements 6R, 60, and 6B" should be --elements 6R, 6G, and 6B--.

Column 29, Line 32, "elements 6R, 60, and 6B" should be --elements 6R, 6G, and 6B--.

Signed and Sealed this
Twenty-fifth Day of February, 2025

Coke Morgan Stewart
*Acting Director of the United States Patent and Trademark Office*